US010002777B2

(12) United States Patent
Kweon et al.

(10) Patent No.: US 10,002,777 B2
(45) Date of Patent: Jun. 19, 2018

(54) SUBSTRATE PROCESSING SYSTEM AND SUBSTRATE PROCESSING METHOD

(71) Applicant: K.C.Tech Co., Ltd., Anseong-si, Gyeonggi-do (KR)

(72) Inventors: Young Kyu Kweon, Pyeongtaek-si (KR); Joon Ho An, Busan (KR); Byoung Chaul Son, Anseong-si (KR); Jin Sung Rho, Anseong-si (KR)

(73) Assignee: KCTECH CO., LTD., Anseong-si (KR)

( * ) Notice: Subject to any disclaimer, the term of this patent is extended or adjusted under 35 U.S.C. 154(b) by 0 days. days.

(21) Appl. No.: 15/363,334

(22) Filed: Nov. 29, 2016

(65) Prior Publication Data

US 2017/0323807 A1  Nov. 9, 2017

(30) Foreign Application Priority Data

May 3, 2016  (KR) .................. 10-2016-0054652
Jul. 1, 2016  (KR) .................. 10-2016-0083540

(51) Int. Cl.
*H01L 21/67* (2006.01)
*H01L 21/673* (2006.01)

(52) U.S. Cl.
CPC .. *H01L 21/67023* (2013.01); *H01L 21/67046* (2013.01); *H01L 21/67051* (2013.01); *H01L 21/67075* (2013.01); *H01L 21/67161* (2013.01); *H01L 21/67219* (2013.01); *H01L 21/67288* (2013.01); *H01L 21/67326* (2013.01)

(58) Field of Classification Search
CPC ......... H01L 21/67046; H01L 21/67219; H01L 21/67051; H01L 21/02074
See application file for complete search history.

(56) References Cited

U.S. PATENT DOCUMENTS

| | | | |
|---|---|---|---|
| 6,575,177 B1* | 6/2003 | Brown | B08B 1/04 134/76 |
| 9,610,615 B2* | 4/2017 | Tien | B08B 1/04 |
| 2007/0197138 A1* | 8/2007 | Montierth | A61B 8/546 451/36 |
| 2014/0261539 A1* | 9/2014 | Chen | H01L 21/67051 134/6 |
| 2015/0198947 A1* | 7/2015 | Sugiyama | G05B 19/41875 700/110 |

(Continued)

FOREIGN PATENT DOCUMENTS

KR  10-2006-0079561 A  7/2006
KR  10-2008-0113079 A1  12/2008

(Continued)

*Primary Examiner* — Jaehwan Oh
(74) *Attorney, Agent, or Firm* — Kusner & Jaffe

(57) ABSTRACT

Provided is a substrate processing system and a substrate processing method. The substrate processing system includes a polishing part for performing a Chemical Mechanical Polishing (CMP) process on a substrate, a cleaning part for cleaning the substrate on which the polishing process is performed, and a substrate transferring part for transferring the substrate to the cleaning part before polishing the substrate in the polishing part. The substrate may be preparatorily cleaned in the cleaning part before the polishing process, and then enters the polishing part.

25 Claims, 44 Drawing Sheets

(56) References Cited

U.S. PATENT DOCUMENTS

| | | | |
|---|---|---|---|
| 2015/0290766 A1* | 10/2015 | Sugiyama | B24B 53/007 |
| | | | 451/444 |
| 2016/0020133 A1* | 1/2016 | Kim | B24B 37/30 |
| | | | 29/559 |
| 2016/0083676 A1* | 3/2016 | Mikhaylichenko | C11D 1/146 |
| | | | 134/1 |
| 2016/0293402 A1* | 10/2016 | Tien | B08B 1/00 |
| 2017/0092519 A1* | 3/2017 | Sakugawa | B24B 37/30 |

FOREIGN PATENT DOCUMENTS

| | | |
|---|---|---|
| KR | 10-1338812 B | 12/2013 |
| KR | 10-1591957 B | 1/2016 |

* cited by examiner

SUBSTRATE PROCESSING SYSTEM AND SUBSTRATE PROCESSING METHOD

CROSS-REFERENCE TO RELATED APPLICATIONS

This U.S. non-provisional patent application claims priority under 35 U. S. C. § 119 of Korean Patent Application Nos. 10-2016-0054652 filed on May 3, 2016 and 10-2016-0083540 filed on Jul. 1, 2016, the entire contents of which are hereby incorporated by reference.

BACKGROUND OF THE INVENTION

The present invention disclosed herein relates to a substrate processing system and a substrate processing method, and more particularly, to a substrate processing system and a substrate processing method, which can improve the polishing efficiency and the cleaning efficiency by preliminarily separating foreign substances existing on a substrate before a process for polishing the substrate is performed.

As fine circuit lines are high-densely integrated in a semiconductor device, precise polishing corresponding thereto needs to be performed on the surface of a wafer. In order to more precisely perform polishing of a wafer, a mechanical polishing process and Chemical Mechanical Polishing (CMP) process in which mechanical polishing and chemical polishing are combined may be performed.

The CMP process is a process of precisely polishing the surface of a water for the purpose of the global planarization for removing a height difference between a cell region and a surrounding circuit region due to an unevenness of the wafer surface generated when masking, etching and interconnection processes of a semiconductor device manufacturing process are repeatedly performed, and the improvement of wafer surface roughness due to high integration of a device and separation contact/wiring film for forming a circuit.

In the CMP process, a wafer is pressurized while a process surface of the wafer faces a polishing pad, and thus chemical polishing and mechanical polishing of the process surface are simultaneously performed. The wafer on which the polishing process is performed is gripped by a carrier head, and then goes through a cleaning process for removing foreign substances from the process surface.

As shown in FIG. 1, when a wafer (W) is supplied to a chemical mechanical polishing system (X1) from a loading unit (20), the chemical mechanical polishing process is performed on a plurality of polishing surface plates (P1, P2, P1', and P2') while the wafer (W) is moved (66-68) along a predetermined path (Po) in a state where the wafer (W) is adhered closely to carrier heads (S1, S2, S1', and S2'; S). The wafer (W) on which the chemical mechanical polishing process is performed is transferred to a cradle (10) of an unloading unit by the carrier head (S), and then is transferred to a cleaning unit (X2) where a cleaning process is performed. Thereafter, a process of removing foreign substances from the wafer (W) is performed in a plurality of cleaning modules (70).

Meanwhile, as a semiconductor is further miniaturized and highly integrated, the importance of the cleaning efficiency of a wafer is growing more and more. Particularly, when foreign substances remain on the surface of a wafer even after the cleaning process of a wafer is finished in the cleaning module, the yield may be reduced, and the stability and reliability may be reduced. Accordingly, foreign substances need to be removed in the cleaning module to the maximum.

For this, there has been proposed a method of increasing the cleaning efficiency, by preparatorily cleaning a wafer to remove foreign substances before a wafer having undergone the polishing process is transferred to the cleaning module and then by again cleaning the wafer in the cleaning module.

However, this method has a limitation in that since a preliminary cleaning space needs to be additionally prepared to perform a separate preliminary cleaning independently of the cleaning module, the layout of equipment is disadvantageous and the transfer and cleaning treatment process of the wafer becomes complicated. Also, the cleaning time increases, and the cost increases but the yield decreases. Particularly, since a wafer unloaded to an unloading position after the polishing process needs to go through a complicated process of being transferred to the separate preliminary cleaning space for the preliminary cleaning and then being again transferred to the cleaning module, the whole treatment process efficiency of a wafer is reduced.

Also, when the polishing process is performed in a state where foreign substances exist on the surface of a wafer, the surface of the wafer may be scratched by foreign substances during the polishing process, and the polishing efficiency and the polishing accuracy may be reduced.

Accordingly, various studies for preventing damage of a substrate during the chemical mechanical polishing process and improving the cleaning efficiency and the yield are being conducted, but are still insufficient and more development related thereto is needed.

SUMMARY OF THE INVENTION

The present invention provides a substrate processing system and a substrate processing method, which can improve the polishing efficiency and the cleaning efficiency, and can improve the yield.

The present invention also provides a substrate processing system and a substrate processing method, which can prevent damage of a substrate due to foreign substances during a polishing process by preliminarily removing foreign substances existing on the substrate before the polishing process is performed.

The present invention also provides a substrate processing system and a substrate processing method, which can minimize foreign substances existing on a substrate before a polishing process without modifying or supplementing a layout of existing equipment or reducing the process efficiency.

The present invention also provides a substrate processing system and a substrate processing method, which can remove foreign substances remaining on a substrate in a preliminary cleaning region to which the substrate is unloaded, before a cleaning process is performed.

A substrate processing system according to an embodiment of the present invention may include a polishing part 100 for performing a Chemical Mechanical Polishing (CMP) process on a substrate, a cleaning part for cleaning the substrate on which the polishing process is performed, and a substrate transferring part for transferring the substrate to the cleaning part before polishing the substrate in the polishing part. The substrate may be preparatorily cleaned in the cleaning part before the polishing process, and then may enter the polishing part.

This is, when polishing is performed on a substrate, to prevent damage of the substrate due to foreign substances during the polishing process and improve the polishing efficiency and the cleaning efficiency, by preparatorily cleaning foreign substances existing on the substrate prior to polishing of the substrate and then performing the polishing process in the polishing part.

Above all, foreign substances remaining on the substrate prior the polishing process may be minimized without a reduction of the process efficiency, by performing preparatory cleaning on the substrate using the cleaning part already prepared, without a change or addition of the layout of existing equipment.

In other words, prior the polishing process for the substrate, the substrate may be transferred to a separate cleaning region provided with a separate cleaning unit, and the preparatory cleaning may be performed on the substrate. In this case, however, since the substrate needs to go through a complicated transfer process in which the substrate needs to be transferred to the separate cleaning region to be cleaned and then the cleaned substrate needs to be again transferred to the cleaning part, the whole processing efficiency of the substrate may be reduced. Also, in order to additionally prepare a separate cleaning region, since the layout of existing equipment needs to be changed or added, the space utilization may be reduced, and the cost may increase for the change of equipment. However, in the present invention, the process sequence of transferring the substrate to the polishing part without carrying the substrate to the outside may be maintained without a change, and foreign substances existing on the surface of the substrate may be preparatorily cleaned prior to the polishing process for the substrate using the cleaning part that is already prepared to clean the substrate having undergone the polishing process. Thus, without a change or addition of the layout of existing equipment, foreign substances existing on the substrate can be removed without a reduction of the process efficiency before the polishing process is performed.

Furthermore, since foreign substances existing on the substrate can be removed through the preparatory cleaning performed in the cleaning part prior to the polishing process, damage of the substrate such as scratches due to foreign substances can be prevented during the polishing process.

Also, in the present invention, after foreign substances are preliminarily pre-cleaned in the pre-cleaning region to which the substrate is unloaded, a main cleaning process may be performed on the substrate in the cleaning part. Thus, without a change or addition of the layout of existing equipment, foreign substances remaining on the substrate can be minimized without a reduction of the process efficiency before the cleaning process is performed.

In other words, before the substrate having undergone the polishing process is transferred to undergo the main cleaning process, the substrate may be transferred to a separate cleaning region to be pre-cleaned, and then may be again transferred to the cleaning part. In this case, however, since the substrate needs to go through a complicate transfer process in which the substrate unloaded to the unloading region needs to be transferred to the separate cleaning region and then needs to be again transferred to the cleaning part, the whole processing efficiency of the substrate may be reduced. Also, in order to additionally prepare a separate cleaning region, since the layout of existing equipment needs to be changed or added, the space utilization may be reduced, and the cost may increase for the change of equipment. However, a process sequence in which the substrate having undergone the polishing process is unloaded to the pre-cleaning region and then is transferred to the cleaning part may be maintained without a change, and foreign substances remaining on the substrate may be preliminarily pre-cleaned in the pre-cleaning region. Thus, without a change or addition of the layout of existing equipment, foreign substances remaining on the substrate can be minimized without a reduction of the process efficiency before a main cleaning process is performed.

Furthermore, since foreign substances remaining on the substrate can be maximally removed through the pre-cleaning process performed in the pre-cleaning region prior to the cleaning process, the cleaning effect by the main cleaning process can be improved, and the cleaning efficiency may also be improved.

Also, the pre-cleaning in the pre-cleaning region may be performed by at least one of a cleaning liquid spraying part that sprays a cleaning liquid onto the surface of the substrate, a steam spraying part that sprays steam onto the surface of the substrate, a heterogeneity fluid spraying part that sprays heterogeneity fluids onto the surface of the substrate, a cleaning brush that makes rotational contact with the surface of the substrate, and a megasonic generator that supplies vibration energy to the surface of the substrate. The pre-cleaning may be performed with optimal conditions by selecting the type of pre-cleaning in accordance with the characteristics of the substrate or the deposition characteristics.

Furthermore, at least one of the cleaning liquid spraying part, the steam spraying part, and the heterogeneity fluid spraying part may be provided so as to be oscillatable in the pre-cleaning region. This structure can maximize the cleaning efficiency by cleaning liquids, steam and/or heterogeneity fluids, and can reduce the amount of cleaning liquids, steam and/or heterogeneity fluids that are used, by allowing cleaning liquids and/or heterogeneity fluids to be oscillation-sprayed onto the surface of the substrate. Also, this method may have an effect of separating foreign substances from the surface of the substrate by a cleaning power (including hitting force) by cleaning liquids, steam and/or heterogeneity fluids and sweeping and discharging separated foreign substances out of the substrate.

A blocking unit may be provided to block a pre-cleaning processing space of the pre-cleaning region from other spaces while pre-cleaning is being performed in the pre-cleaning region. The blocking unit may block a chemical and a cleaning liquid used for the pre-cleaning from being introduced to the substrate on which the polishing process is being performed, by blocking the pre-cleaning processing space of the pre-cleaning region from other spaces.

Also, a blocking unit may be provided to selectively block the polishing part and the cleaning part. The blocking unit can keep the cleaning part cleaner by fundamentally blocking polishing substances and foreign substances generated in the polishing part from being introduced to the cleaning part. That is, much more foreign substances may be generated in the polishing part compared to the cleaning part, and foreign substances generated in the polishing part and introduced into the cleaning part may cause a cleaning failure or cleaning deterioration. Thus, the blocking unit can improve the cleaning efficiency of the cleaning process performed in the cleaning part, by wholly blocking a boundary of the polishing part and the cleaning part, and thus by blocking polishing substances and foreign substances generated in the polishing part from being introduced to the cleaning part.

Also, the polishing part may include a first polishing region comprising a plurality of first polishing surface plates disposed therein, a second polishing region facing the first polishing region and comprising a plurality of second polishing surface plates disposed therein, and a substrate transfer line disposed between the first polishing region and the second polishing region and transferring a substrate loaded to a loading region prepared in the polishing part. The substrate loaded to the loading region may be transferred along the substrate transfer line to be polished in the first polishing region or the second polishing region, and then may be unloaded to a pre-cleaning region.

Thus, in this embodiment, the substrate may be first transferred along the substrate transfer line, and may be polished in the first polishing region or the second polishing region and then immediately unloaded to the pre-cleaning region. Thus, a separate spraying device for maintaining the wet state of the substrate having undergone the polishing may not be needed, and an occurrence of a watermark may be prevented.

In other words, the substrate may be first polished in the first polishing region or the second polishing region, and the substrate having undergone the polishing may be transferred along the substrate transfer line and then unloaded from the pre-cleaning region. However, in this structure where the substrate is transferred after being polished, the substrate having undergone the polishing may be dried while being transferred along the substrate transfer line, and a watermark may occur or a mounted part of the substrate may be damaged. Accordingly, a separate spraying device or wetting bath needs to be inevitably provided on the substrate transfer line to maintain the wet state of the substrate. However, in this embodiment, since the substrate is first transferred through the substrate transfer line provided at the center between the first polishing region and the second polishing region, and the substrate is polished in the first polishing region or the second polishing region and then immediately unloaded to the pre-cleaning region, a separate device for wetting the substrate may not be needed, and the substrate having undergone the polishing process may be prevented from being dried. In addition, damage of substrate-mounted parts due to drying and a defect due to a watermark may be prevented.

The cleaning part may include at least one of a contact-type cleaning unit and a non-contact-type cleaning unit. The contact-type cleaning unit may make contact with the surface of the substrate so as to effectively remove organic matters and other foreign substances remaining on the surface of the substrate and may perform cleaning. The non-contact-type cleaning unit may not make contact with the surface of the substrate and may perform cleaning. The contact-type cleaning unit may make physical contact with the surface of the substrate, and may remove foreign substances having relatively large sizes or strongly stuck to the surface of the substrate, and the non-contact-type cleaning unit may remove fine foreign substances remaining on the substrate by a non-contact method of spraying a fluid to the substrate.

More specifically, the contact-type cleaning unit may include a cleaning brush and a chemical supply part, and the non-contact-type cleaning unit may clean the substrate using at least one of the cleaning fluid spraying part (cleaning liquid spraying part, steam spraying part, and heterogeneity fluid spraying part), the isopropyl alcohol spraying part, and the megasonic generator.

Also, the substrate processing system may include an inverting unit. The inverting unit may be disposed to be movable from a loading region to which a substrate provided in the polishing part is loaded to a pre-cleaning region. The inverting unit may receive the substrate from the loading region, and may transfer the substrate to the pre-cleaning region. The substrate may be pre-cleaned in the pre-cleaning region while being supported by the inverting unit.

Particularly, the substrate may be transferred from the loading region of the substrate formed on the moving path of a transfer unit (e.g., carrier head) to the pre-cleaning region after being gripped by the inverting unit. Accordingly, since the transfer unit has only to move the loading region without moving to the pre-cleaning region, the moving path of the transfer unit can be minimized.

Specifically, the inverting unit may include an operation assembly moving from the loading region to the pre-cleaning region, a rotation assembly invertibly connected to the operation assembly, and a grip assembly connected to the rotation assembly and gripping the substrate.

Otherwise, the inverting unit may be fixedly installed at the pre-cleaning region, and may grip the substrate in the pre-cleaning region to invert the substrate.

In addition, by performing pre-cleaning in the pre-cleaning region while the substrate is being supported by the inverting unit, the supporting process for allowing the substrate not to move during the pre-cleaning in the pre-cleaning region can be simplified.

Naturally, it may be possible to support the substrate using a separate supporting unit and perform the pre-cleaning. However, since the substrate is supported during the inverting process of the substrate which is necessarily performed regardless of the pre-cleaning, the process of supporting the substrate can be simplified, and thus the whole process can be reduced.

In one embodiment, the pre-cleaning in the pre-cleaning region may be performed when the substrate is inverted by the inverting unit (when the polishing surface is inverted so as to face upward), or may be performed when the substrate is disposed upright by the inverting unit. According to circumstances, the pre-cleaning may also be performed while the substrate is being supported by the inverting unit before the substrate is inverted by the inverting unit 140 (when the polishing surface of the substrate is disposed to face downward).

Also, the cleaning part may be configured to include a plurality of cleaning units which are stacked in a vertical direction and individually perform cleaning on the substrate. Thus, a footprint of the cleaning part can be reduced and the space efficiency can be improved, by stacking the plurality of cleaning units.

Here, the stacking of the plurality of cleaning units in a vertical direction may be defined as stacking the plurality of cleaning units in a two or more-layered structure.

In one embodiment, the cleaning units may include a plurality of contact-type cleaning units, and a plurality of non-contact-type cleaning units. The plurality of contact-type cleaning units may be stacked in a vertical direction, may make physical contact with the surface of the substrate, and may individually perform cleaning on the substrate. The plurality of non-contact-type cleaning units may be stacked in a vertical direction, may not physically contact the surface of the substrate, and may individually perform cleaning on the substrate. According to circumstances, only one of the contact-type cleaning unit and the non-contact-type cleaning unit may be provided in a stacked structure.

In addition, the cleaning part may include a transfer unit to transfer the substrate from any one of the plurality of cleaning units to another of the plurality of cleaning units. The substrate may be transferred in the cleaning part by the transfer unit.

The substrate may be preparatorily cleaned along various cleaning paths that are defined in the cleaning part before the polishing process is performed. Here, the preparatory cleaning path of the substrate may be construed as an order in which the substrate is cleaned in the cleaning part or a path along which the substrate is transferred while being cleaned in the cleaning part.

Specifically, the substrate is preparatorily cleaned along the preparatory cleaning path that passes through at least one of the plurality of cleaning units before the polishing process is performed. In order to minimize the moving path of the substrate and shorten the preparatory cleaning time of the substrate, the substrate transferring part may transfer the substrate to one of the plurality of cleaning units constituting the cleaning part, which is most adjacent to the substrate transferring part.

In addition, at least one of the plurality of cleaning units which is predetermined may be skipped in the preparatory cleaning path. In other words, all of the cleaning units may be used for the preparatory cleaning of the substrate, but only a portion of the cleaning units may also be used for the preparatory cleaning of the substrate.

Also, the substrate may be cleaned along various cleaning paths that are defined in the cleaning part after the polishing process is performed. Here, the cleaning path of the substrate may be construed as an order in which the substrate is cleaned in the cleaning part or a path along which the substrate is transferred while being cleaned in the cleaning part.

More specifically, the substrate is configured to be cleaned along the cleaning path that passes through at least one of the plurality of cleaning units in the cleaning part. The cleaning path of the substrate may go through at least one of the plurality of contact-type cleaning units and 404 and at least one of the plurality of non-contact-type cleaning units in order to improve the cleaning efficiency of the substrate.

Otherwise, the cleaning path can be maximally shortened by skipping at least one of the plurality of cleaning units which is predetermined in the preparatory cleaning path. Here, the skipping of at least one of the plurality of cleaning units which is predetermined in the cleaning unit of the substrate may be construed as being cleaned in the cleaning part without going through a specific cleaning unit that is skipped.

In addition, the plurality of cleaning units constituting the cleaning part may include a blocking unit that independently blocks each cleaning space from other spaces. Thus, a cleaning failure and a cleaning deterioration due to an inflow of fumes generated during the cleaning of the substrate into a cleaning space of another cleaning unit that is adjacent can be prevented.

Specifically, the blocking unit may include a casing disposed to surround the substrate and providing an independent cleaning processing space and an opening/closing member opening and closing the inlet of the casing.

Also, since a packing member is provided to seal a gap between the casing and the opening/closing member of the cleaning unit, each cleaning space of the plurality of cleaning units can be more effectively sealed.

The packing member may include an upper packing part, a bent packing part bent at one end of the upper packing part, and a lower packing part bent at one end of the bent packing part and disposed at a height different from the upper packing part. The upper packing part, the bent packing part, and the lower packing part may adhere closely to a stepped part formed at mutually facing surfaces of the casing and the packing member.

Thus, although fumes leak between the upper packing part and the casing (or opening/closing member), secondary sealing may be implemented by the bent packing part vertically bent from the upper packing part, and tertiary sealing may be implemented by the lower packing part horizontally bent from the bent packing part. Thus, the sealing performance of each cleaning space of the plurality of cleaning units can be improved, and thus fumes generated during the cleaning can be more effective blocked from leaking to the outside.

Also, a contamination measurement part may be provided in the cleaning part to measure the contamination degree of the substrate that is preparatorily cleaned in the cleaning part. The contamination measurement part may test whether or not each of cleaning units normally operates, through the preparatory cleaning process of the substrate. In other words, the contamination measurement part may check whether or not cleaning is being normally performed on the substrate by each of the cleaning units (before final cleaning is performed on the substrate having undergone the polishing process). Accordingly, a separate test for checking whether or not the cleaning part normally operates may not be needed.

A substrate processing method according to an embodiment may include performing preparatory cleaning on a substrate, performing a Chemical Mechanical Polishing (CMP) process on the substrate having undergone the preparatory cleaning, and cleaning the substrate having undergone the polishing process using a cleaning part.

Thus, since foreign substances existing on the substrate can be removed through the preparatory cleaning performed in the cleaning part prior to the polishing process, damage of the substrate such as scratches due to foreign substances can be prevented during the polishing process.

Above all, foreign substances remaining on the substrate prior the polishing process may be minimized without a reduction of the process efficiency, by performing preparatory cleaning on the substrate using the cleaning part already prepared in order to clean the substrate having undergone the polishing process, without a change or addition of the layout of existing equipment.

Specifically, the cleaning part may include a cleaning units that individually perform cleaning on the substrate, and in the preparatory cleaning process, the substrate may be preparatorily cleaned along the preparatory cleaning path that passes through at least one of the plurality of cleaning units before the polishing process is performed. In addition, in the preparatory cleaning, at least one of the plurality of cleaning units which is predetermined may be skipped in the preparatory cleaning path.

The cleaning units may include at least one of a plurality of contact-type cleaning units, and a plurality of non-contact-type cleaning units. The plurality of contact-type cleaning units may be stacked in a vertical direction, may make physical contact with the surface of the substrate, and may individually perform cleaning on the substrate. The plurality of non-contact-type cleaning units may be stacked in a vertical direction, may not physically contact the surface of the substrate, and may individually perform cleaning on the substrate. In the preparatory cleaning, the substrate may be preparatorily cleaned by at least one of the contact-type cleaning units and the non-contact-type cleaning units.

Also, the substrate processing method may further include a pre-cleaning process in which the substrate having undergone the polishing process is pre-cleaned. The substrate having undergone the polishing process may be pre-cleaned in the pre-cleaning process, and then may be again cleaned in the cleaning process.

Thus, since foreign substances remaining on the substrate can be maximally removed through the pre-cleaning process performed prior to the cleaning process, the cleaning effect in the main cleaning process can be improved, and the cleaning efficiency may also be improved.

Above all, in the present invention, after foreign substances are preliminarily pre-cleaned in the pre-cleaning region to which the substrate is unloaded, a main cleaning process may be performed on the substrate in the cleaning part. Thus, without a change or addition of the layout of existing equipment, foreign substances remaining on the substrate can be minimized without a reduction of the process efficiency before the cleaning process is performed.

The substrate processing method may include a substrate inverting process in which the substrate unloaded to the pre-cleaning region is inverted, and in the pre-cleaning process, the substrate may be pre-cleaned while being in an inverted state.

Also, the substrate processing method may include a contamination measuring process of measuring the contamination degree of the substrate preparatorily cleaned in the cleaning part. Thus, by measuring the contamination degree of the substrate that is preparatorily cleaned in the cleaning part, a test may be performed to check whether or not cleaning units normally operate, through the preparatory cleaning process of the substrate. In other words, a test may be performed to check whether or not cleaning is being normally performed on the substrate by each of the cleaning units (before final cleaning is performed on the substrate having undergone the polishing process). Accordingly, a separate test for checking whether or not the cleaning part normally operates may not be needed.

For reference, the preparatory cleaning of the substrate set forth herein may mean a cleaning process that is first performed on the substrate having not undergone the polishing process, i.e., prior to the polishing process for the substrate.

Also, the pre-cleaning of the substrate may mean a cleaning process that is first performed on the substrate having undergone the polishing process, and may be construed as a cleaning process of preliminarily removing foreign substances existing on the surface of the substrate having undergone the polishing process prior to the cleaning process.

In addition, the cleaning by the cleaning part may be construed as a finishing cleaning process for removing foreign substances remaining on the surface of the substrate after the pre-cleaning process.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
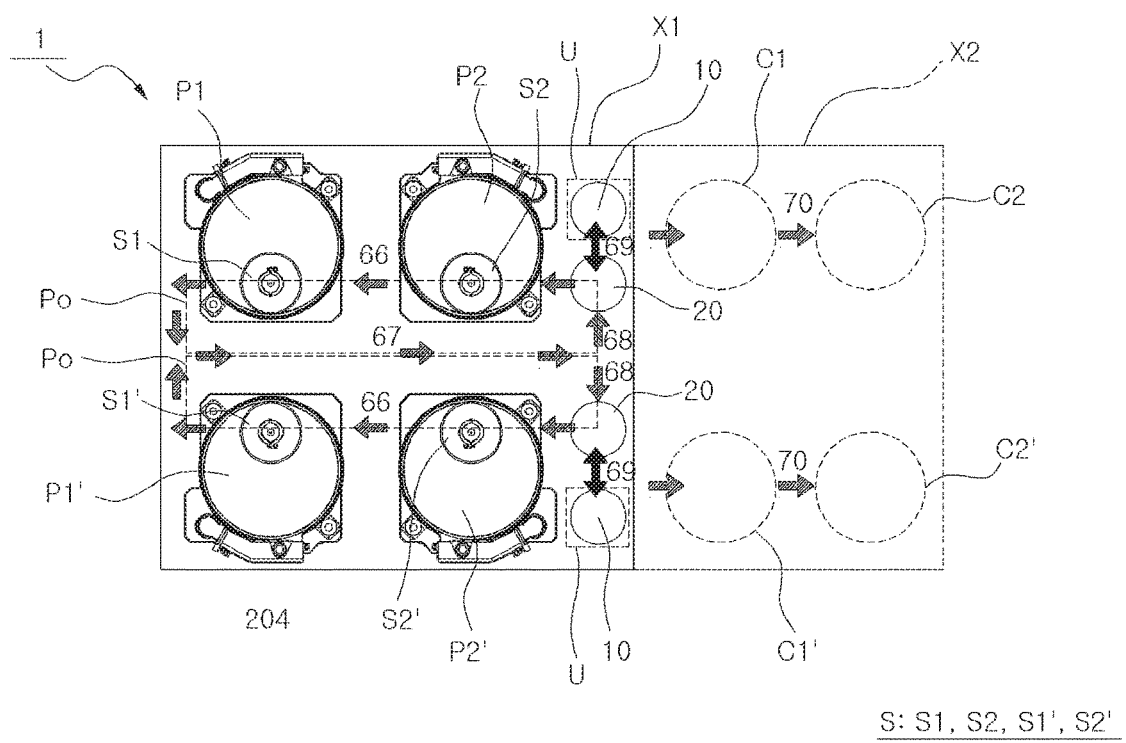
FIG. 1 is a view illustrating a configuration of a typical chemical mechanical polishing machine.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, it will be described about an exemplary embodiment of the present invention in conjunction with the accompanying drawings.

Figure 2:
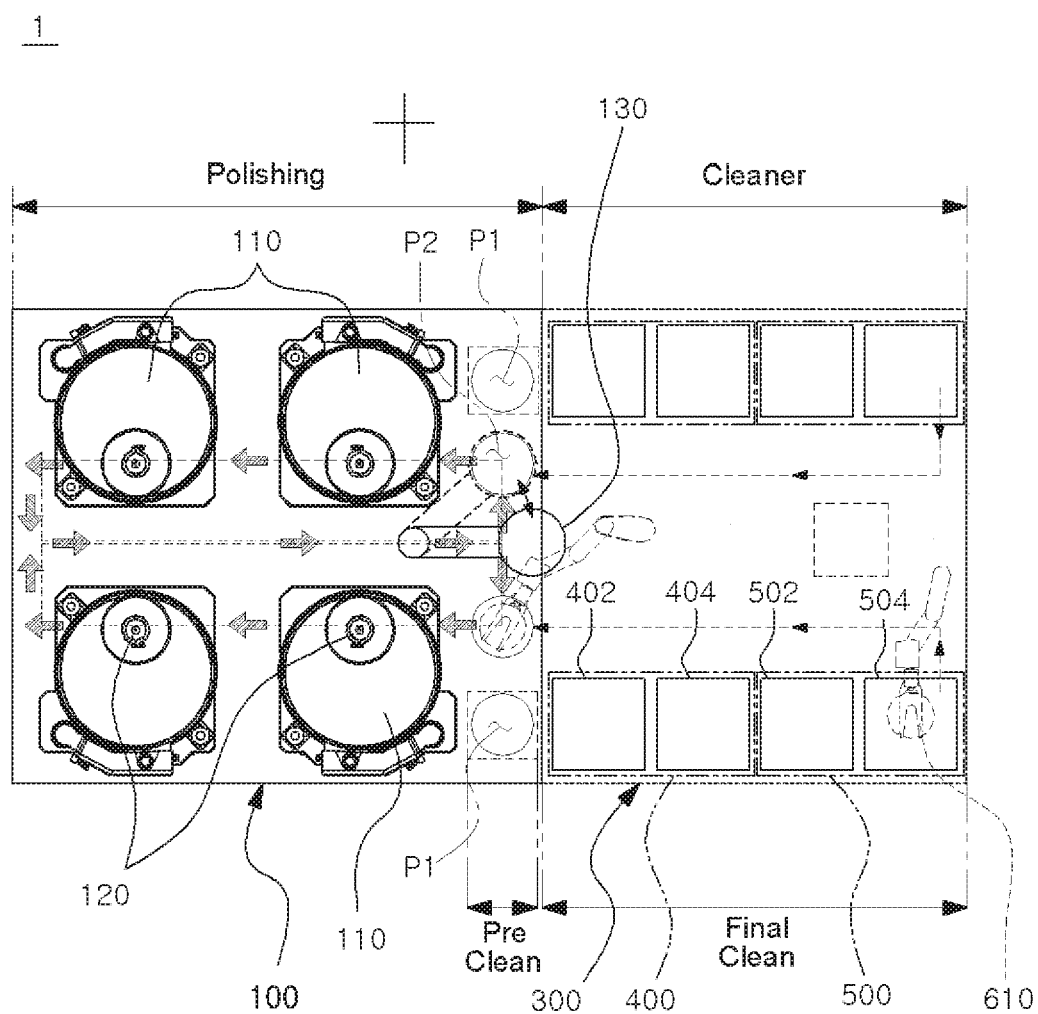
FIG. 2 is a view illustrating a substrate processing system according to an embodiment of the present invention.

Referring to FIG. 2, a substrate processing system 1 according to an embodiment of the present invention may include a polishing part 100 for performing a Chemical Mechanical Polishing (CMP) process on a substrate, a cleaning part 300 for cleaning the substrate on which the polishing process is performed, and a substrate transferring part 610 for transferring the substrate 10 to the cleaning part 300 before polishing the substrate 10 in the polishing part 100. The substrate 10 may be preparatorily cleaned in the cleaning part 300 before the polishing process, and then may enter the polishing part 100.

The polishing part 100 may be provided in various structures by which the chemical mechanical polishing process can be performed, and the present invention is not limited by the structure and layout of the polishing part 100.

A plurality of polishing surface plates 110 may be provided in the polishing part 100, and a polishing pad may be attached to the top surface of each polishing surface plate 110. The substrate 10 supplied to a loading unit provided in the region of the polishing part 100 may make rotational contact with the upper surface of the polishing pad supplied with slurry while adhering closely to a carrier head 120 moving along a predetermined path, and thus the chemical mechanical polishing process may be performed.

The carrier head 120 may move along a predetermined circulation path on the region of the polishing part 100. The substrate (hereinafter, referred to as a substrate supplied to a loading position of the substrate) 10 supplied to the loading unit may be transferred by the carrier head 120 while adhering closely to the carrier head 120. Hereinafter, a configuration in which the carrier head 120 moves along the circulation path of a substantially rectangular shape from the loading unit via the polishing surface plate 110 will be described with reference to the accompanying drawings.

Also, the polishing part 100 may include a transfer unit that transfers the substrate 10, entering a loading region of the polishing part 100, to the polishing surface plate 110, and a cleaning unit 130 that cleans a loading surface of the transfer unit before the transfer unit loads the substrate 10 from the loading region.

The carrier head 120 may be used as a transfer unit. The cleaning unit 130 may beforehand clean the loading surface before the carrier head 120 loads the substrate 10. Thus, prior to polishing, the substrate 10 may be prevented from being damaged or contaminated by foreign substances remaining on the loading surface (undersurface) of the carrier head 120. In addition, the cleaning unit 13 may be disposed at such a location that does not interrupt the loading of the substrate 100 while the substrate 100 is being loaded to the loading region, and then may be moved to the loading region after the substrate 100 is loaded to the loading region.

The cleaning unit 130 may be provided in various structures that can clean the loading surface of the transfer unit (e.g., carrier head), and the present invention is not limited by the structure and cleaning method of the cleaning unit 130. In one embodiment, since the polishing surface of the substrate 10 is disposed to face down in the polishing part, the cleaning unit 130 may include a plurality of washing water nozzles which can upwardly spray washing water along upward and downward directions. The cleaning unit 130 may be provided so as to be rotatable about the center of the transfer unit while being disposed under the transfer unit.

Figure 3:
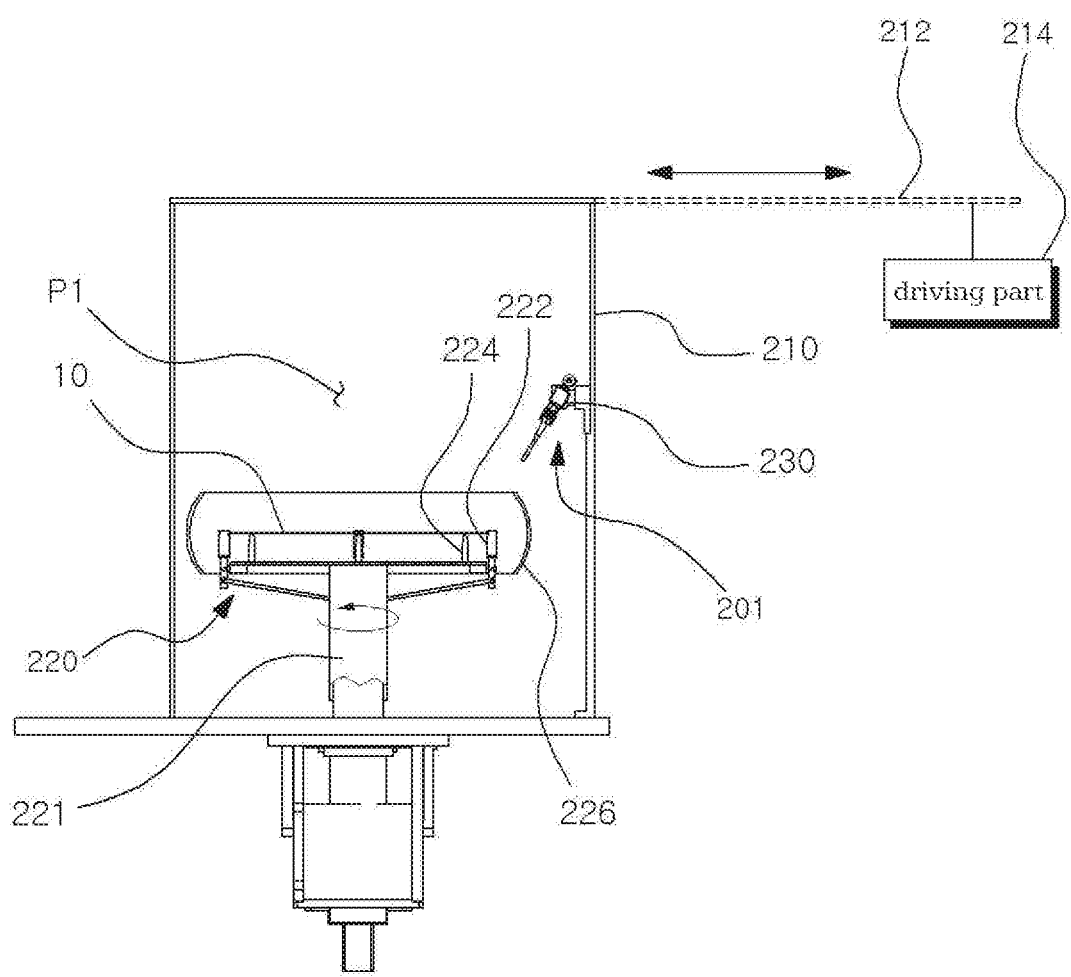
FIG. 3 is a view illustrating a substrate mounting part and a cleaning fluid spraying part in a substrate processing system according to an embodiment of the present invention.

Referring to FIGS. 2 and 3, a pre-cleaning region P1 may be disposed in the region of the polishing part 100, and the substrate 10 having undergone the polishing process may be unloaded to the pre-cleaning region P1. Also, the pre-cleaning region P1 may be provided to perform pre-cleaning on the substrate 10 that is unloaded.

For reference, the pre-cleaning of the substrate 10 set forth herein may be construed as a process for removing foreign substances existing on the surface (particularly, polishing surface of substrate) of the substrate 10 to the maximum before cleaning is performed in the cleaning part 300. Particularly, in the pre-cleaning of the substrate 10, relatively large-sized foreign substances (e.g., foreign substances having a size larger than about 100 nm) of foreign substances existing on the surface of the substrate 10 may be removed, and organic matters existing on the surface of the substrate 10 may be removed.

Thus, since the substrate 10 having undergone the polishing process is unloaded from the pre-cleaning region P1 and pre-cleaning is simultaneously performed, a separate space for the pre-cleaning need not to be additionally prepared. Accordingly, the layout of existing equipment can be almost maintained without a change or an addition, and the increase of contamination of the cleaning part 300 due to a direct entrance of the substrate 10 having undergone polishing into the cleaning part 300 can be reduced.

Furthermore, a blocking unit may be provided to block a pre-cleaning processing space of the pre-cleaning region P1 from other spaces while pre-cleaning is being performed in the pre-cleaning region P1. Here, the pre-cleaning processing space of the pre-cleaning region P1 may be construed as a space where pre-cleaning is performed, and may be provided in a chamber structure independently sealed by the blocking unit.

The blocking unit may be provided in various structures that can provide an independent sealed space blocked from the outside. Hereinafter, a configuration in which the blocking unit includes a casing 210 disposed to surround the substrate 10 and providing an independent pre-cleaning processing space and an opening/closing member 212 opening and closing the inlet of the casing 210 will be described with reference to the accompanying drawings.

In one embodiment, the casing 210 may be provided in a rectangular parallelepiped shape having an inlet formed at an upper end portion thereof. The opening/closing member 212 may be configured to be moved in a straight-line by a typical driving part (e.g., combination of motor and power transmission member) 214 and thus open and close the inlet of the casing 210. According to circumstances, the inlet may be formed at a sidewall portion of the casing 210, and the opening/closing member may open and close the inlet by moving in a vertical direction.

Furthermore, a substrate mounting part 220 may be disposed in the pre-cleaning region P1. The substrate 10 may be horizontally seated on the substrate mounting part 220, and the substrate mounting part 220 may rotate about the shaft 221 inside the casing 210.

For reference, the substrate mounting part 220 may be construed as a mounting unit from which the substrate 10 can be unloaded and on which the substrate 10 can be maintained at a disposition state while pre-cleaning is being performed.

In one embodiment, a mounting pin 224 supporting the undersurface of the substrate 10 may be disposed on the top surface of the substrate mounting part 220. A plurality of mounting pins 224 may be disposed on the upper surface of a spin jig plate (not shown) forming the substrate mounting part 220 to be spaced from each other at a certain interval. The undersurface of the substrate 10 may be placed on the upper end of the mounting pin 224. The number and the arrangement structure of the mounting pins 224 may be variously modified in accordance with the required conditions and design specifications.

Also, the substrate mounting part 220 may include an edge mounting part 222 on which the edge of the substrate 10 is placed. In one embodiment, the substrate mounting part 220 may be connected to the spin jig plate to support the edge of the substrate 10. A recessed part (not shown) for receiving and supporting the end of the outer circumference of the substrate 10 may be formed in the substrate mounting part so as to prevent the substrate 10 from shaking during the high-speed rotation. In addition, a cover member 226 may be disposed between the casing 210 and the substrate mounting part 220 to block a cleaning fluid scattered from the substrate 10. According to circumstances, the substrate mounting part may be formed into a form of simple plate without the substrate mounting part, the mounting pin, or the edge mounting part.

The pre-cleaning region in the pre-cleaning region P1 may be performed by various cleaning methods in accordance with requirements and design specifications.

In one embodiment, a cleaning fluid spraying part 201 may be provided in the pre-cleaning region P1 to perform pre-cleaning by spraying a cleaning fluid on the surface of the substrate 10.

Here, the cleaning fluid may be construed as including spraying materials such as cleaning liquid, steam, and heterogeneity fluid which are sprayed on the surface of the substrate to perform pre-cleaning, and the present invention is not limited to the type of cleaning fluid.

Figure 4:
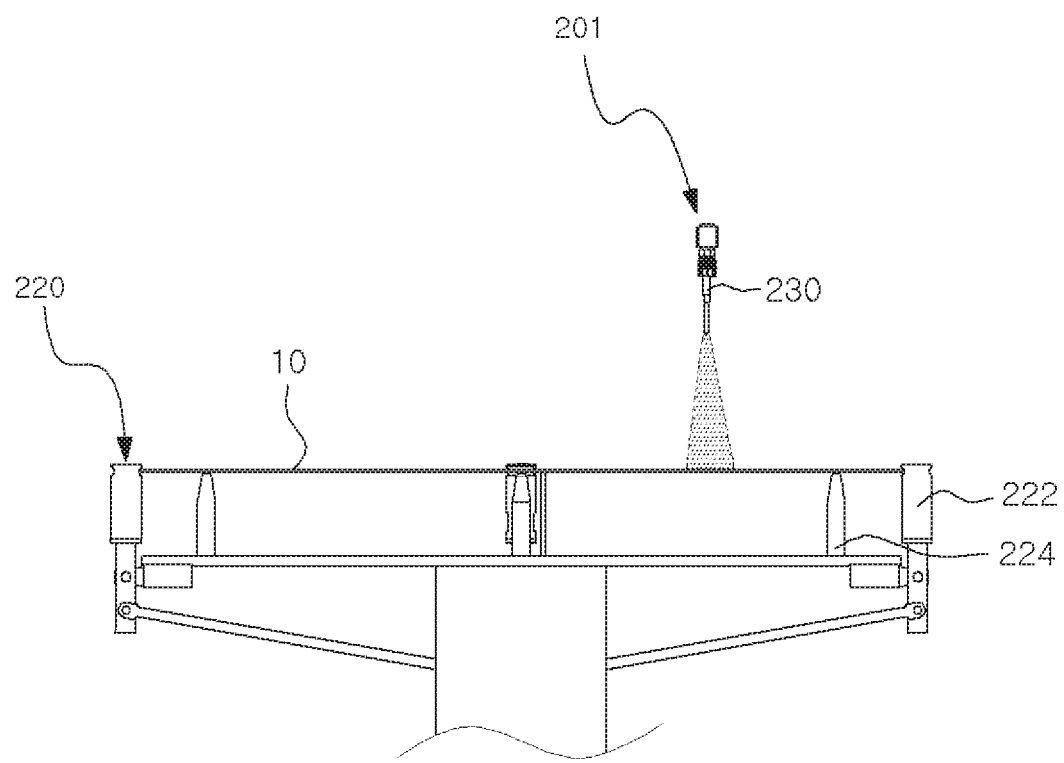
FIG. 4 is a view illustrating a cleaning liquid spraying part in a substrate processing system according to an embodiment of the present invention.

In one embodiment, referring to FIG. 4, the cleaning fluid spraying part 201 may be disposed in the pre-cleaning region P1, and may include a cleaning liquid spraying part 230 that sprays a cleaning liquid onto the surface of the substrate 10.

The cleaning liquid spraying part 230 may be configured to spray various cleaning liquids onto the surface of the substrate 10 in accordance with required conditions. In one embodiment, the cleaning liquid spraying part 230 may be configured to spray at least one of Standard Clean-1 (SC1, APM), ammonia, hydrogen peroxide, and pure water (DIW). Particularly, since the pre-cleaning processing space of the pre-cleaning region P1 is independently provided as a sealed chamber structure in the present invention, a chemical such as SC1 may be used as a cleaning liquid. Also, since pre-cleaning can be performed using the chemical, a portion of organic matters existing on the surface of the substrate 10 can be removed in advance before cleaning that will be described later.

Figure 5:
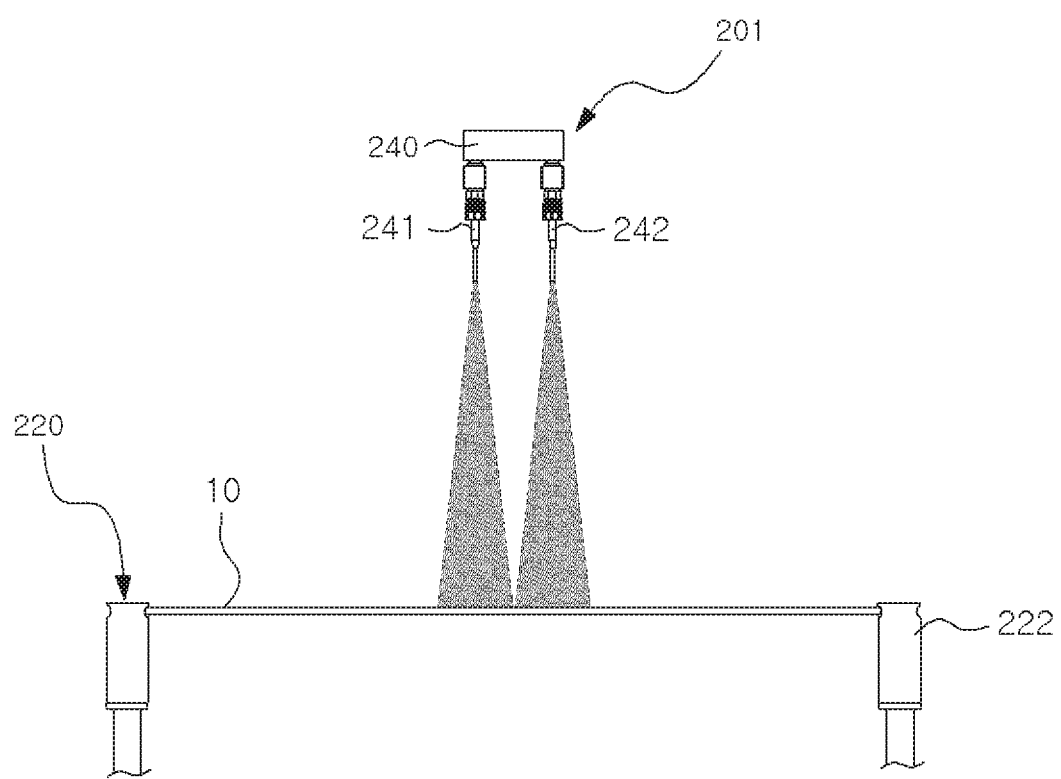
FIG. 5 is a view illustrating a heterogeneity fluid spraying part in a substrate processing system according to an embodiment of the present invention.
Figure 6:
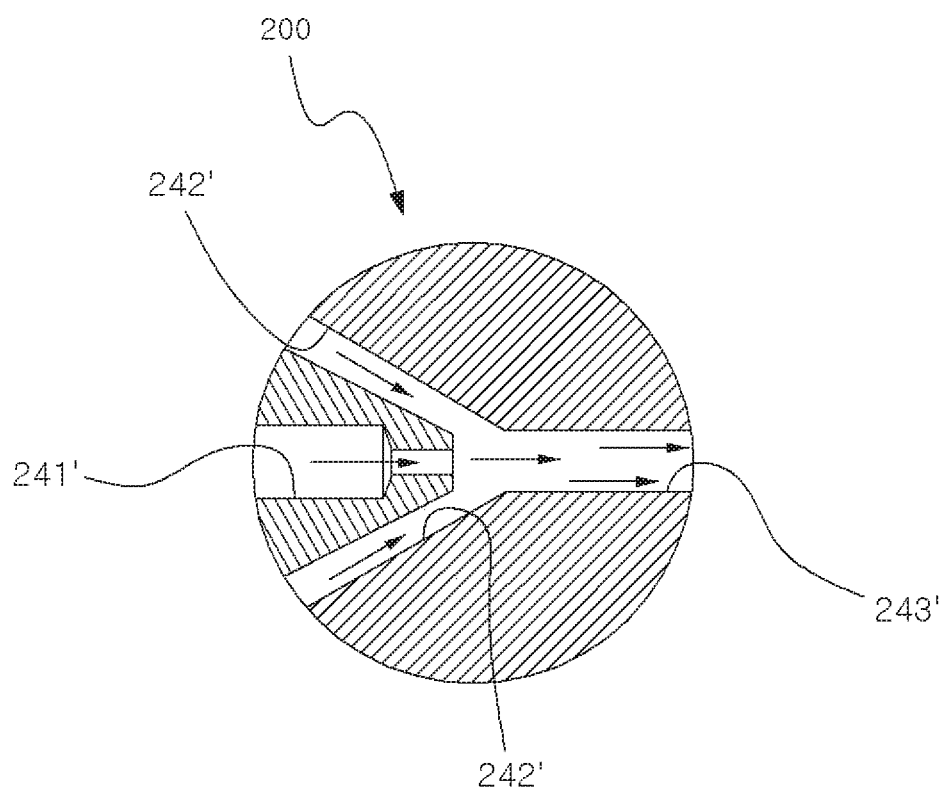
FIG. 6 is a view illustrating another exemplary heterogeneity fluid spraying part in a substrate processing system according to an embodiment of the present invention.

Referring to FIGS. 5 and 6, the cleaning fluid spraying part 201 may be disposed in the pre-cleaning region P1, and may include a heterogeneity fluid spraying part 240 that sprays different heterogeneity fluids onto the surface of the substrate 10.

The heterogeneity fluid spraying part 240 may be provided in various structures that can spray heterogeneity fluids. In one embodiment, the heterogeneity fluid spraying part 240 may include a first fluid supply unit 241 supplying a first fluid and a second fluid supply unit 242 supplying a second fluid different from the first fluid. The first fluid and the second fluid may be sprayed onto the surface of the substrate 10 by a spray member such as a typical nozzle while being mixed with each other or being separated from each other.

In one embodiment, referring to FIG. 5, the heterogeneity fluid spraying part 240 may include a first fluid spraying nozzle 241 and a second fluid spraying nozzle 242 which are separately disposed. The first fluid spraying nozzle 241 and the second fluid spraying nozzle 242 may independently spray the first fluid and the second fluid onto the surface of the substrate 10, respectively.

In another embodiment of the heterogeneity fluid spraying part 240, referring to FIG. 6, the heterogeneity fluid spraying part 240 may include a first fluid passage 241' for supplying the first fluid, a second fluid passage 242' for supplying the second fluid, and a mixture spray passage 243' from which the first fluid and the second fluid are fixed and sprayed. The first fluid and the second fluid may be sprayed at a high speed onto the surface of the substrate 10 while being mixed with each other in the mixture spray passage 243'.

The types and characteristics of the heterogeneity fluids that can be sprayed from the heterogeneity fluid spraying part 240 may be variously modified in accordance with the required conditions and design specifications. In one embodiment, the first fluid may be any one of gases and liquids, and the second fluid may be any one of gases and liquids. For example, the heterogeneity fluid spraying part 240 may be configured to spray both of pure water (DIW)

that is a liquid and nitrogen (N2) that is a gas, so as to increase the foreign substances removal efficiency. According to circumstances, two different types of liquids or two different types of gases may be used as long as the hitting force and the foreign substance removal efficiency by the heterogeneity fluids can be secured.

Also, cleaning liquids and/or heterogeneity fluids which are sprayed from the cleaning liquid spraying part 230 and the heterogeneity fluid spraying part 240 may be sprayed at a high pressure so as to hit foreign substances existing on the surface of the substrate 10 with a sufficient hitting force.

Figure 7:
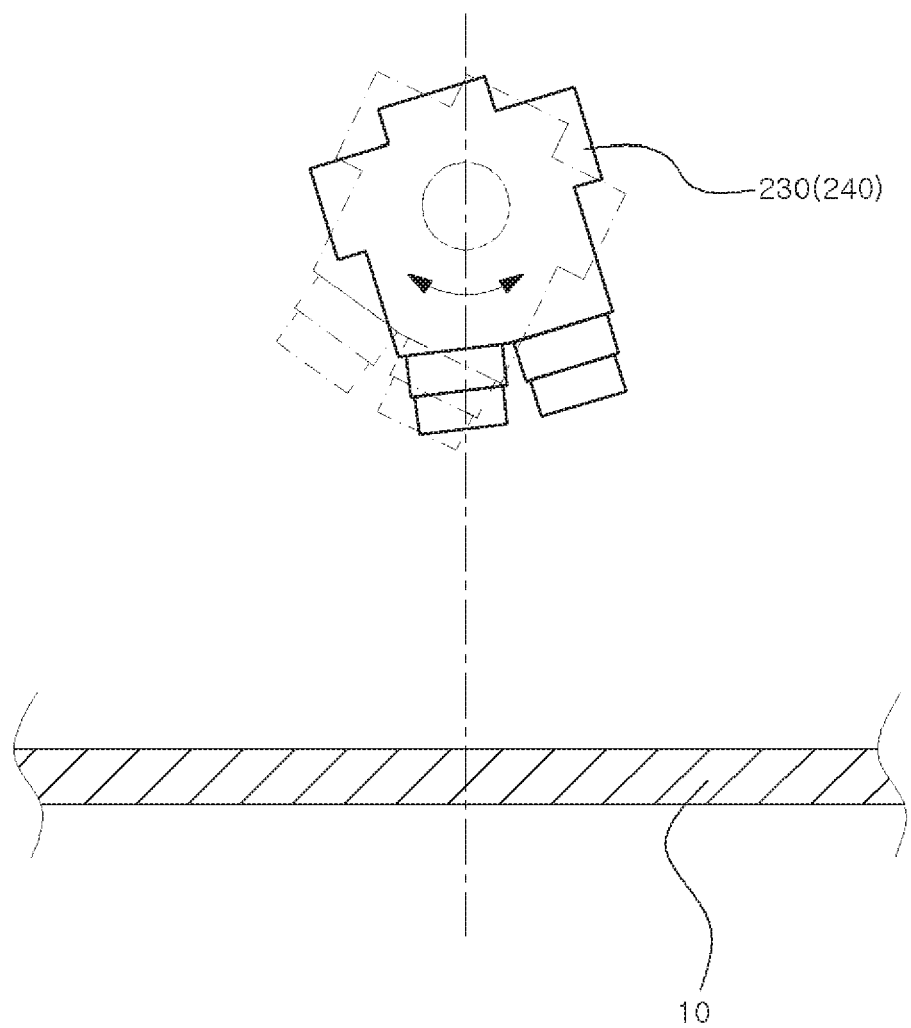
FIG. 7 is a view illustrating an oscillation function of a heterogeneity fluid spraying part in a substrate processing system according to an embodiment of the present invention.

In addition, referring to FIG. 7, at least one of the cleaning liquid spraying part 230 and the heterogeneity fluid spraying part 240 may be disposed to oscillate with respect to the surface of the substrate 10, and thus cleaning liquids and/or heterogeneity fluids may be oscillation-sprayed onto the surface of the substrate 10.

At least one of the cleaning liquid spraying part 230 and the heterogeneity fluid spraying part 240 may be provided so as to be oscillatable in various methods in accordance with the required conditions and design specification. Hereinafter, a configuration in which cleaning liquids and/or heterogeneity fluids can be oscillation-sprayed onto the surface of the substrate 10 by swing the cleaning liquid spraying part 230 and the heterogeneity fluid spraying part 240 will be described. This structure can maximize the cleaning efficiency by cleaning liquids and/or heterogeneity fluids, and can reduce the amount of cleaning liquids and/or heterogeneity fluids used, by allowing cleaning liquids and/or heterogeneity fluids to be oscillation-sprayed onto the surface of the substrate 10. Also, this method may have an effect of separating foreign substances from the surface of the substrate 10 by a cleaning power (including hitting force) by cleaning liquids and/or heterogeneity fluids and sweeping and discharging separated foreign substances out of the substrate 10.

Figure 8:
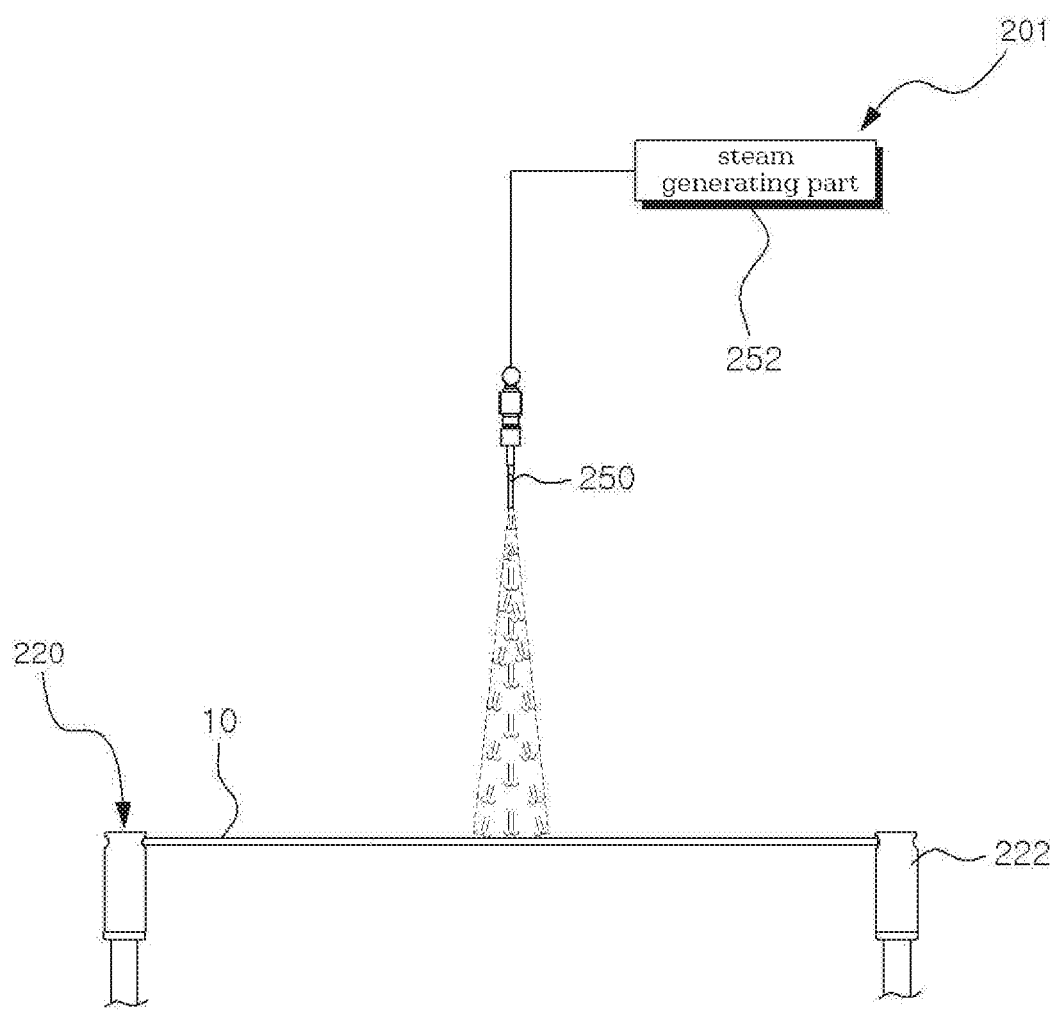
FIG. 8 is a view illustrating a steam spraying part in a substrate processing system according to an embodiment of the present invention.

Also, referring to FIG. 8, the cleaning fluid spraying part 201 may be disposed in the pre-cleaning region P1, and may include a steam spraying part 250 that sprays a steam generated from a steam generating part 252 onto the surface of the substrate 10 at the right angle.

Particularly, the steam sprayed from the steam spraying part 250 may be effective to remove organic matters existing on the surface of the substrate 10. For reference, the steam spraying part 250 may be configured to spray steam at a temperature capable of preventing damage of the substrate 10 while securing the organic matter removal efficiency by steam. The steam spraying part 250 may spray steam at a temperature of about 60 degrees to about 120 degrees.

Similarly to the cleaning liquid spraying part 230 and the heterogeneity fluid spraying part 240, the steam spraying part 250 may also be provided so as to oscillate with respect to the surface of the substrate 10, and thus may oscillation-spray steam onto the surface of the substrate 10. (see FIG. 7)

Figure 9:
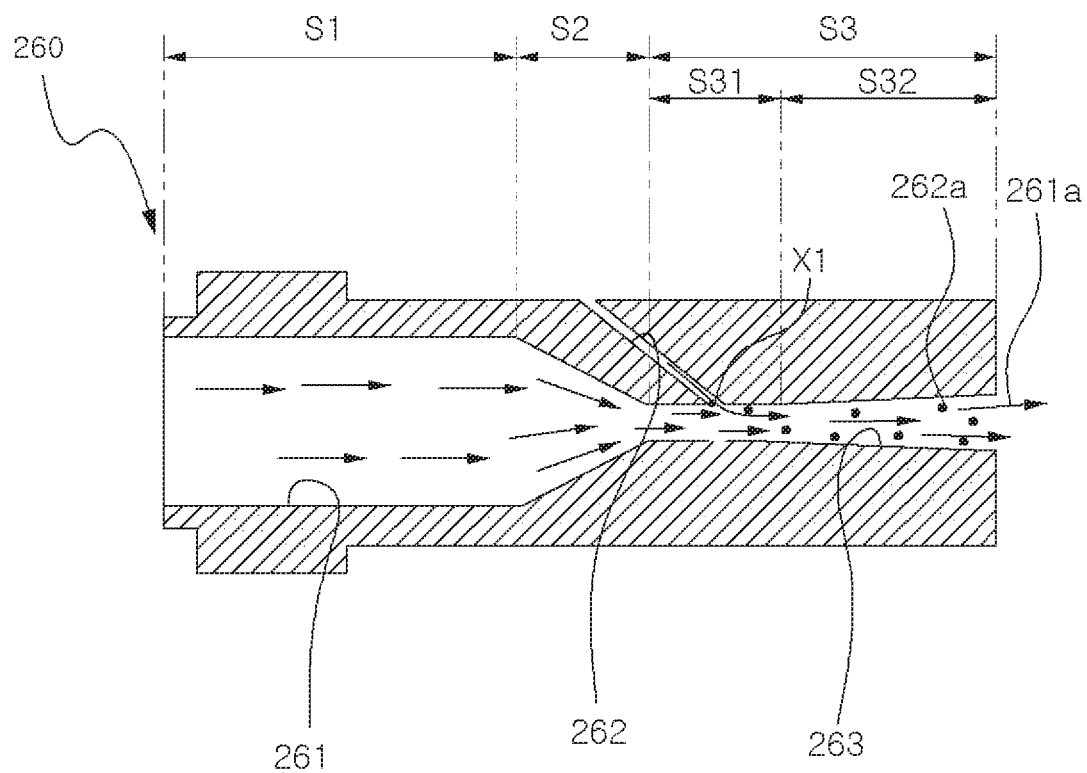
FIGS. 9 and 10 are views illustrating still another exemplary heterogeneity fluid spraying part in a substrate processing system according to an embodiment of the present invention.
Figure 10:
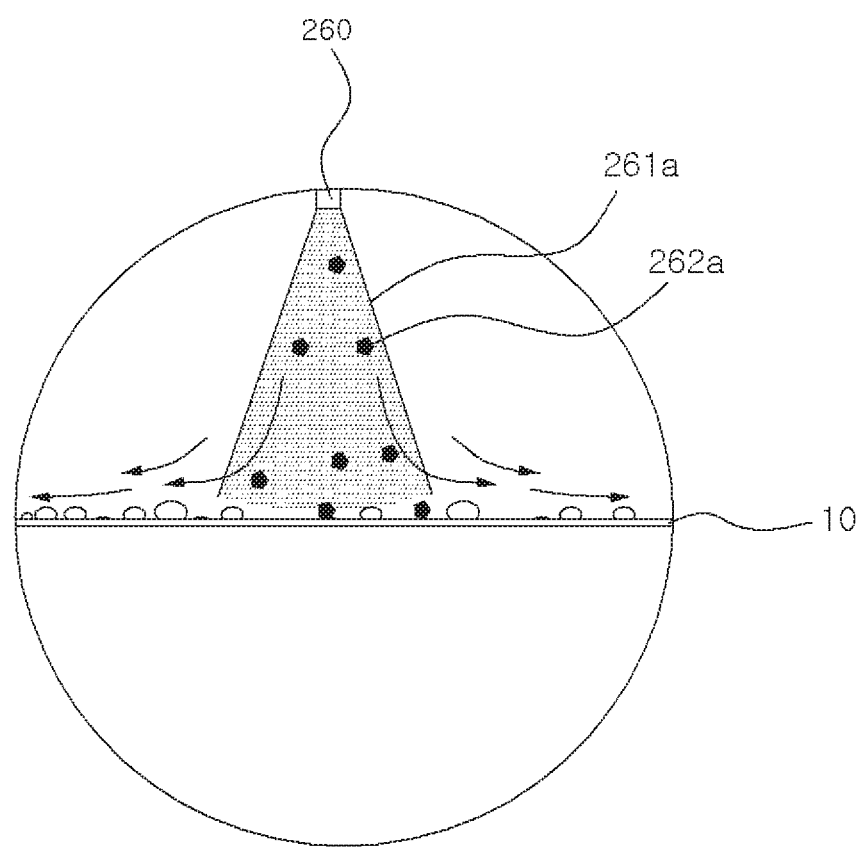

Referring to FIGS. 9 and 10, the cleaning fluid spraying part 201 may be disposed in the pre-cleaning region P1, and may include a heterogeneity fluid spraying part 260 that sprays different heterogeneity fluids onto the surface of the substrate 10. The heterogeneity fluid spraying part 260 may include a dry ice supply unit that supplies dry ice particles, and a fluid spraying unit that sprays a fluid onto the surface of the substrate 10.

The fluid spraying unit may be configured to spray various fluids in accordance with the required conditions and design specifications. In one embodiment, the fluid spraying unit may be configured to spray at least one of gases and liquids. Hereinafter, a configuration in which the heterogeneity fluid spraying part sprays a gas 261a together with dry ice particles will be described. According to circumstances, the heterogeneity fluid spraying part may also be configured to spray a liquid (e.g., DIW) together with dry ice particles.

The fluid spraying unit may be provided in various structures that can mix and spray dry ice particles 262a and a fluid. In one embodiment, the fluid spraying unit may include a gas supply passage 261 through which a gas is supplied, a dry ice supply passage 262 through which dry ice particles are supplied, and a mixture discharge passage 263 through which the gas 261a and the dry ice particles 262a are mixed and sprayed.

Hereinafter, a configuration in which carbon dioxide of liquid state supplied through the dry ice supply passage 262 is solidified into dry ice particles while passing through the mixture discharge passage 263 will be described.

For this, the gas supply passage 261 may include a first constant sectional region S1 in which the sectional area thereof is constant along the flow direction of the gas 261a, a decreasing sectional region S2 in which the sectional area thereof gradually decreases along the flow direction of the gas 261a, and a second constant sectional region S31 in which the sectional area thereof is constant along the flow direction of the gas 261a.

Accordingly, the gas 261a may be stabilized in flow while passing the first constant sectional region S1, and may gradually decrease in pressure and thus increase in flow velocity of the gas while passing the decreasing sectional region S2. Also, the gas 261a may be stabilized in flow while passing a portion of the second constant sectional region S31. In this case, as an outlet of a branched passage (supply passage of dry ice) is formed at a first point spaced by a certain distance from a point where the second constant sectional region S31 starts, a compressed gas supplied through the gas supply passage 261 may become faster in flow velocity while passing the decreasing sectional region S2, and may become stabilized in flow while starting to pass the second constant sectional region S31.

In this state, when carbon dioxide of high-pressure and liquid state flows to a first location X1 of the second constant sectional region through the branched passage (dry ice supply passage) and reaches the second constant sectional region S31 of relatively low pressure, carbon dioxide of liquid state may be solidified into dry ice particles due to a rapid reduction of pressure.

Meanwhile, the gas supply unit may be configured to at least one of inert gases such as air, nitrogen gas, argon gas through the gas supply passage 261. When an inert gas is supplied through the gas supply passage 261, a chemical reaction may be inhibited on the substrate 10, and thus the cleaning effect can be increased.

The branched passage may form an acute angle with the gas supply passage through which a gas is supplied along a center line of a straight-line while having the same directional component as the flow direction of a gas flowing in the gas supply passage 261. Thus, carbon dioxide of liquid state introduced through the branched passage may smoothly flow into the first location X1 of the end of the gas supply passage 261.

In one embodiment, carbon dioxide of liquid state may be supplied through the branched passage (dry ice supply passage) from a high-pressure tank of about 40 bar to about 60 bar. The pressure of carbon dioxide of liquid state which is injected into the branched passage may also be maintained high. Thus, at the moment that carbon dioxide of liquid state supplied through the branched passage flows into the gas supply passage 261, the pressure of carbon dioxide of high-pressure state may be lowered, and thus carbon dioxide of liquid state may be solidified into dry ice of solid state.

Furthermore, since carbon dioxide of liquid state instead of solid state is supplied through the branched passage and thus carbon dioxide of liquid state is solidified into fine dry ice particles when reaching the gas supply passage 261 of low pressure, the dry ice particles may be uniformly mixed with a gas flowing in the gas supply passage 261 while passing the discharge passage together with the gas.

The section of the branched passage may be formed smaller than the section of the gas supply passage 261, and the size of dry ice particles solidified at the first location X1 may be adjusted by the size of the section of the branched passage. For example, the diameter of dry ice particles may range from about 100 µm to about 2,000 µm.

The mixture discharge passage 263 may be aligned with the gas supply passage 261 in a straight line, and at the first location X1 communicating with the branched passage, dry ice particles solidified from carbon dioxide of liquid state supplied through the branched passage may be mixed with the gas to form an injection mixture. The injection mixture may move toward and may be discharged out of a discharge port by a flow pressure of the gas and carbon dioxide which are supplied from the gas supply passage 261 and the branched passage, respectively.

In this case, a discharge region S3 through which the injection mixture is discharged may include the second constant sectional region S31 in which the section thereof is maintained constant along the flow direction, and an expanding sectional region S32 in which the section thereof gradually expands along the flow direction. Accordingly, fine dry ice particles may pass the discharge region S3 while uniformly dispersing in the gas that stably flows at the first location X1 of the second constant sectional region S31. Accordingly, the injection mixture discharged out of the discharge port may include the gas and the fine dry ice solid particles which are uniformly mixed with each other therein.

Particularly, since the temperature of the gas is lowered while the gas having a fast flow velocity at the decreasing sectional region S2 expands passing through the expanding sectional area S32, the temperature of the injection mixture that is discharged can be lowered. Accordingly, since the substrate 10 is cooled by the injection mixture hitting on the surface of the substrate 10, fine particles (foreign substance particles) separated from the substrate 10 and floating around the substrate 10 during the cleaning of the substrate 10 can be prevented from re-adhering to the substrate 10 due to the thermo-phoresis effect.

Thus, the heterogeneity fluid spraying part 240 that sprays dry ice and a fluid may allow sludge adhered onto the surface of the substrate 10 having undergone the chemical mechanical polishing process to be more quickly and cleanly removed. Also, the heterogeneity fluid spraying part 240 may shorten the brush cleaning process time described later, and may reduce the amount of chemicals for removing foreign substances on the surface of the substrate 10.

In this embodiment, although carbon dioxide of liquid state is described as being solidified into dry ice particles to be supplied, according to circumstances, already-solidified dry ice particles may also be supplied through the dry ice supply passage 262. Also, the heterogeneity fluid spraying part 240 that sprays dry ice and a fluid may be configured to have a discharge port of a slit shape having a long length.

Also, the heterogeneity fluid spraying part 260 that sprays both dry ice and fluid may also be provided so as to oscillate with respect to the surface of the substrate 10, and thus may oscillation-spray the dry ice and the fluid onto the surface of the substrate 10. (see FIG. 7)

In this embodiment, although the heterogeneity fluid spraying part that sprays dry ice and a fluid is described as including the gas supply passage, the branched passage, and the discharge passage, according to circumstances, cleaning liquid or chemicals may be sprayed at a high speed by a structure equal or similar to the heterogeneity fluid spraying part including the gas supply passage, the branched passage, and the discharge passage.

Also, the spray structure equal or similar to the heterogeneity fluid spraying part that sprays dry ice and a fluid may be applied to a heterogeneity fluid spraying part that sprays a gas and a liquid (or two types of gases or two types of liquids). For example, the heterogeneity fluid spraying part that sprays a gas and a liquid may be configured to include a gas supply passage (see 261 of FIG. 9) and a liquid supply passage (see 262 of FIG. 9). The gas supply passage 261 may include a decreasing sectional region in which the section area thereof gradually decreases along the flow direction of a gas to increase the flow velocity of a gas, and a third region formed from the decreasing sectional region to the discharge port. The liquid supply passage 262 may allow the liquid to flow into the gas supply passage at the first location adjacent the discharge port.

Figure 11:
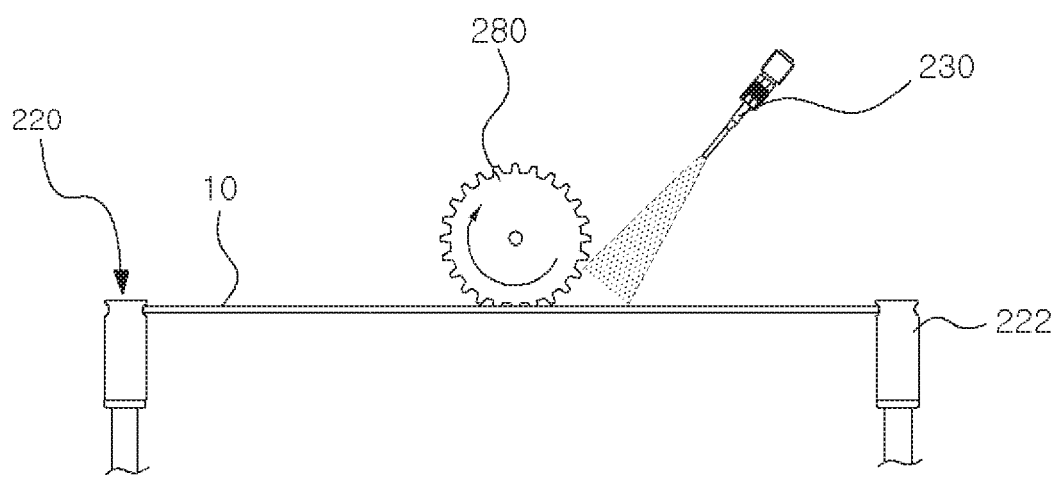
FIG. 11 is a view illustrating a cleaning brush in a substrate processing system according to an embodiment of the present invention.

Referring to FIG. 11, a cleaning brush 280 may be disposed in the pre-cleaning region P1. The cleaning brush 280 may make rotational contact with the surface of the substrate 10.

The cleaning brush 280 may be a brush formed of a typical material (e.g., porous polyvinyl alcohol) that can make fictional contact with the surface of the substrate 10. In addition, a plurality of cleaning protrusions may be formed on the surface of the cleaning brush 280 to improve the contact characteristics of the brush. According to circumstances, a brush without the cleaning protrusion may also be used.

Also, a chemical supply part 230 may be provided to supply a chemical to a contact place between the cleaning brush 280 and the substrate 10 while the cleaning brush 280 is contacting the substrate 10, so as to increase the cleaning effect by the frictional contact between the cleaning brush 280 and the substrate 10 while cleaning is being performed by the cleaning brush 280.

The chemical supply part 230 may be configured to spray a chemical to at least one of the substrate 10 and the cleaning brush 280. The types and characteristics of chemicals sprayed to the cleaning brush 280 may be variously modified in accordance with the required conditions and the design specifications. In order to increase the removal efficiency of fine organic matters, chemicals sprayed to the cleaning brush 280 may include at least one of SC1 (APM) and hydrofluoric acid (HF). According to circumstances, pure water (or other cleaning liquid) instead of a chemical may be sprayed to the contact place between the cleaning brush 280 and the substrate 10, or both chemical and pure water may be together sprayed.

Figure 12:
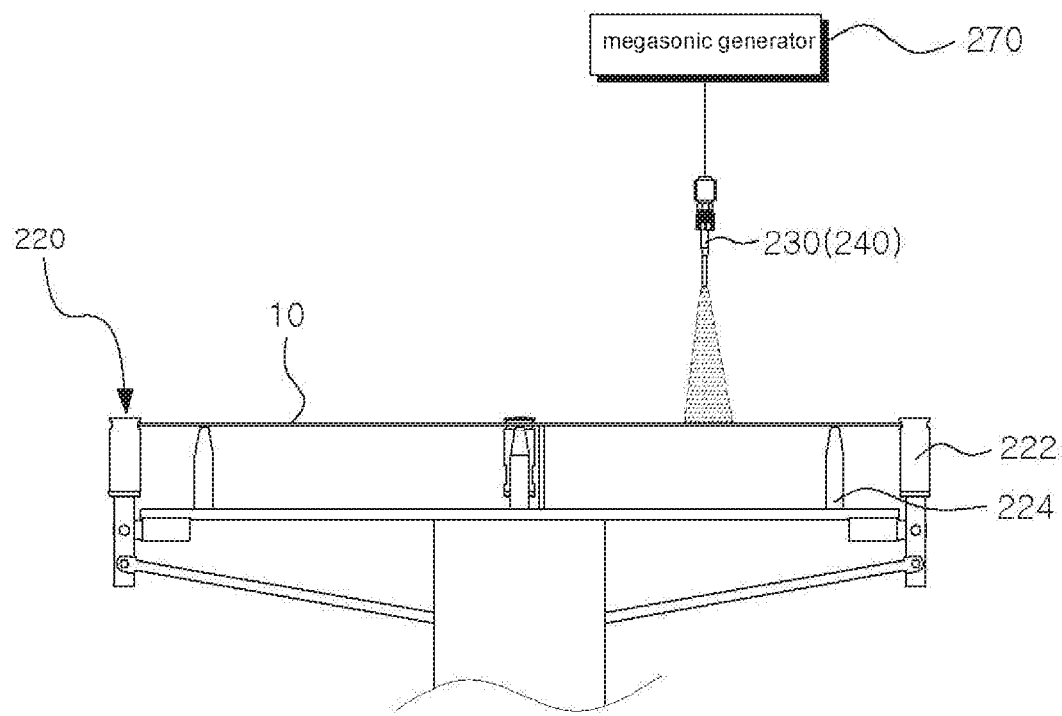
FIG. 12 is a view illustrating a megasonic generator in a substrate processing system according to an embodiment of the present invention.

Referring to FIG. 12, a megasonic generator 270 may be disposed in the pre-cleaning region P1. The megasonic generator 270 may supply vibration energy to the surface of the substrate 10.

The megasonic generator 270 may supply vibration energy (e.g., high-frequency vibration energy or low-frequency vibration energy) to the surface of the substrate 10 by various methods in accordance with the required conditions and the design specifications. Hereinafter, a configuration in which the megasonic generator 270 effectively separates foreign substances existing on the surface of the substrate by vibrating the surface of the substrate 10 by means of a cleaning liquid or a chemical sprayed onto the surface of the substrate 10 through the cleaning liquid spraying part 230 will be described. According to circumstances, the megasonic generator 270 may also be configured to directly supply vibration energy to the substrate 10.

Also, since sizes of particles (foreign substances) that are removed may vary with the frequency band of vibration, the megasonic generator 270 may selectively vary the frequency band in accordance with the size of a particle. This frequency band change method may overcome a limitation that when there are bubbles in a trench or a contact hole formed in the surface of the substrate, ultrasonic vibration is not delivered to the surface of the substrate 10 due to bubbles. Also, the frequency band change method may provide a cleaning liquid to which ultrasonic vibration is uniformly applied, to the surface of the substrate 10.

Meanwhile, the substrate 10 that is pre-cleaned in the pre-cleaning region P1 may be transferred to the cleaning part 300 described later, by a typical transfer arm (not shown). The transfer arm may be disposed to reciprocate between the pre-cleaning region P1 and the cleaning part (e.g., contact-type cleaning unit described later), and thus may be used to transfer the pre-cleaned substrate 10 to the cleaning part 300. For reference, while different substrates 10 are being simultaneously cleaned in the pre-cleaning region P1 and the cleaning part 300, respectively, the transfer arm may temporarily stand by on an avoidance region provided between the pre-cleaning region P1 and the cleaning part 300.

Referring again to FIG. 2, the cleaning part 300 may be adjacently disposed at a side portion of the polishing part 100, and may be provided to remove foreign substances remaining on the surface of the substrate 10 pre-cleaned in the pre-cleaning region P1.

For reference, the cleaning of the substrate 10 performed in the cleaning part 300 may be construed as a process for removing foreign substances remaining on the surface (particularly, non-polishing surface of substrate is also cleanable) of the substrate 10 to the maximum after the pre-cleaning is performed. Particularly, in the cleaning of the substrate 10, relatively small-sized foreign substances (e.g., foreign substances having a size ranging from about 40 nm to about 100 nm) and relatively strongly adhesive foreign substances of foreign substances existing on the surface of the substrate 10 may be removed.

In addition, the substrate 10 cleaned in the cleaning part 300 may be configured to go through a predetermined next process as a non-cleaning state. Here, the performing of the next process as the 'non-cleaning state' may be construed as that all cleaning processes for the substrate 10 are completed by finishing the cleaning process in the cleaning part 300, and thus the phrase of 'non-cleaning state' is used hereinafter as the state in which the substrate does not experience additional cleaning process any more. The substrate 10 having undergone the cleaning process may go through a next process (e.g., deposition process) without an additional cleaning process.

The cleaning part 300 may be provided in a structure capable of performing various stages of cleaning and drying processes, and the present invention is not limited by the structure and layout of a cleaning station constituting the cleaning part 300.

The cleaning part 300 may include a contact-type cleaning unit 400 and a non-contact-type cleaning unit 500. The contact-type cleaning unit 400 may make contact with the surface of the substrate 10 so as to effectively remove organic matters and other foreign substances remaining on the surface of the substrate 10 and may perform cleaning. The non-contact-type cleaning unit may not make contact with the surface of the substrate 10 and may perform cleaning. According to circumstances, the cleaning part 300 may be configured to include only one of the contact-type cleaning unit and the non-contact-type cleaning unit.

The contact-type cleaning unit 400 may make physical contact with the surface of the substrate 10, and may be provided in various structures that can perform cleaning. Hereinafter, a configuration in which the contact-type cleaning unit 400 includes a first contact-type cleaning unit 402 and a second contact-type cleaning unit 404 will be described.

Figure 13:
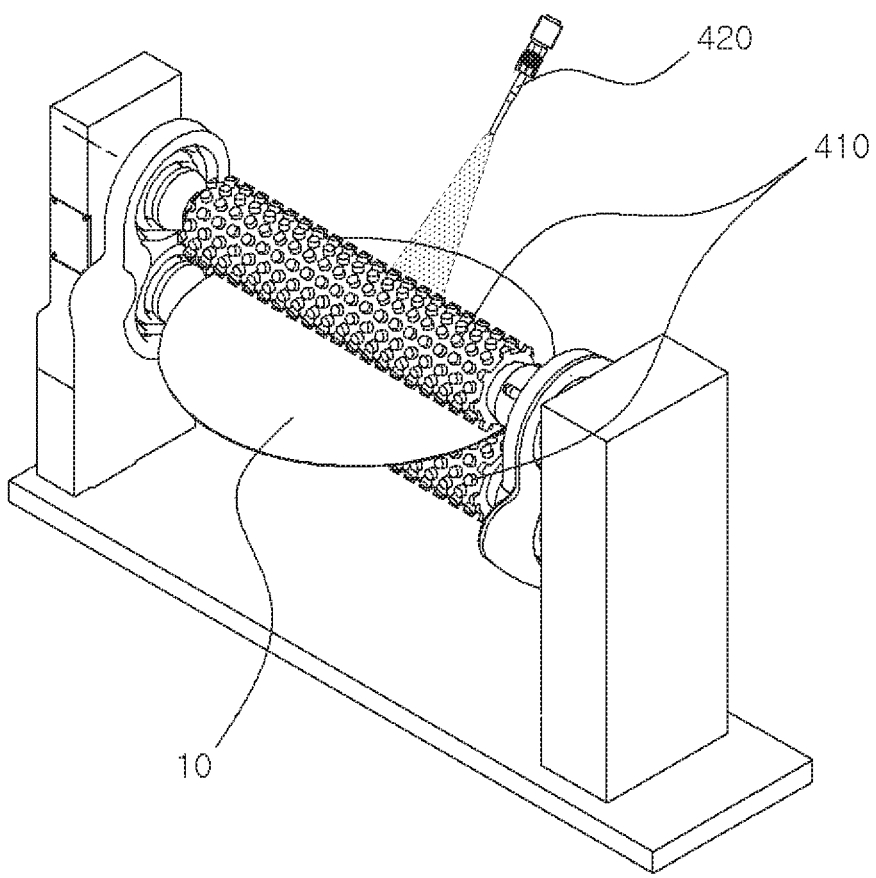
FIG. 13 is a view illustrating a first cleaning brush of a contact-type cleaning unit in a substrate processing system according to an embodiment of the present invention.

Referring to FIG. 13, the first contact-type cleaning unit 402 may include a first cleaning brush 410 that makes rotational contact with the surface of the substrate 10.

In one embodiment, the pre-cleaned substrate 10 may be cleaned by a pair of first cleaning brushes 410 that are rotated by a typical spindle (not shown). According to circumstances, the substrate 10 may be cleaned by the first cleaning brush 410 while being fixed without rotating. Alternatively, only one first cleaning brush 410 may clean only one surface (e.g., polishing surface) of the substrate 10.

The first cleaning brush 410 may be a brush formed of a typical material (e.g., porous polyvinyl alcohol) that can make fictional contact with the surface of the substrate 10. In addition, a plurality of cleaning protrusions may be formed on the surface of the first cleaning brush 410 to improve the contact characteristics of the brush. According to circumstances, a brush without the cleaning protrusion may also be used.

Also, a first chemical supply part 420 may be provided to supply a chemical to a contact place between the first cleaning brush 410 and the substrate 10 while the first cleaning brush 410 is contacting the substrate 10, so as to increase the cleaning effect by the frictional contact between the first cleaning brush 410 and the substrate 10 while cleaning is being performed by the first cleaning brush 410.

The chemical supply part 420 may be configured to spray a chemical to at least one of the substrate 10 and the first cleaning brush 410. The types and characteristics of chemicals sprayed to the first cleaning brush 410 may be variously modified in accordance with the required conditions and the design specifications. In order to increase the removal efficiency of fine organic matters, chemicals sprayed to the first cleaning brush 410 may include at least one of SC1 (APM) and hydrofluoric acid (HF). According to circumstances, pure water instead of a chemical may be sprayed to the contact place between the first cleaning brush and the substrate, or both chemical and pure water may be together sprayed.

Meanwhile, when foreign substances that are separated from the substrate 10 by the frictional contact cleaning of the first cleaning brush 410 adhere to the first cleaning brush 410, the substrate 10 may be again contaminated or reduced in cleaning efficiency. Also, the substrate 10 may be damaged by foreign substances adhering to the first cleaning brush 410.

In order to overcome this limitation, a foreign substance removing part 430 may be provided to remove foreign substances adhering to the surface of the first cleaning brush 410.

The foreign substance removing part 430 may be provided in various structures that can clean foreign substances adhering to the surface of the first cleaning brush 410, and the present invention is not limited by the structure and cleaning method of the foreign substance removing part 430.

Figure 14:
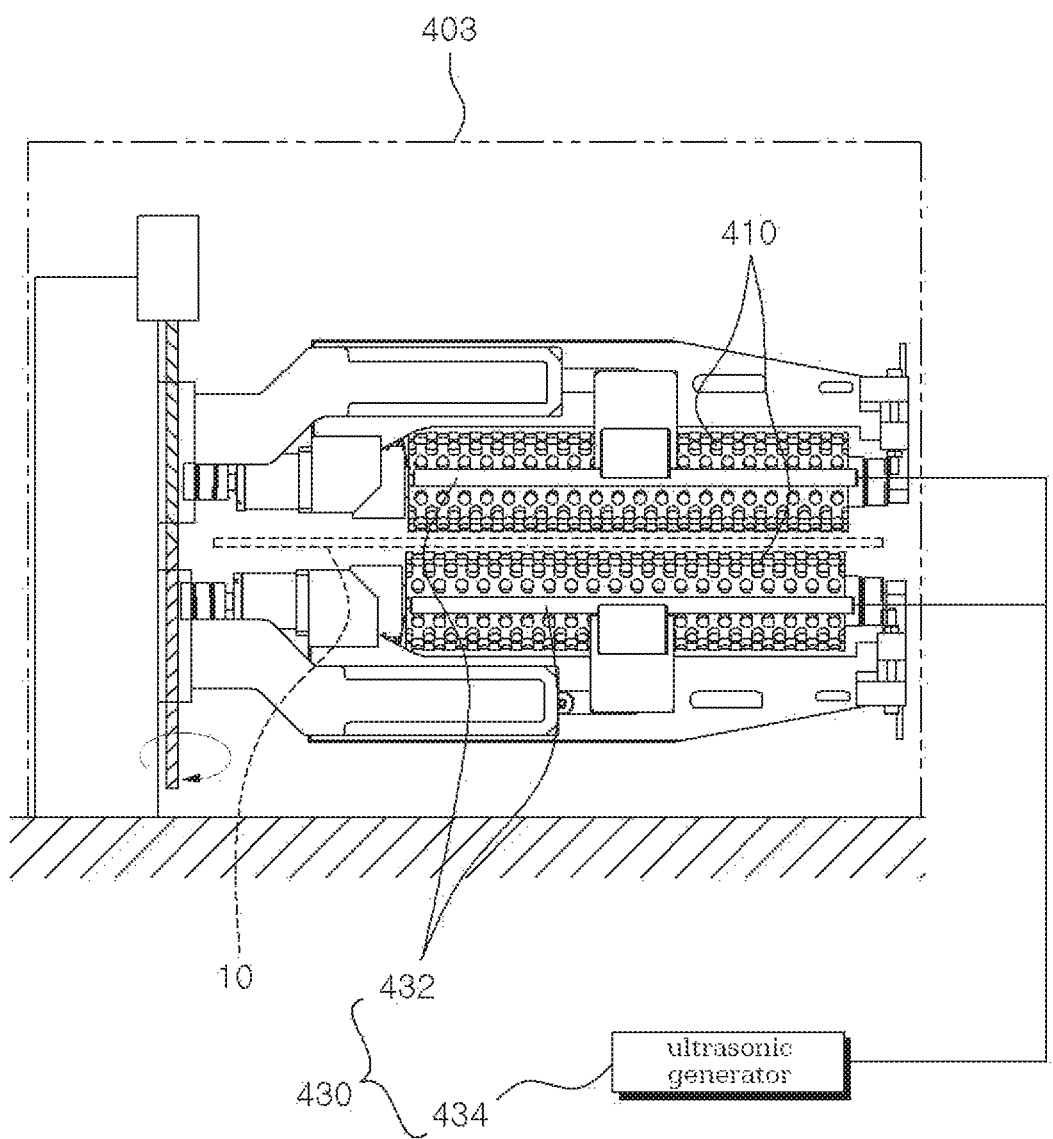
FIGS. 14 and 15 are views illustrating a foreign substance removing part of a contact-type cleaning unit in a substrate processing system according to an embodiment of the present invention.

In one embodiment, referring to FIG. 14, the foreign substance removing part 430 may include a contact member 432 and a ultrasonic generator 434. The contact member 432 may be provided so as to contact the outer surface of the first cleaning brush 410. The ultrasonic generator 434 may apply an ultrasonic wave to the contact member 432.

The contact member 432 may be provided in various structures and forms which can make contact with the outer surface of the first cleaning brush 410. In one embodiment, the contact member 432 may be formed into a bar or rod shape having a length corresponding to the length of the first cleaning brush 410. According to circumstances, the contact member may have a section of an arc shape, or may have contact protrusions formed on the surface thereof.

The ultrasonic generator 434 may apply an ultrasonic wave to the contact member 432 to supply vibration energy to the surface of the contact member 432. The ultrasonic generator 434 may be a typical ultrasonic wave generating unit that can generate an ultrasonic wave.

The surface of the contact member 432 may be vibrated by the ultrasonic generator 434. Accordingly, foreign substances separated from the substrate 10 by the first cleaning brush 410 may not adhere to the surface of the first cleaning brush 410, and may be separated from the surface of the first cleaning brush 410 as the contact member 432 that vibrates may contact. According to circumstances, foreign substances separated from the first cleaning brush by the contact member may be collected by a separate collection container or a suctioning unit.

Figure 15:
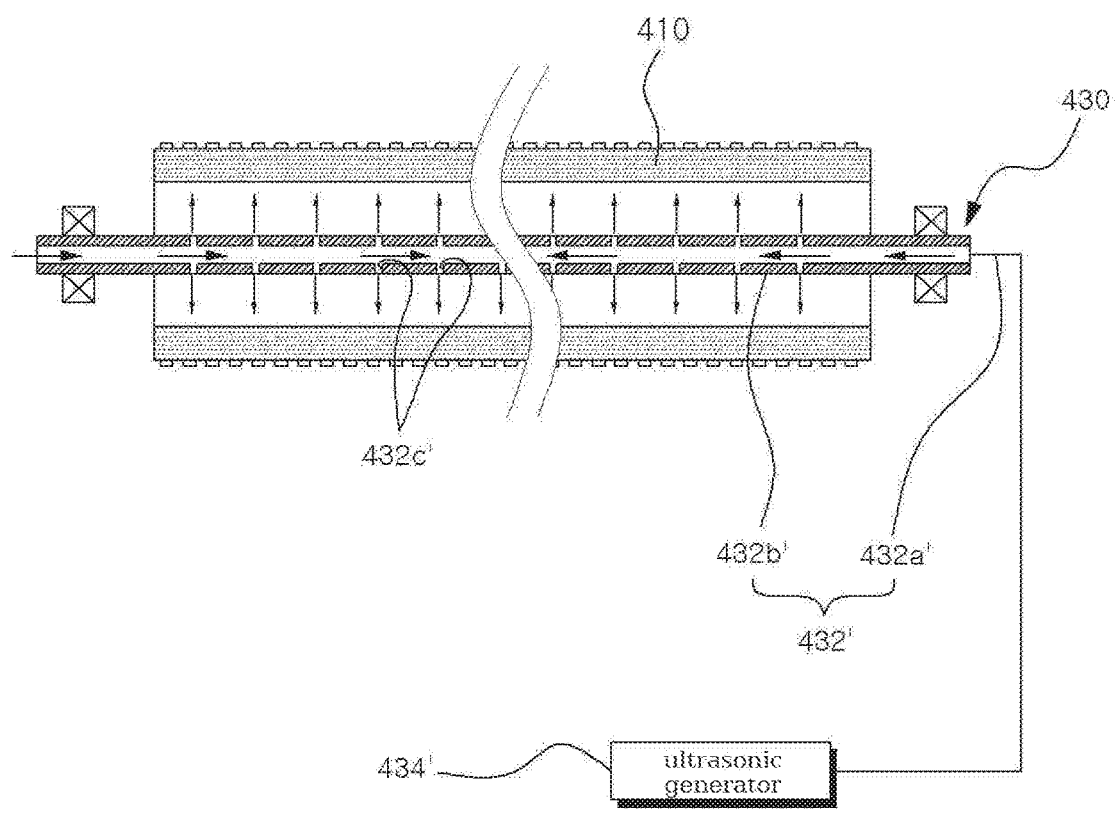

In another embodiment, referring to FIG. 15, the foreign substance removing part 430 may include a fluid spraying unit 432' and an ultrasonic generator 434'. The fluid spraying unit 432' may spray a liquid toward the outside from the inside of the first cleaning brush 410. The ultrasonic generator 434' may apply an ultrasonic wave to the liquid sprayed from the fluid spraying unit 432'.

The fluid spraying unit 432' may be provided in various structures and forms which can spray a liquid toward the outside from the inside of the first cleaning brush 410. In one embodiment, the fluid spraying unit 432' may include a fluid supply flow passage 432a' for supplying a liquid, and a fluid spray tube 432b' connected to the fluid supply flow passage 432a' and disposed in the first cleaning brush 410 along the longitudinal direction of the first cleaning brush 410. Also, a plurality of spray holes 432c' may be radially formed in the surface of the fluid spray tube 432b'.

A liquid supplied from the fluid supply flow passage 432a' may be transferred to the inside of the first cleaning brush 410 in an axial direction along the fluid spray tube 432b. The liquid supplied to the fluid spray tube 432b' may be sprayed through the spray holes 432c' by a supply pressure of the fluid supply flow passage 432a' and a rotation force of the first cleaning brush 410.

The ultrasonic generator 434' may be provided to apply an ultrasonic wave to the liquid sprayed from the fluid spraying unit 432'. The ultrasonic generator 434' may be a typical ultrasonic wave generating unit that can generate an ultrasonic wave.

The liquid that can be sprayed from the fluid spraying unit 432' of the foreign substance removing part 430 may be a typical fluid of a liquid state, and the types and characteristics of the liquid may be variously changed in accordance with the required conditions and design specifications. In one embodiment, the fluid spraying unit 432' of the foreign substance removing part 430 may spray pure water (DIW).

A liquid having vibration energy may be sprayed toward the outside (e.g., in a radial direction of the first cleaning brush) in the first cleaning brush 410 by the fluid spraying unit 432' and the ultrasonic generator 434'. Accordingly, foreign substances separated from the substrate 10 by the first cleaning brush 410 may not adhere to the surface of the first cleaning brush 410, and may be separated from the surface of the first cleaning brush 410 together with the liquid having vibration energy.

Figure 16:
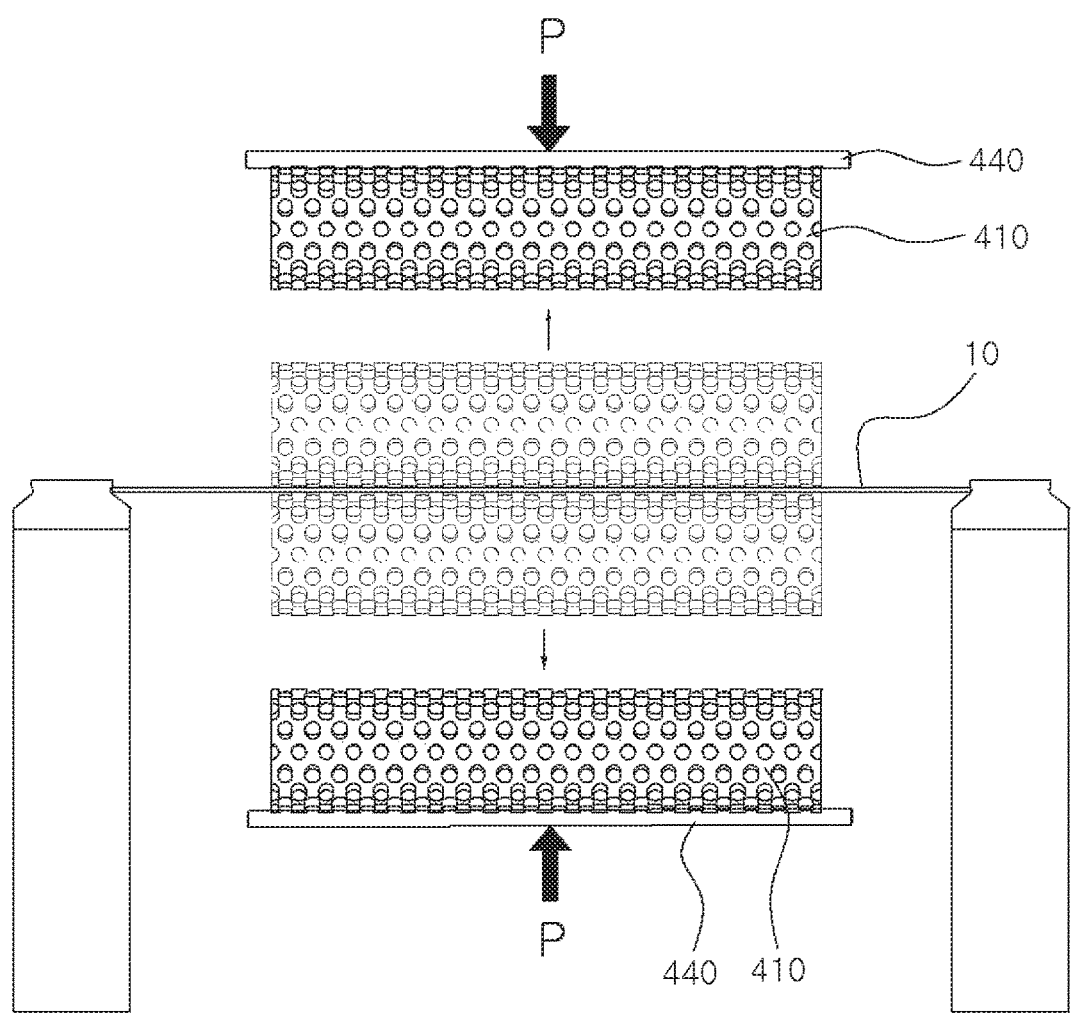
FIG. 16 is a view illustrating a pressurizing member of a contact-type cleaning unit in a substrate processing system according to an embodiment of the present invention.

Also, referring to FIG. 16, a pressurizing member 440 may be provided to pressurize the surface of the first cleaning brush 410 while the first cleaning brush 410 does not contact the substrate 10.

Here, the non-contact state of the first cleaning brush with the substrate 10 may be understood that the first cleaning brush 410 is spaced from the substrate 10 while not contacting the substrate 10. For example, the substrate 10 cleaned by the first cleaning brush 410 may be transferred to a next process, and another substrate 10 may be transferred to the cleaning region of the first cleaning brush 410. Thus, the first cleaning brush 410 may be disposed to make non-contact with the substrate while the substrate 10 is being transferred.

During the cleaning process by the first cleaning brush 410, the first cleaning brush 410 may make contact with the surface of the substrate 10, and the cleaning may be performed while the surface of the first cleaning brush 410 is pressurized (or compressed). The brush cleaning conditions such as rotation speed and frictional force of the first cleaning brush 410 may be set based on a state (pressurized state) that the first cleaning brush 410 makes contact with the substrate 10.

However, when the first cleaning brush 410 is in non-contact with the substrate 10, as a chemical or a cleaning liquid is removed from the first cleaning brush 410, the surface of the first cleaning brush 410 that is compressed may be recovered (expand closely to the original state). Thus, when another substrate 10 is cleaned in a state where the surface of the first cleaning brush 410 is recovered, a frictional force or a pressurizing force by the first cleaning brush 410 may differ. Accordingly, there is a limitation in that it is difficult to maintain a uniform cleaning effect on the substrate 10 by the first cleaning brush 410.

For this, the pressurizing member 440 may pressurize the surface of the first cleaning brush 410 when the first cleaning brush 410 is in non-contact with the substrate 10, and thus may uniformly maintain the cleaning effect by the first cleaning brush 410. The pressurizing member 440 may be configured to pressurize the surface of the first cleaning brush 410 in accordance with a section pressurized while the surface of the first cleaning brush 410 is in contact with the surface of the substrate 10. Accordingly, since the surface of the first cleaning brush 410 can be pressurized by the same conditions in both contact and non-contact states with the substrate 10, the cleaning effect of the substrate 10 by the first cleaning brush 410 can be uniformly maintained.

The pressurizing member 440 may be provided in various structures which can pressurize the surface of the first cleaning brush 410. In one embodiment, the pressurizing member 440 may be formed into a bar or rod shape having a length corresponding to the length of the first cleaning brush 410. According to circumstances, the pressurizing member may have a section of an arc shape, or may have a structure that covers the whole surface of the first cleaning brush.

Meanwhile, while the substrate 10 is being cleaned by the first cleaning brush 410, the frictional force of the first cleaning brush 410 with respect to the substrate 10 may significantly affect the cleaning effect. Accordingly, in order to uniformly maintain the cleaning effect, the frictional force of the first cleaning brush 410 with respect to the substrate 10 needs to be uniformly maintained. For this, a frictional force adjusting part 450 may be provided to adjust the frictional force of the first cleaning brush 410 with respect to the substrate 10.

The frictional force adjusting part 450 may be provided in various structures that can adjust the frictional force of the first cleaning brush 410 with respect to the substrate 10. The frictional force adjusting part 450 may be configured to adjust in real-time the frictional force of the first cleaning brush 410 with respect to the substrate 10 while the cleaning process is being performed by the first cleaning brush 410.

Figure 17:
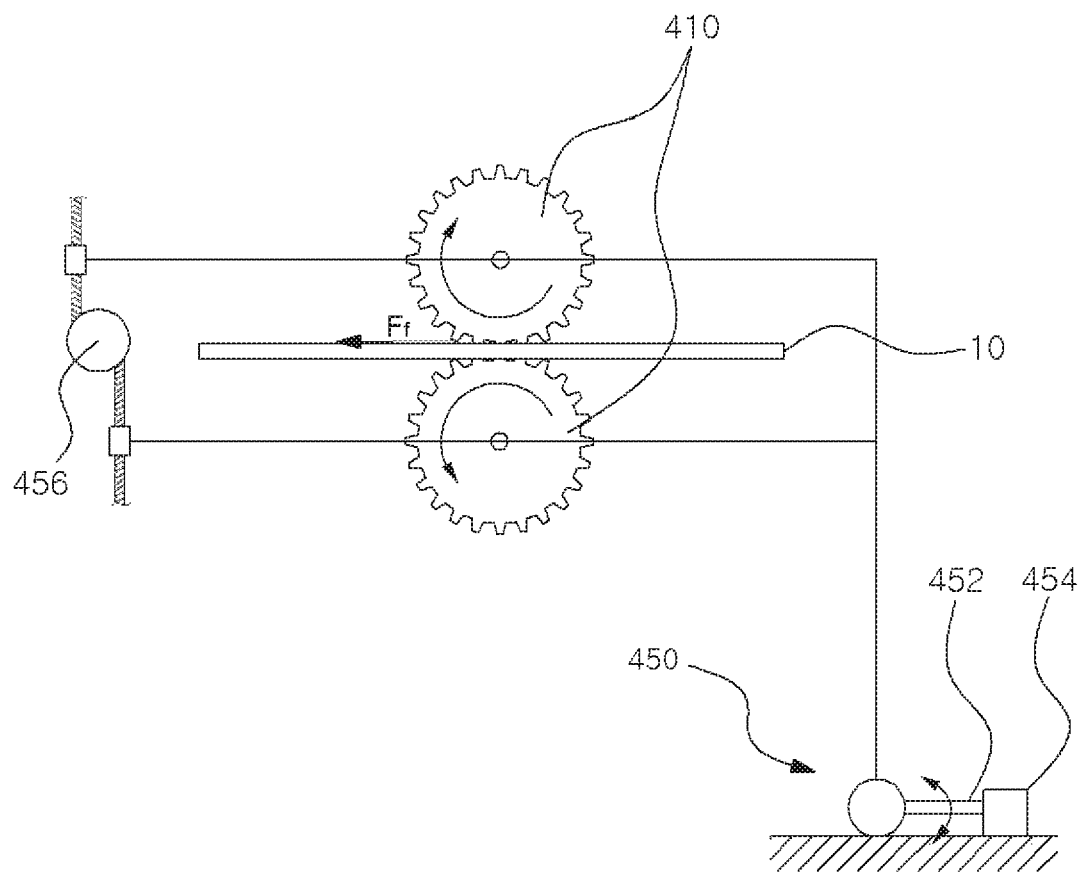
FIG. 17 is a view illustrating a frictional force adjusting part of a contact-type cleaning unit in a substrate processing system according to an embodiment of the present invention.

In one embodiment, referring to FIG. 17, the frictional force adjusting part 450 may include a connection member 452, a sensor 454, and a brush mover 456. The connection member 452 may be connected to the shaft of the first cleaning brush 410. The sensor 454 may sense the displacement of the connection member 452 according to the frictional force of the first cleaning brush 410 with respect to the substrate 10. The brush mover 456 may move the first cleaning brush 410 with respect to the substrate 10 in accordance with the results sensed by the sensor 454.

The connection member 452 may be integrally connected to the shaft of the first cleaning brush 410. When a horizontal displacement occurs on the first cleaning brush 410 in accordance with the change of the frictional force Ff of the first cleaning brush 410 with respect to the substrate 10, the same displacement may occur on the connection member 452.

The sensor 454 may be various units that can sense the displacement of the connection member 452. In one embodiment, the sensor 454 may be a typical load cell. According to circumstances, the displacement of the connection member can be sensed by other typical sensing units.

The brush mover 456 may move the first cleaning brush 410 to adjust the frictional force with respect to the substrate 10 in accordance with the results sensed by the sensor 454. For example, when the frictional force Ff of the first cleaning brush 410 with respect to the substrate 10 is larger than a predetermined condition, the brush mover 456 may move the first cleaning brush 410 away from the substrate 10. On the contrary, when the frictional force Ff of the first cleaning brush 410 with respect to the substrate 10 is smaller than the predetermined condition, the brush mover 456 may move the first cleaning brush 410 toward the substrate 10

The brush mover 456 may be provided in various structures that can move the first cleaning brush 410 away from or toward the substrate 10, and the present invention is limited by the structure and movement method of the brush mover 456. In one embodiment, the brush mover 456 may include a lead screw rotated by a driving force of a drive motor, and a guide member moving along the lead screw.

Also, while the substrate 10 is being cleaned by the first cleaning brush 410, the vertical load acting on the substrate 10 by the first cleaning brush 410 may significantly affect the cleaning effect of the substrate 10 (for example, when the vertical load increases, the frictional force increases). Accordingly, in order to uniformly maintain the cleaning effect of the substrate 10, the vertical load acting on the substrate 10 by the first cleaning brush 410 needs to be uniformly maintained. For this, a vertical load adjusting part 460 may be provided to adjust the vertical load acting on the substrate 10 by the first cleaning brush 410.

The vertical load adjusting part 460 may be provided in various structures that can adjust the vertical load acting on the substrate 10 by the first cleaning brush 410. The vertical load adjusting part 460 may be configured to adjust in real-time the vertical load acting on the substrate 10 by the first cleaning brush 410.

Figure 18:
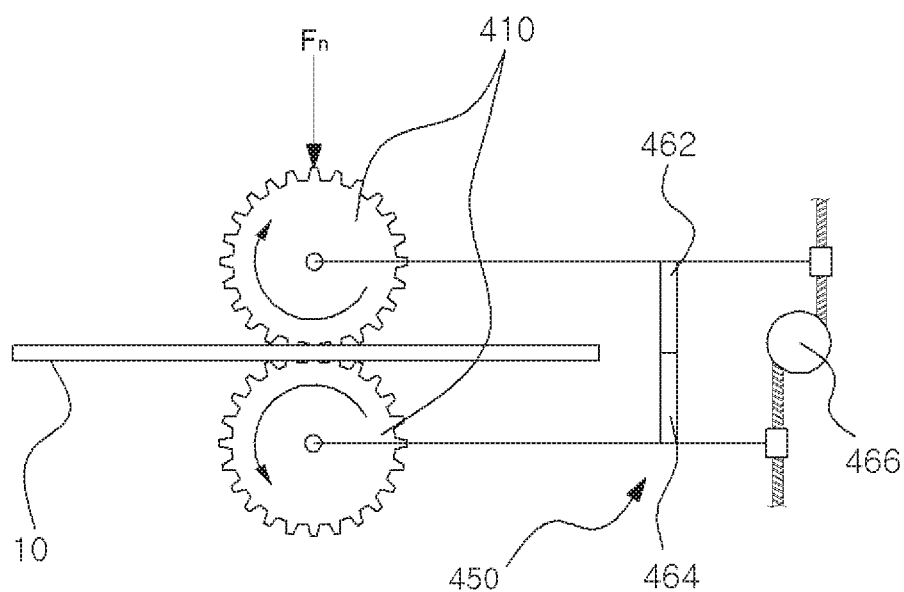
FIG. 18 is a view illustrating a vertical load adjusting part of a contact-type cleaning unit in a substrate processing system according to an embodiment of the present invention.

In one embodiment, referring to FIG. 18, the vertical load adjusting part 460 may include a vertical connection member 462, a sensor 464, and a brush mover 466. The vertical connection member 462 may be vertically connected to the shaft of the first cleaning brush 410. The sensor 464 may sense the displacement of the vertical connection member 462 according to the vertical load acting on the vertical connection member 462 by a contact of the cleaning brush and substrate 10. The brush mover 466 may move the first cleaning brush 410 with respect to the substrate 10 in accordance with the results sensed by the sensor 464.

The vertical connection member 462 may be integrally connected to the shaft of the first cleaning brush 410 so as to be vertically disposed in the gravity direction. When the first cleaning brush 410 makes contact with the substrate 10 and a vertical displacement occurs on the first cleaning brush 410 in accordance with the change of the vertical load Fn acting on the substrate 10 by the first cleaning brush 410, the same displacement may also occur on the vertical connection member 462.

The sensor 464 may be disposed on the same vertical line as the vertical connection member 462, and may sense a vertical displacement occurring on the vertical connection member 462 when the first cleaning brush 410 is in contact and non-contact with the substrate 10.

The sensor 464 may be various units that can sense a vertical displacement of the vertical connection member 462. In one embodiment, the sensor 464 may be a typical load cell. According to circumstances, the displacement of the vertical connection member can be sensed by other typical sensing units.

For example, when the first cleaning brush 410 is not in contact with the substrate, the result sensed by the sensor 464 through the vertical connection member 462 may be 'A', and when the first cleaning brush 410 makes contact with the substrate 10, the result sensed by the sensor 464 may be 'B' smaller than 'A'. In this case, the vertical load Fn acting on the substrate 10 can be calculated by a difference between 'A' and 'B'. For reference, when the first cleaning brush 410 is not in contact with (spaced from) the substrate 10, the pure load 'A' of the first cleaning brush may be sensed by the sensor 464. On the other hand, when the first cleaning brush 410 makes contact with the substrate 10, the load of the first cleaning brush 410 may be partially dispersed to the substrate 10. Accordingly, the value 'B' sensed by the sensor 464 may be smaller than the value 'A'. Accordingly, the vertical load Fn acting on the substrate 10 may be calculated by the difference between the value 'A' and the value 'B'.

The brush mover 466 may move the first cleaning brush 410 with respect to the substrate 10 in accordance with the results sensed by the sensor 464, thereby adjusting the vertical load Fn acting on the substrate 10. For example, when the vertical load Fn acting on the substrate 10 is larger than a predetermined condition, the brush mover 466 may move the first cleaning brush 410 away from the substrate 10. On the contrary, when the vertical load Fn acting on the substrate 10 is smaller than the predetermined condition, the brush mover 466 may move the first cleaning brush 410 toward the substrate 10.

The brush mover 466 may be provided in various structures that can move the first cleaning brush 410 away from or toward the substrate 10, and the present invention is limited by the structure and movement method of the brush mover 466. In one embodiment, the brush mover 466 may include a lead screw rotated by a driving force of a drive motor, and a guide member moving along the lead screw.

Figure 19:
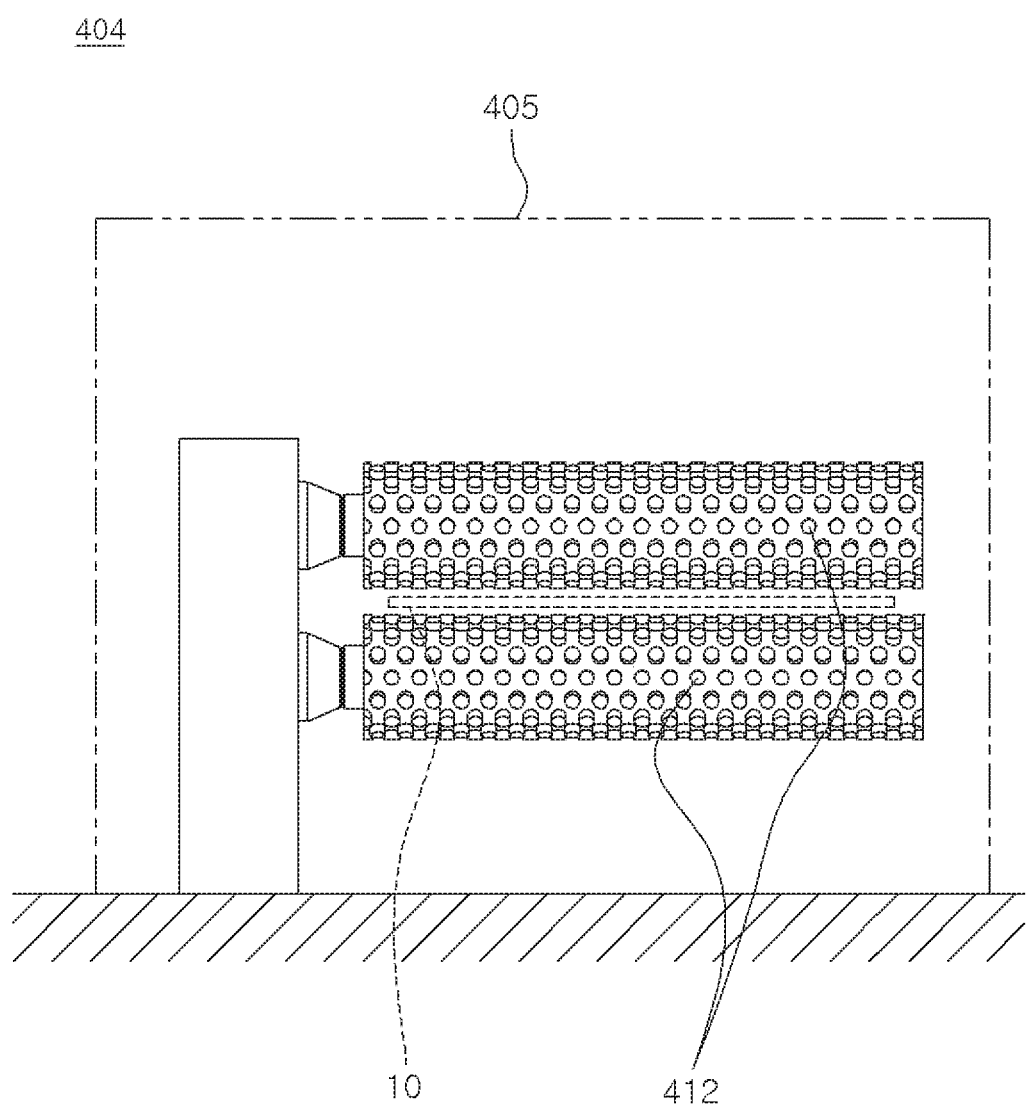
FIG. 19 is a view illustrating a second cleaning brush of a contact-type cleaning unit in a substrate processing system according to an embodiment of the present invention.

Referring to FIG. 19, the second contact-type cleaning unit 405 may include a second cleaning brush 412 that makes rotational contact with the surface of the substrate 10.

The second cleaning brush 412 may perform cleaning on the substrate 10 in the structure and method identical or similar to the first cleaning brush 410. According to circumstances, the contact-type cleaning unit may include only the first cleaning brush, excluding the second cleaning brush 412.

In addition, even when the substrate 10 is cleaned by the second cleaning brush 412, at least one of the foreign substance removing part 430, the chemical supply part 420, the pressurizing member 440, the frictional force adjusting part 450 and the vertical load adjusting part 460 may be used, and the cleaning process by the second cleaning brush 412 may be variously modified in accordance with the required conditions and the design specifications.

Figure 20:
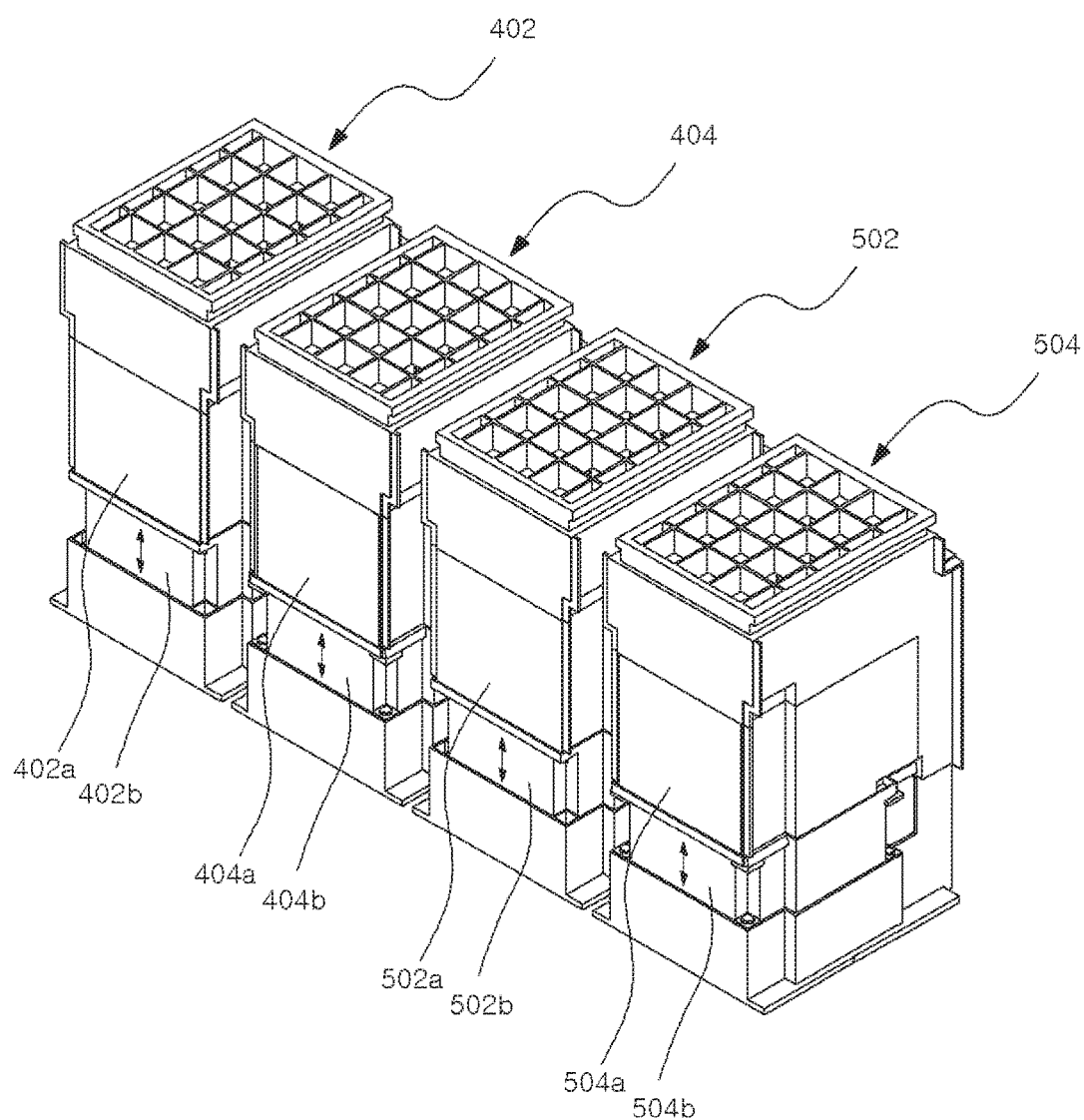
FIG. 20 is a view illustrating a cleaning part in a substrate processing system according to an embodiment of the present invention.

Furthermore, the first cleaning brush 410 and the second cleaning brush 412 may perform the cleaning process in independent cleaning processing spaces provided by separate blocking units (see 402 and 404 of FIG. 20), respectively.

Meanwhile, the substrate 10 cleaned in the first contact-type cleaning unit (e.g., first cleaning brush) may be transferred to the second contact-type cleaning unit (e.g., second cleaning brush) by a typical transfer arm. The transfer arm may be provided to reciprocate between the first contact-type cleaning unit and the second contact-type cleaning unit, and thus may transfer the substrate 10 cleaned in the first contact-type cleaning unit to the second contact-type cleaning unit. For reference, while different substrates 10 are being simultaneously cleaned in the first contact-type cleaning unit and the second contact-type cleaning unit, respectively, the transfer arm may temporarily stand by on an avoidance region provided between the first contact-type cleaning unit and the second contact-type cleaning unit.

Also, the substrate 10 cleaned in the second contact-type cleaning unit (e.g., second cleaning brush) may be transferred to a non-contact-type cleaning unit (e.g., second cleaning brush) described later by a typical transfer arm. The transfer arm may be provided to reciprocate between the second contact-type cleaning unit and the non-contact-type cleaning unit 500, and thus may transfer the substrate 10 cleaned in the second contact-type cleaning unit to the non-contact-type cleaning unit 500. For reference, while different substrates 10 are being simultaneously cleaned in the second contact-type cleaning unit and the non-contact-type cleaning unit, respectively, the transfer arm may temporarily stand by on an avoidance region provided between the second contact-type cleaning unit and the non-contact-type cleaning unit.

The non-contact-type cleaning unit 500 may physically make non-contact with the surface of the substrate 10, and may be provided in various structures that can perform cleaning. Hereinafter, a configuration in which the non-contact-type cleaning unit 500 includes a first non-contact-type cleaning unit 502 and a second non-contact-type cleaning unit 504 will be described. According to circumstances, the non-contact-type cleaning unit may include only one cleaning unit.

Blocking units 502 and 504 may be provided to block a cleaning processing space of the non-contact-type cleaning unit 500 from other spaces while cleaning is being performed in the non-contact-type cleaning unit 500. Here, the cleaning processing space of the non-contact-type cleaning unit 500 may be construed as a space where cleaning is performed by the non-contact-type cleaning unit 500, and may be provided in a chamber structure independently sealed by the blocking units 502 and 504.

The blocking units 502 and 504 may be provided in various structures that can provide an independent sealed space blocked from the outside. Hereinafter, a configuration in which the blocking unit 502 or 504 includes a casing 502a or 504a disposed to surround the substrate 10 and providing an independent cleaning processing space and an opening/closing member 502b or 504b opening and closing the inlet of the casing 502a or 504a will be described with reference to the accompanying drawings. (see FIG. 20)

In one embodiment, the casing 502a or 504a may be provided in a substantially rectangular parallelepiped shape having an inlet formed at a side wall portion thereof. The opening/closing member 502b or 504b may be configured to be vertically moved in a straight-line by a typical driving part (e.g., combination of motor and power transmission member) and thus open and close the inlet of the casing 502a or 504a.

In addition, the non-contact-type cleaning unit 500 may include a cradle 520 and a recovery container 530. The cradle 520 may allow the substrate 10 to be placed thereon one by one, and may rotate about the center of the shaft 521 inside the casing 402a. The recovery container 530 may surround the circumference of the cradle 520, and may collect a processing fluid scattering from the surface of the substrate 10.

Referring to FIGS. 21 to 24, the cradle 520 may be provided to be movable in a vertical direction, and a plurality of recover cups 532 to 538 forming a plurality of recovery ducts for collecting different processing fluids at different heights along the vertical direction may be disposed on the inner wall of the recovery container 530. Hereinafter, a configuration in which the recovery container 530 includes four recovery cups 532 to 538 independently forming four recovery ducts, respectively, will be described. According to circumstances, the recovery container may be configured to include three or less or five or more recovery cups.

In this structure, since the substrate 10 can be cleaned by various methods using different types of chemicals and/or fluids by varying the height of the cradle 520 in a single processing space, the removal effect of foreign substances remaining on the substrate can be improved.

A spraying part described later may be disposed over the upper portion of the cradle 520. The spraying part may spray chemicals, fluids, heterogeneity fluids, and steam onto the top surface of the substrate 10. The processing fluids (fluids used for the cleaning processing of the substrate surface) scattering from the surface of the substrate 10 may be collected in different recovery cups 532 to 538 according to the height of the cradle 520. In addition, a drainage passage may be individually connected to the recovery cups 532 to 538 to discharge the processing fluids that are collected.

The non-contact-type cleaning unit 500 may be configured to perform cleaning by various methods in accordance with the required conditions and design specifications.

Figure 21:
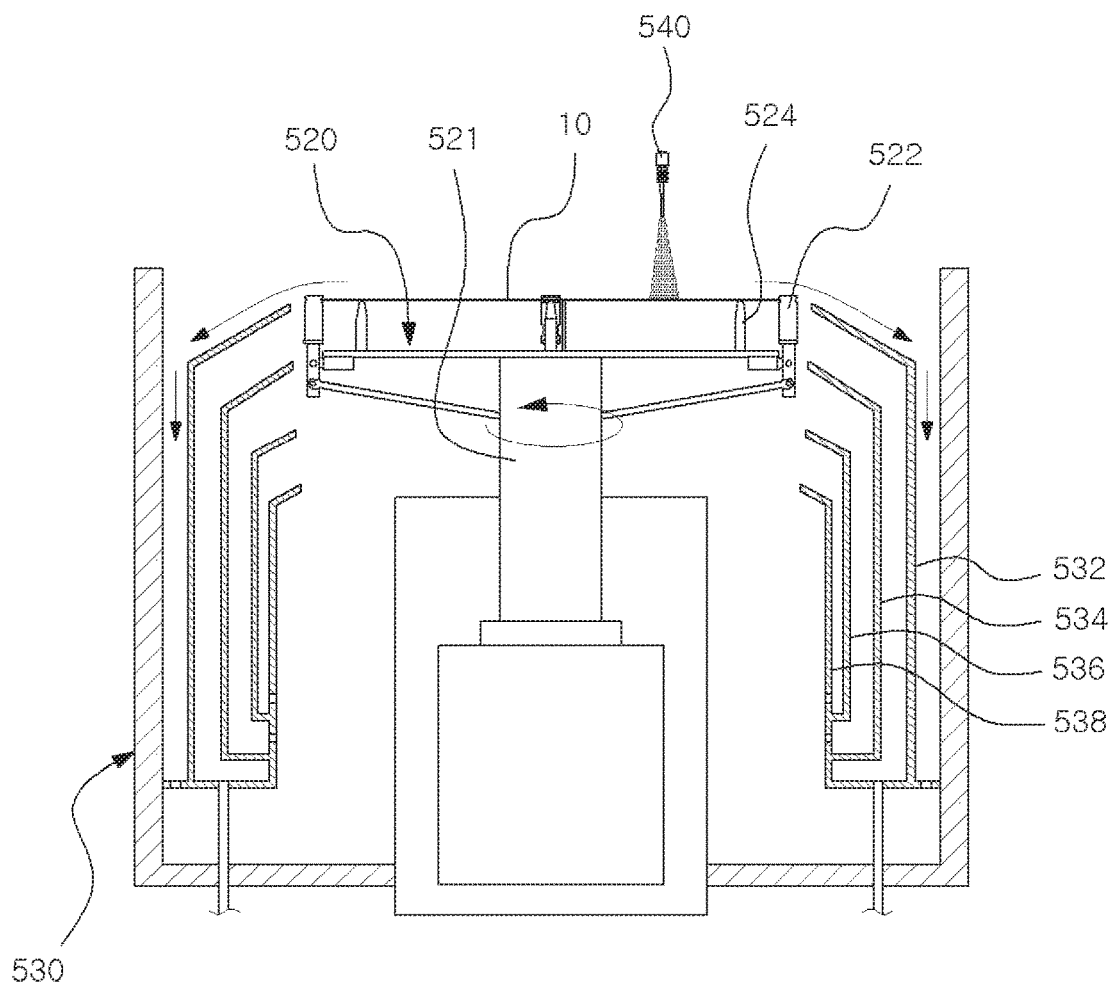
FIGS. 21 to 24 are views illustrating structures and operational structures of a cradle and a recovery container of non-contact-type cleaning unit in the substrate processing system according to an embodiment of the present invention.

Referring to FIG. 21, the non-contact-type cleaning unit 500 may include a chemical spraying part 540 that can spray at least one type of chemical onto the surface of the substrate 10.

In this embodiment, since the cleaning processing space of the non-contact-type cleaning unit 500 is independently provided as a sealed chamber structure, a chemical may be used as a cleaning liquid.

A typical nozzle that can spray chemicals may be used as the chemical spraying part 540, and the present invention is not limited by the type and characteristics of the nozzle. A nozzle that can uniformly spray a chemical onto the surface at a high pressure may be used.

The chemical spraying part 540 may be configured to spray various chemicals onto the surface of the substrate 10 in accordance with the required conditions and the design specifications. The chemical spraying part 540 of the non-contact-type cleaning unit 500 may spray at least one of ozone hydrofluoric acid (O3HF) and hydrofluoric acid (HF) which are effective to remove organic matters. According to circumstances, the chemical spraying part 540 of the non-contact-type cleaning unit 500 may also spray other chemicals such as Standard Clean-1 (SC1, APM), ammonia, and hydrogen peroxide.

Also, the chemical spraying part 540 of the non-contact-type cleaning unit 500 may be disposed to oscillate with respect to the surface of the substrate 10 equally or similarly to the chemical spraying part 540 disposed in the pre-cleaning region P1, and thus may oscillation-spray a chemical onto the surface of the substrate 10. (see FIG. 7)

For reference, the disposition condition (height) of the cradle 520 may be variously modified in accordance with the required conditions and the design specifications. In one embodiment, when a chemical is sprayed from the chemical spraying part 540 of the non-contact-type cleaning unit 500, the cradle 520 may be disposed at the uppermost location, and a processing fluid (chemical) scattering from the substrate 10 may be collected by the first recovery cup 532.

Figure 22:
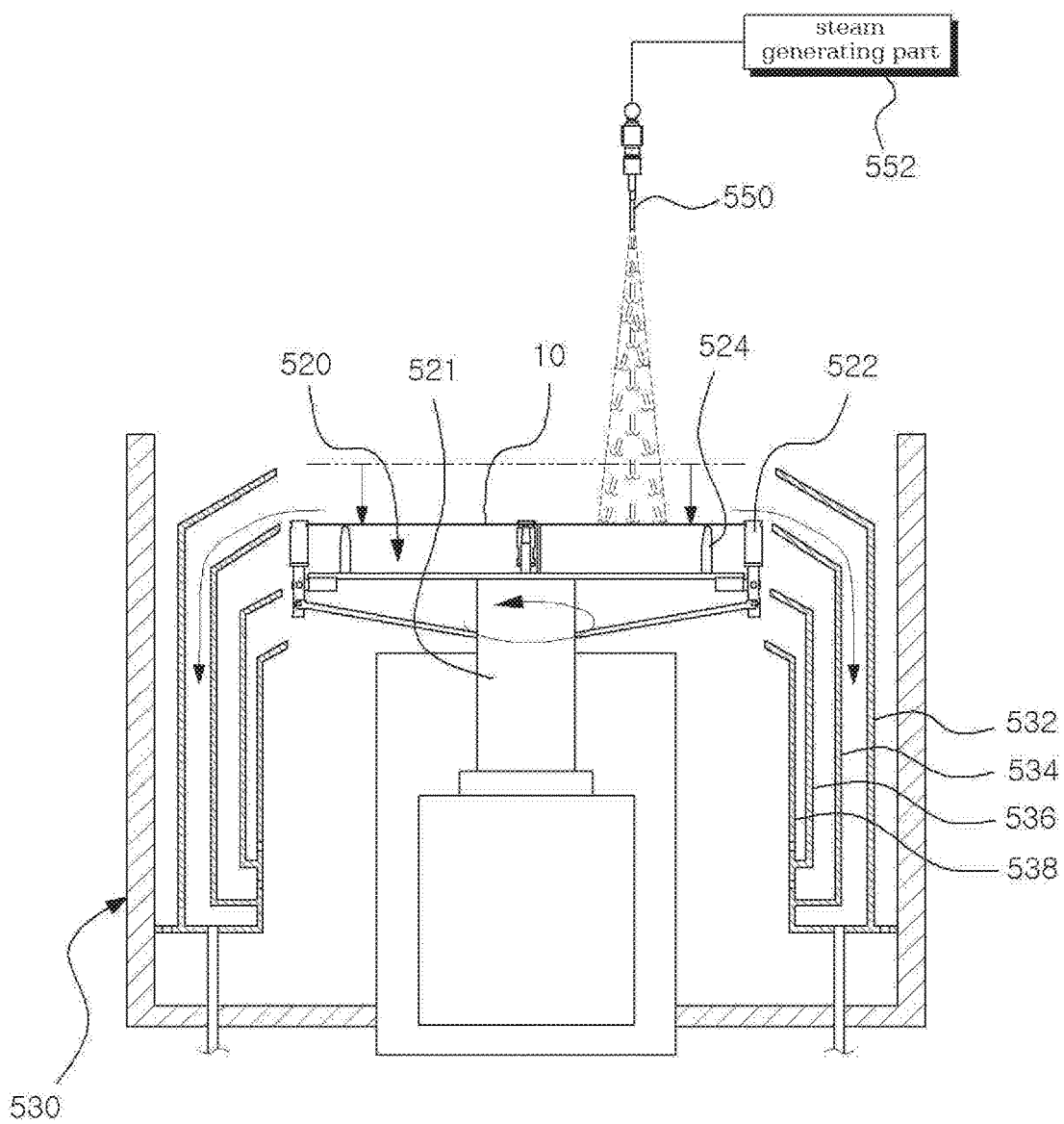

Referring to FIG. 22, the non-contact-type cleaning unit 500 may include a steam spraying part 550 that sprays steam onto the surface of the substrate 10.

Particularly, the steam sprayed from the steam spraying part 550 may be effective to remove organic matters existing on the surface of the substrate 10. For reference, the steam spraying part 550 may be configured to spray steam at a temperature capable of preventing damage of the substrate 10 while securing the organic matter removal efficiency by steam. The steam spraying part 550 may spray steam at a temperature of about 60 degrees to about 120 degrees.

In one embodiment, when steam is sprayed from the steam spraying part 550 of the non-contact-type cleaning unit 500, the cradle 520 may be disposed at the first location just under the uppermost end, and a processing fluid scattering from the substrate 10 may be collected by the second recovery cup 534.

Also, the non-contact-type cleaning unit 500 may include a cleaning liquid spraying part (not shown) that sprays a cleaning liquid onto the surface of the substrate 10.

The cleaning liquid spraying part may be configured to spray various cleaning liquids onto the surface of the substrate 10 in accordance with required conditions. In one embodiment, the cleaning liquid spraying part may be configured to spray a cleaning liquid such as pure water (DIW). According to circumstances, a process of spraying pure water after a chemical is sprayed may also be repeatedly performed.

Also, the non-contact-type cleaning unit 500 may include a heterogeneity fluid spraying part (not shown) that sprays different heterogeneity fluids onto the surface of the substrate 10.

The heterogeneity fluid spraying part may be provided in various structures that can spray heterogeneity fluids. In one embodiment, the heterogeneity fluid spraying part may include a first fluid supply unit supplying a first fluid and a second fluid supply unit supplying a second fluid different from the first fluid. The first fluid and the second fluid may be sprayed onto the surface of the substrate by a spray member such as a typical nozzle while being mixed with each other or being separated from each other.

For example, the heterogeneity fluid spraying part may include a first fluid spraying nozzle and a second fluid spraying nozzle which are separately disposed. The first fluid spraying nozzle and the second fluid spraying nozzle may independently spray the first fluid and the second fluid onto the surface of the substrate 10, respectively. (see FIG. 5)

In another embodiment of the heterogeneity fluid spraying part, the heterogeneity fluid spraying part may include a first fluid passage for supplying the first fluid, a second fluid passage for supplying the second fluid, and a mixture spray passage from which the first fluid and the second fluid are fixed and sprayed. The first fluid and the second fluid may be sprayed at a high speed onto the surface of the substrate 10 while being mixed with each other in the mixture spray passage. (see FIG. 6)

The types and characteristics of the heterogeneity fluids that can be sprayed from the heterogeneity fluid spraying part may be variously modified in accordance with the required conditions and design specifications. In one embodiment, the first fluid may be any one of gases and liquids, and the second fluid may be any one of gases and liquids. For example, the heterogeneity fluid spraying part may be configured to spray both of pure water (DIW) that is a liquid and nitrogen (N2) that is a gas, so as to the foreign substance removal efficiency. According to circumstances, two different types of liquids or two different types of gases may be used as long as the hitting force and the foreign substance removal efficiency by the heterogeneity fluids can be secured.

Similarly to the chemical spraying part 540, at least one of the cleaning liquid spraying part, the steam spraying part and the heterogeneity fluid spraying part may be provided so as to oscillate with respect to the surface of the substrate 10, and thus may oscillation-spray a cleaning liquid, steam and heterogeneity fluids onto the surface of the substrate 10. (see FIG. 7)

Figure 23:
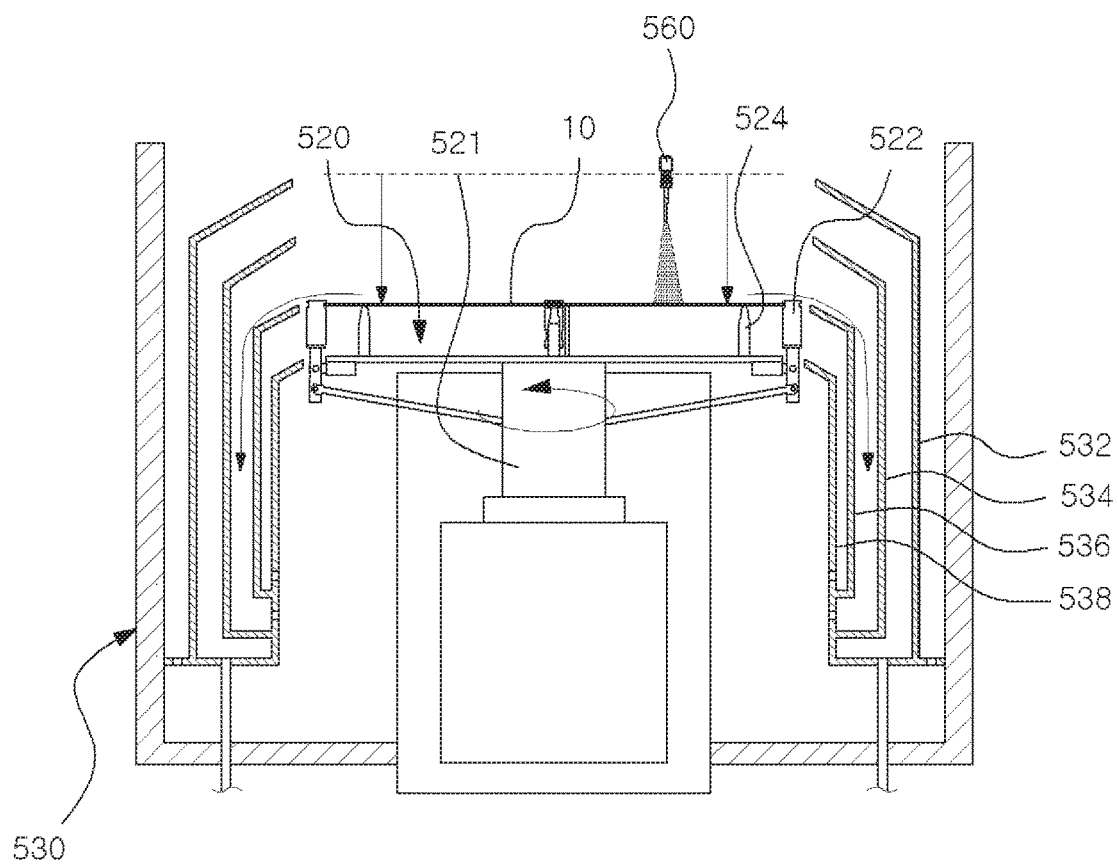

Also, referring to FIG. 23, the non-contact-type cleaning unit 500 may include a heterogeneity fluid spraying part 560 that sprays different heterogeneity fluids onto the surface of the substrate 10. The heterogeneity fluid spraying part 560 may include a dry ice supply unit that supplies dry ice particles, and a fluid spraying unit that sprays a fluid onto the surface of the substrate 10.

The fluid spraying unit may be configured to spray various fluids in accordance with the required conditions and design specifications. In one embodiment, the fluid spraying unit may be configured to spray at least one of gases and liquids. Hereinafter, a configuration in which the heterogeneity fluid spraying part 560 sprays a gas together with dry ice particles will be described. According to circumstances, the heterogeneity fluid spraying part may also be configured to spray a liquid (e.g., DIW) together with dry ice particles.

Figure 24:
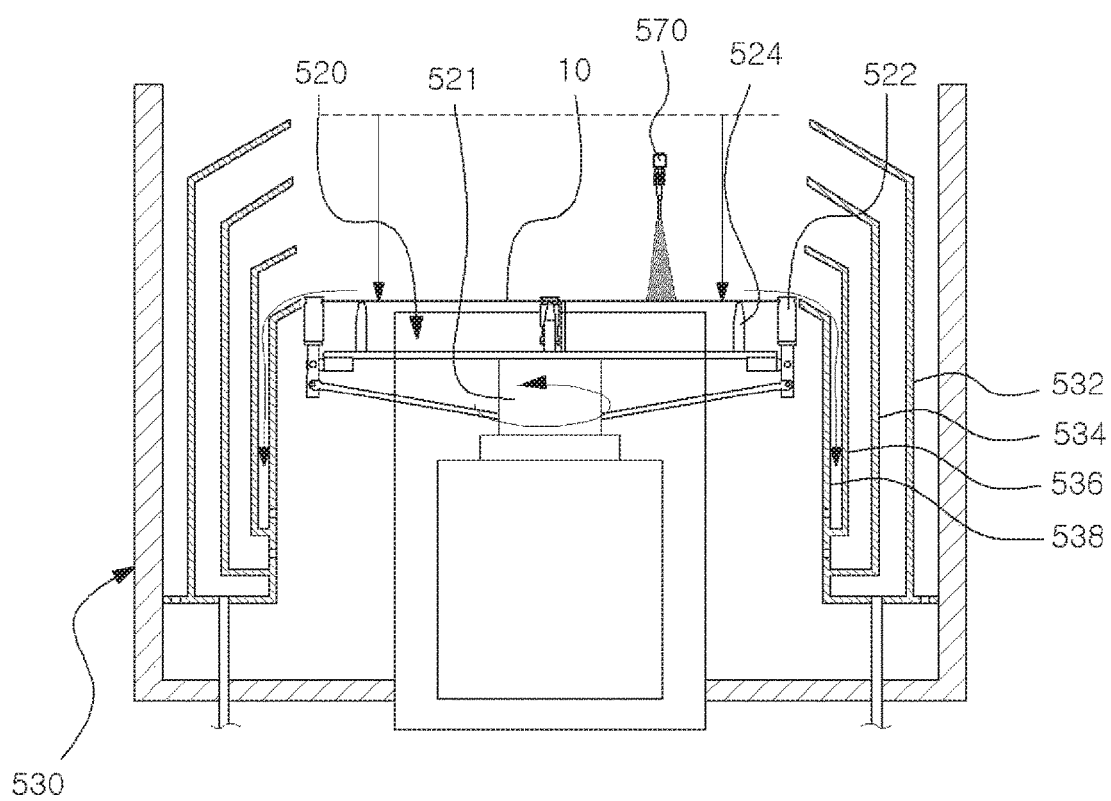

Also, referring to FIG. 24, the non-contact-type cleaning unit 500 may include an isopropyl alcohol (IPA) spraying part 570 that sprays isopropyl alcohol onto the surface of the substrate 10.

The isopropyl alcohol spraying part 570 may spray isopropyl alcohol onto the surface of the substrate 10, and isopropyl alcohol may be dried on the surface of the substrate 10. Thus, the cleaning process of the substrate 10 may be finished.

In addition, the substrate 10 cleaned in the first non-contact-type cleaning unit 502 may be transferred to the second non-contact-type cleaning unit 504 by a typical transfer arm. The transfer arm may be provided to reciprocate between the first non-contact-type cleaning unit 502 and the second non-contact-type cleaning unit 504, and thus may transfer the substrate 10 cleaned in the first non-contact-type cleaning unit 502 to the second non-contact-type cleaning unit 504. For reference, while different substrates 10 are being simultaneously cleaned in the first contact-type cleaning unit 502 and the second contact-type cleaning unit 504, respectively, the transfer arm may temporarily stand by on an avoidance region provided between the first contact-type cleaning unit 502 and the second contact-type cleaning unit 504.

In this embodiment, although the non-contact-type cleaning unit (or contact-type cleaning unit) is described as being arranged on a single layer, according to circumstances, the non-contact-type cleaning unit may be provided in a multi-layered structure.

Figure 25:
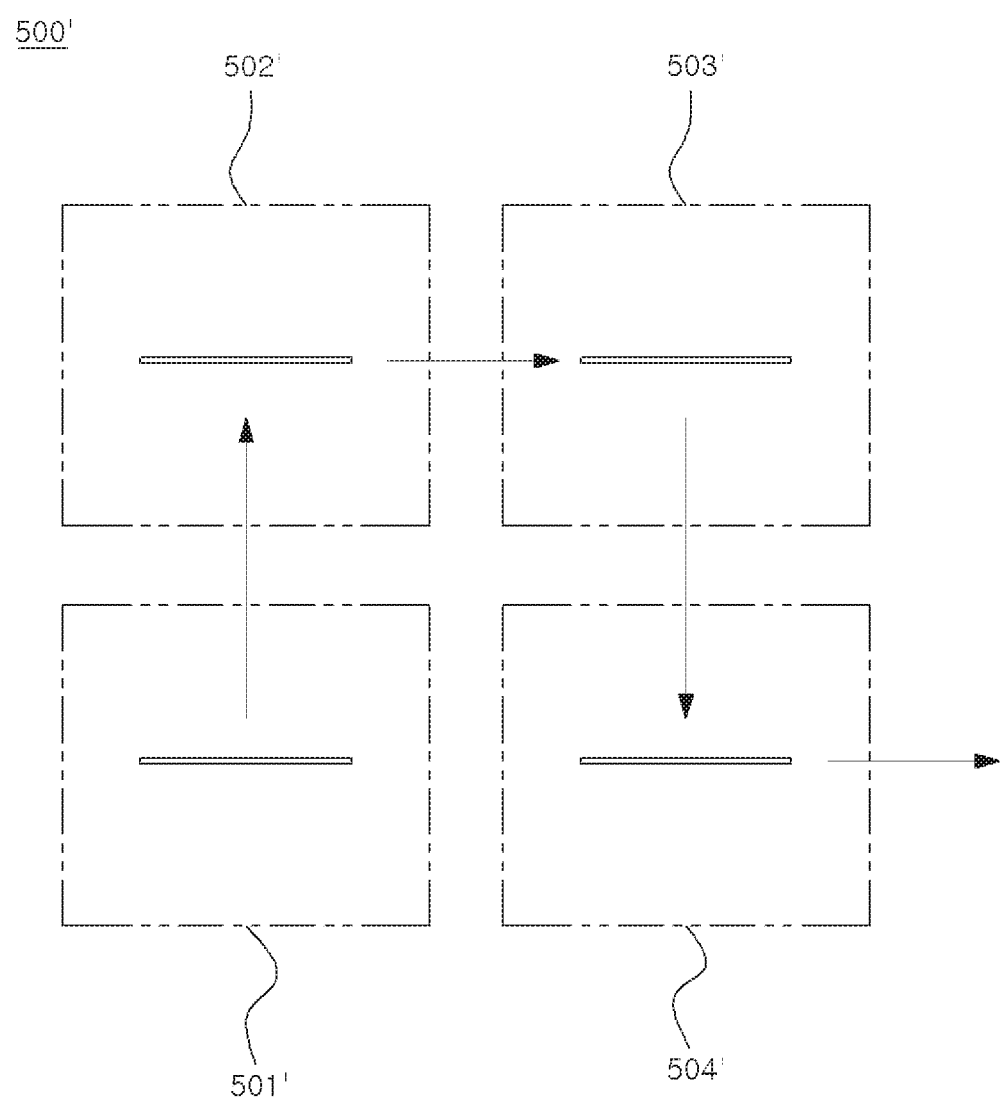
FIG. 25 is a view illustrating another exemplary non-contact-type cleaning unit in a substrate processing system according to an embodiment of the present invention.

Referring to FIG. 25, a non-contact-type cleaning unit 500' may be provided in a two-layered structure, and may include a plurality of blocking units 501' to 504' providing independently sealed processing spaces. The substrate 10 may be cleaned while moving to the plurality of blocking units 501' to 504' along a predetermined path. According to circumstances, the non-contact-type cleaning unit may be provided in a three or more-layered structure, and the present invention is not limited by the disposition structure and method of the blocking unit.

The substrate transferring part 610 may transfer the substrate 10 to the cleaning part 300 before the substrate 10 is polished in the polishing part 100. In other words, the substrate transferring part 610 may first transfer the substrate 10 to the cleaning part 300 before the substrate 10 to be polished is transferred to the polishing part 100.

In one embodiment, a typical robot arm may be used as the substrate transferring part 610, and the type and structure of the substrate transferring part 610 may be variously modified in accordance with the required conditions and the design specifications.

Generally, the substrate 10 may be immediately transferred to and polished in the polishing part 100, and then may be cleaned in the cleaning part 300. However, when the polishing process is performed in a state where foreign substances exist on the surface of the substrate 10, the surface of the substrate 10 may be scratched by foreign substances during the polishing process.

Accordingly, in this embodiment, the substrate 10 may go through preparatory cleaning to prevent damage of the substrate 10 before the polishing process is performed on the substrate 10, and the preparatory cleaning of the substrate 10 may be performed in the cleaning part that 300 is prepared in advance. Thus, since separate equipment and space for the preparatory cleaning of the substrate 10 are not prepared, the layout of existing equipment may be almost maintained without a change or addition. Also, damage (e.g., scratch) of substrate 10 due to foreign substances existing on the surface of the substrate 10 can be minimized during the polishing process.

In addition, the substrate 10 having undergone the preparatory cleaning in the cleaning part 300 may be again withdrawn by the substrate transferring part 610, and then may be transferred to the polishing part 100 by another transfer unit.

The substrate 10 entering the cleaning part 300 before the polishing process may be preparatorily cleaned along various preparatory cleaning paths (e.g., PC1, PC2, PC3 and PC4 of FIGS. 26 to 29) that are defined in the cleaning part 300. Here, the preparatory cleaning path of the substrate 10 may be construed as an order in which the substrate 10 is cleaned before the polishing process is performed or a path along which the substrate 10 is transferred while being cleaned.

More specifically, the substrate 10 may be configured to be cleaned along the cleaning path passing through at least one of the plurality of cleaning units 402, 404, 502 and 504 in the cleaning part 300. In order to minimize the moving path of the substrate 10 and shorten the preparatory cleaning time of the substrate 10, the substrate transferring part 610 may transfer the substrate 10 to one of the plurality of cleaning units 402, 404, 502 and 504 constituting the cleaning part 300, which is most adjacent to the substrate transferring part 610.

In addition, at least one of the plurality of cleaning units 402, 404, 502 and 504 which is predetermined may be skipped in the preparatory cleaning path of the substrate 10. In other words, all of the cleaning units 402, 404, 502 and 504 may be used for the preparatory cleaning of the substrate 10, but only a portion of the cleaning units 402, 404, 502 and 504 may also be used for the preparatory cleaning of the substrate 10.

Figure 26:
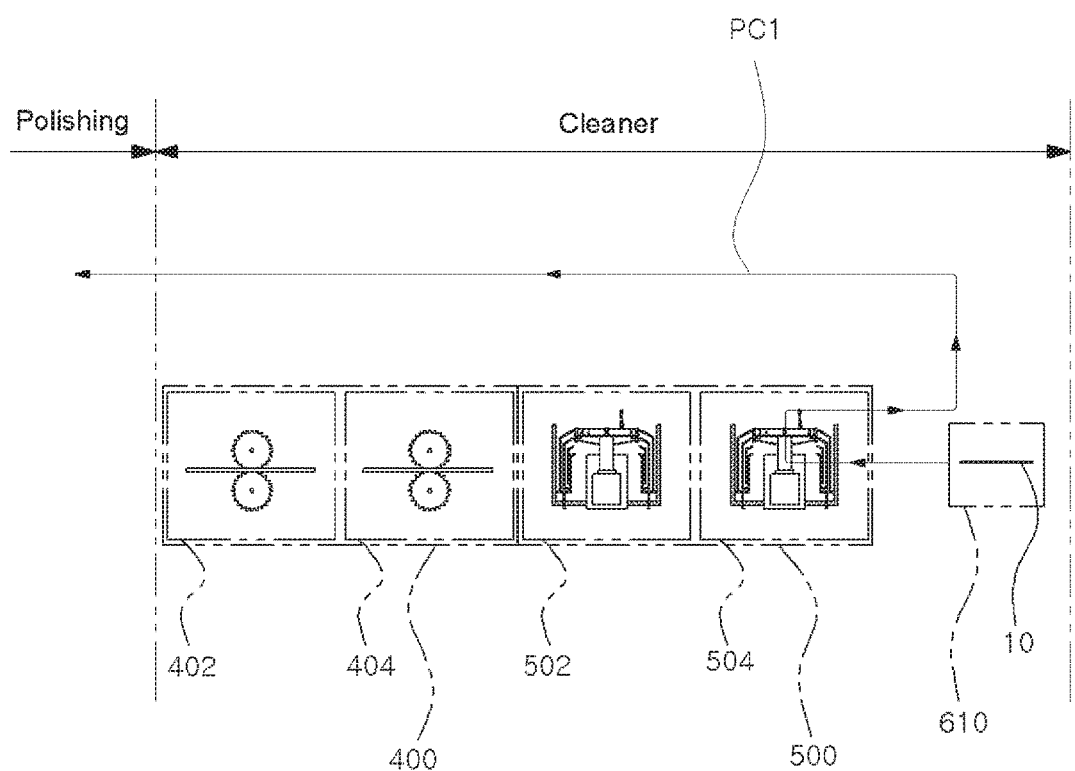
FIGS. 26 to 29 are views illustrating a preliminary cleaning process of a substrate in a substrate processing system according to an embodiment of the present invention.

In one embodiment, referring to FIG. 26, the substrate 10 may be transferred to and polished in the polishing part 100 after cleaned along the preparatory cleaning path PC1 passing through the second non-contact-type cleaning unit 504 most adjacent to the substrate transferring part 610.

Figure 27:
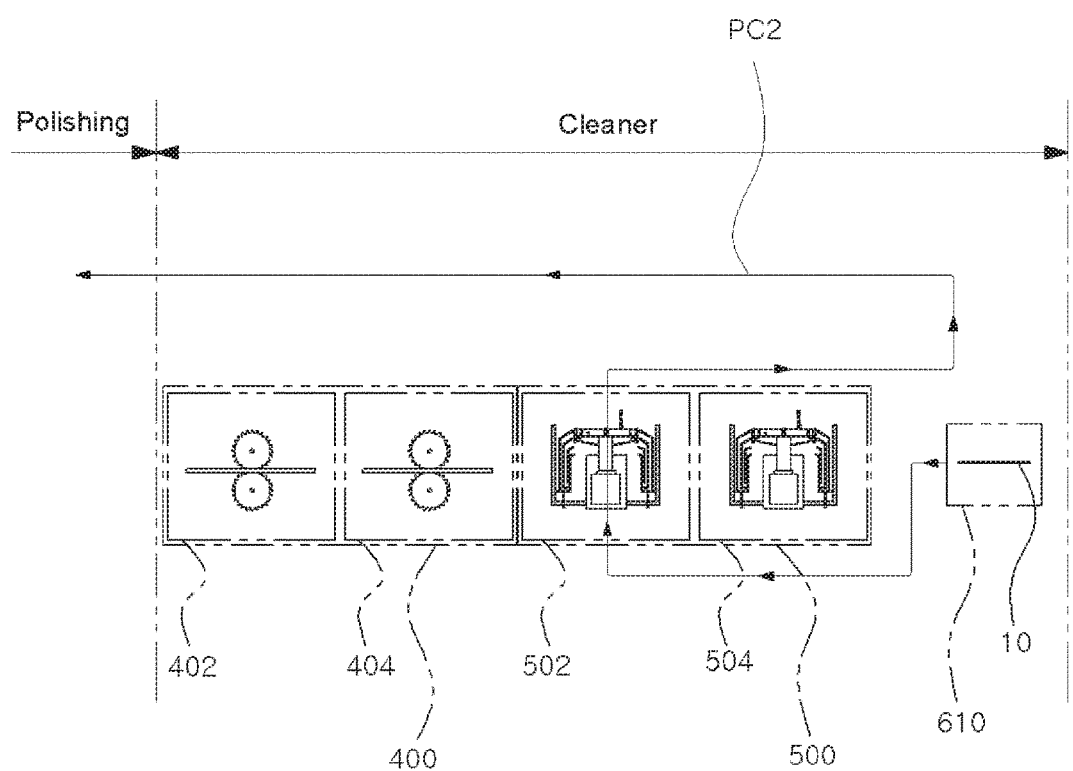

In another embodiment, referring to FIG. 27, the substrate 10 may be transferred to and polished in the polishing part 100 after cleaned along the preparatory cleaning path PC2 passing through the first non-contact-type cleaning unit 502.

Also, the preparatory cleaning path of the substrate 10 may go through both at least one of the plurality of contact-type cleaning units 402 and 404 and at least one of the plurality of non-contact-type cleaning units 502 and 504 in order to improve the cleaning efficiency of the substrate 10.

Figure 28:
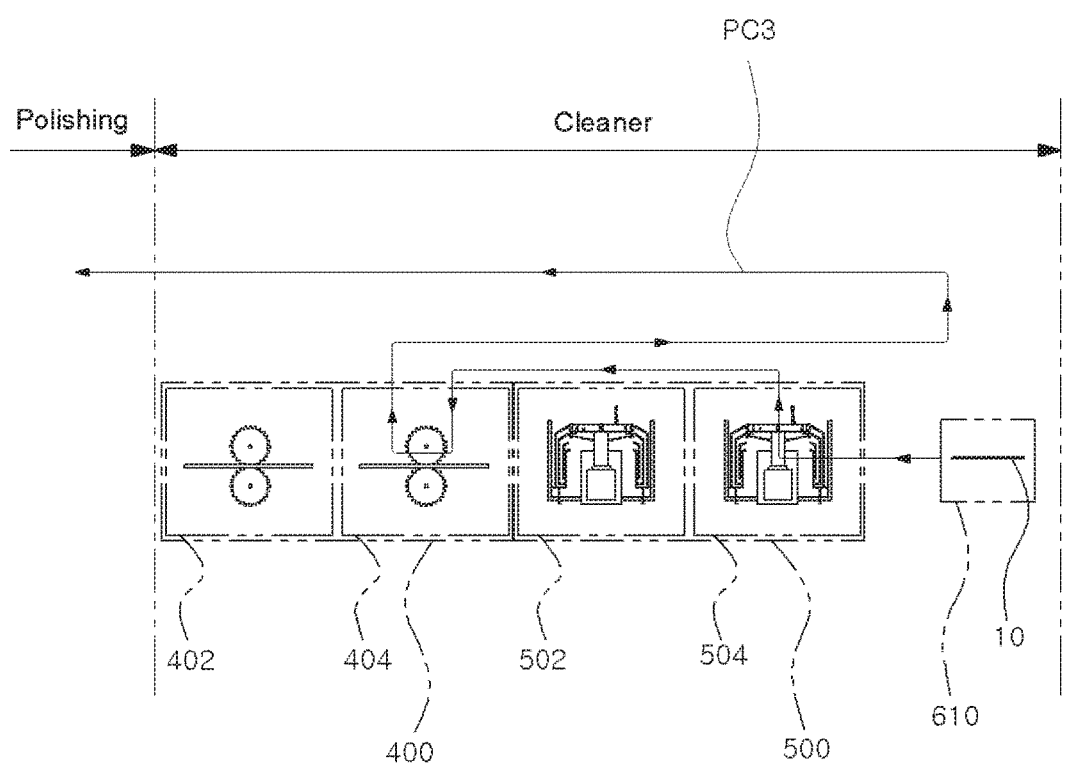

In one embodiment, referring to FIG. 28, the substrate 10 may be transferred to and polished in the polishing part 100 after cleaned along the preparatory cleaning path PC3 sequentially passing through the second non-contact-type cleaning unit 504 and the second contact-type cleaning unit 404.

Figure 29:
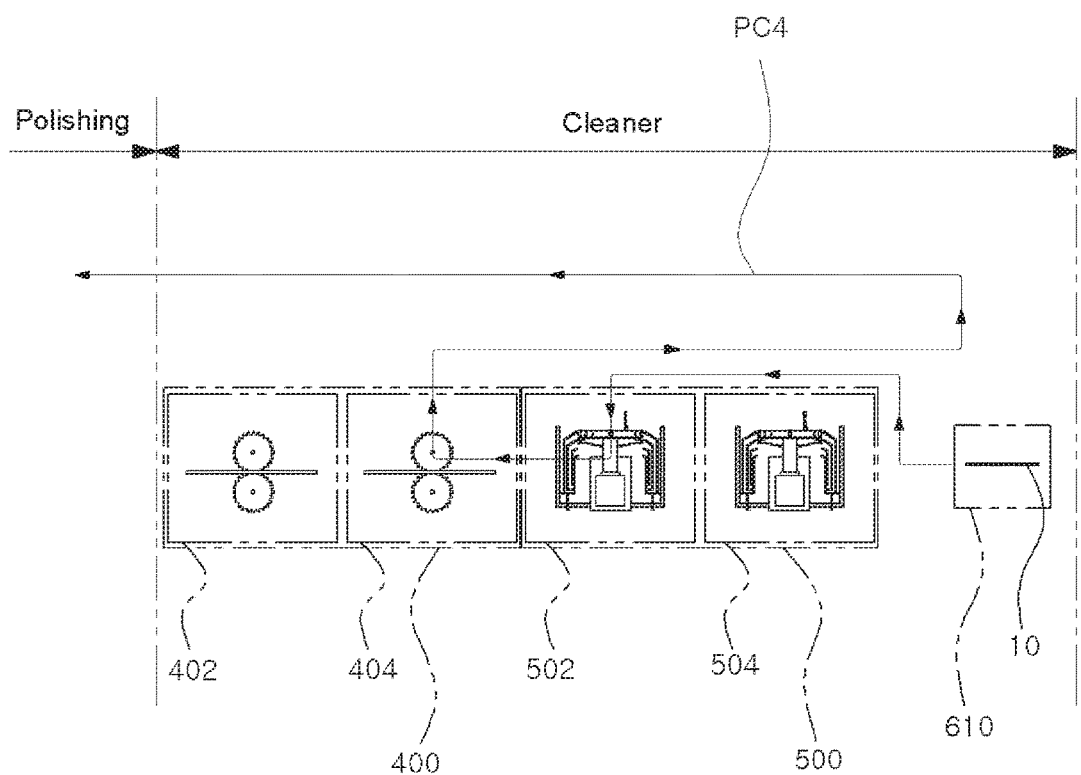

In another embodiment, referring to FIG. 29, the substrate 10 may be transferred to and polished in the polishing part 100 after cleaned along the preparatory cleaning path PC4 sequentially passing through the first non-contact-type cleaning unit 502 and the second contact-type cleaning unit 404.

In this embodiment, although the preparatory cleaning path of the substrate 10 is described as configured in a forward direction (non-contact-type cleaning unit to contact-type cleaning unit), according to circumstances, the preparatory cleaning path of the substrate 10 may be configured in a backward direction (contact-type cleaning unit to noncontact-type cleaning unit). For example, the substrate 10 may be first cleaned in the first contact-type cleaning unit (or second contact-type cleaning unit). Thereafter, the substrate 10 may be cleaned in the first non-contact-type cleaning unit (or second non-contact-type cleaning unit), and then may be transferred to the polishing part.

Meanwhile, in this embodiment, although the pre-cleaning region is described as being simply provided in an independently sealed chamber structure, according to circumstances, a blocking unit may be provided to selectively block the polishing part and the cleaning part.

The blocking unit may be provided in various structures that can selectively block the polishing part and the cleaning part, and the present invention is not limited by the type and structure of the blocking unit. In one embodiment, the blocking unit may be implemented in a typical left-to-right sliding opening/closing method or up-and-down shutter method.

This structure may keep the cleaning part cleaner by fundamentally blocking polishing substances and foreign substances generated in the polishing part from being introduced to the cleaning part. That is, much more foreign substances may be generated in the polishing part compared to the cleaning part, and foreign substances generated in the polishing part and introduced into the cleaning part may cause a cleaning failure or cleaning deterioration. Thus, the blocking unit may improve the cleaning efficiency of the cleaning process performed in the cleaning part, by wholly blocking a boundary of the polishing part and the cleaning part, and thus by blocking polishing substances and foreign substances generated in the polishing part from being introduced to the cleaning part.

Figure 30:
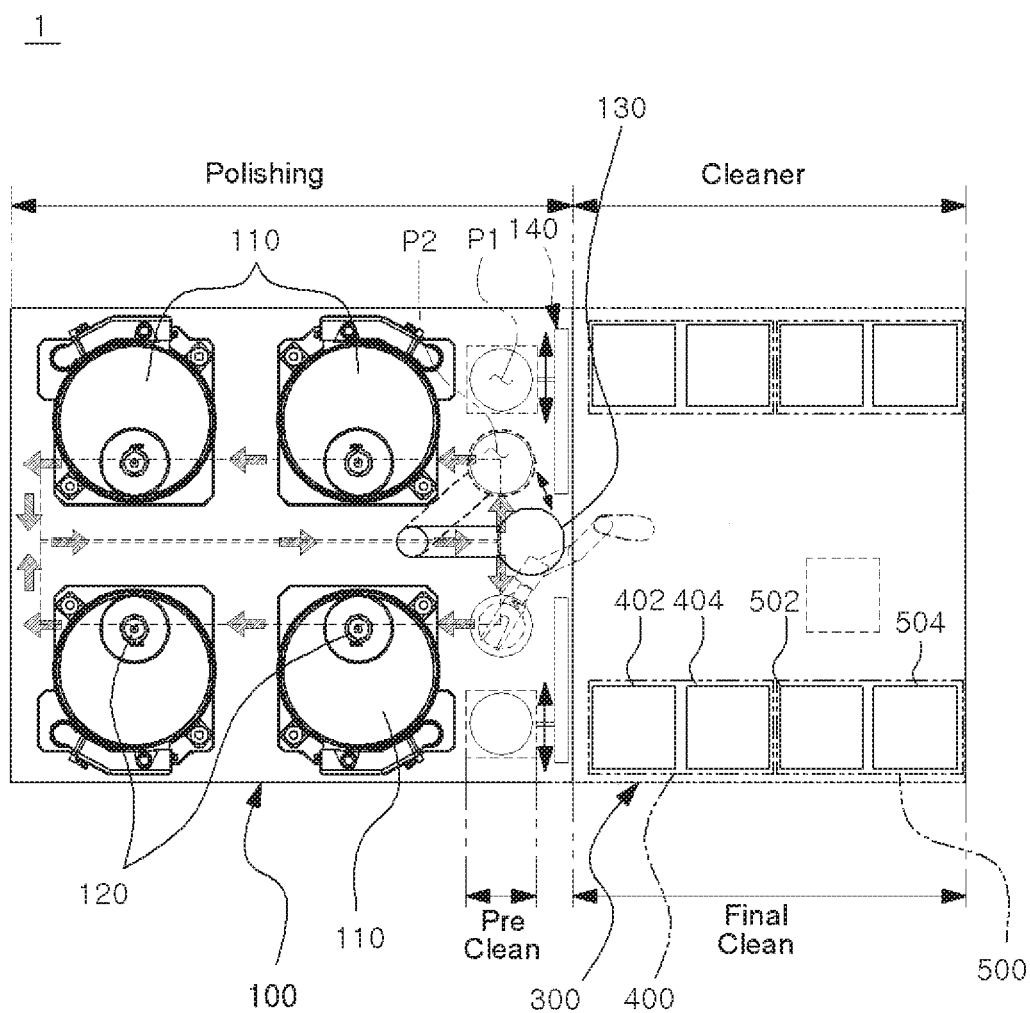
FIG. 30 is a view illustrating a substrate processing system according to another embodiment of the present invention.
Figure 31:
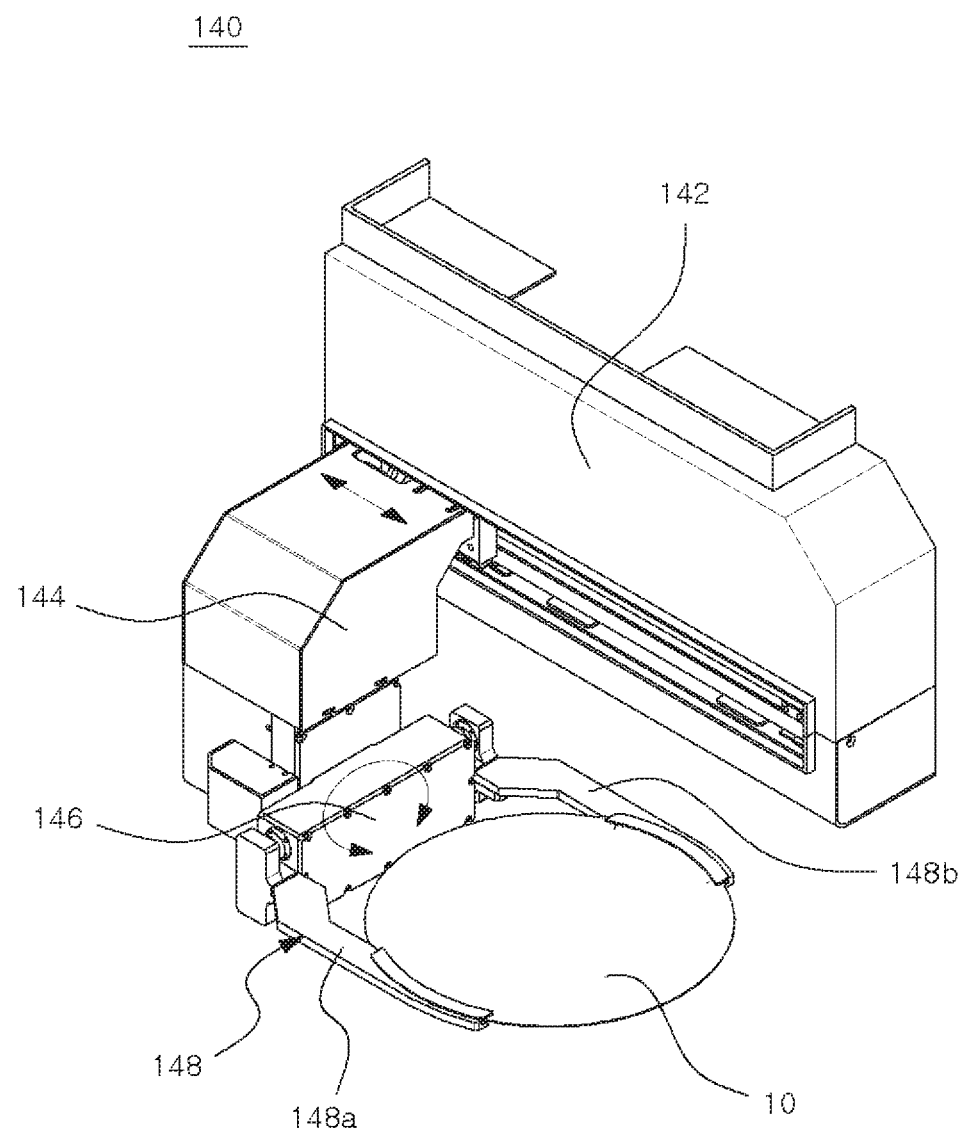
FIGS. 31 to 32 are views illustrating an inverting unit of FIG. 30.
Figure 32:
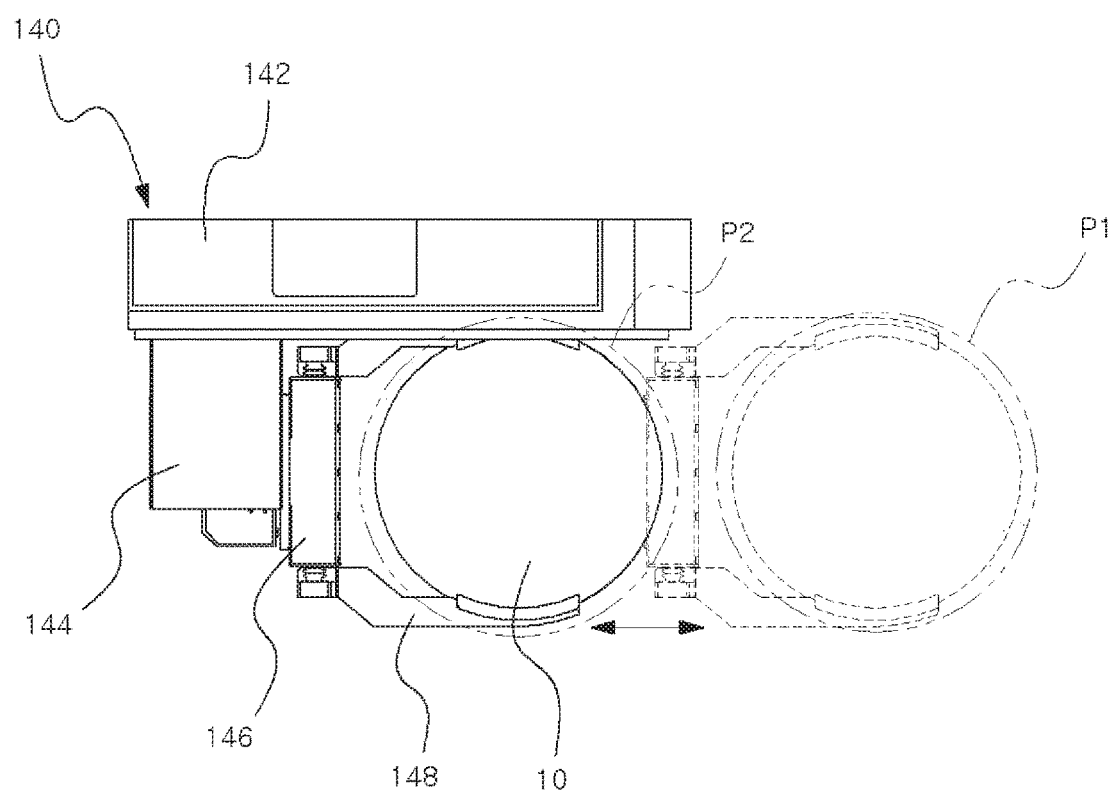

FIG. 30 is a view illustrating a substrate processing system according to another embodiment of the present invention. FIGS. 31 to 32 are views illustrating an inverting unit of FIG. 30. For parts equivalent to and similar to the configurations described above, the same reference numerals will be assigned, and detailed descriptions thereof will be omitted.

Referring to FIGS. 30 to 32, the substrate processing system 1 according to another embodiment may include an inverting unit 140. The inverting unit 140 may be disposed to be movable from a loading region P2, to which a substrate 10 provided in the polishing part (see 100 of FIG. 2) is loaded, to a pre-cleaning region P1. The inverting unit 140 may receive the substrate 10 from the loading region P2, and may transfer the substrate 10 to the pre-cleaning region P1. The substrate 10 may be pre-cleaned in the pre-cleaning region P1 while being supported by the inverting unit 140.

The inverting unit 140 may invert the polishing surface of the substrate 10 in an opposite direction before the substrate 10 having undergone the chemical mechanical polishing process is supplied to the cleaning part 300.

For reference, the polishing surface of the substrate 10 may mean a surface (undersurface or top surface) of the substrate 10 which makes contact with the polishing pad (see 110 of FIG. 2) to be polished. Substantially, during the chemical mechanical polishing process, the polishing surface (e.g., undersurface of the substrate) of the substrate 10 may be disposed to face downward, and the inverting unit 140 may invert the substrate 10 180 degrees such that the polishing surface of the substrate 10 faces upward.

Specifically, the inverting unit 140 may include an operation assembly 144 moving from the loading region P2 to the pre-cleaning region P1, a rotation assembly 146 invertibly connected to the operation assembly 144, and a grip assembly 148 connected to the rotation assembly 146 and gripping the substrate 10.

The operation assembly 144 may be provided to be movable from the loading region P2 to which the substrate 10 is loaded to the pre-cleaning region P1 from which the substrate 10 is unloaded in the polishing part 100.

The loading region P2 of the substrate 10 may be variously modified in accordance with the required conditions and the design specifications. In order to shorten the moving path of the carrier head 120, the loading region P2 may be provided on the moving path (e.g., circulation path) of the transfer unit (e.g., carrier head).

That is, when the pre-cleaning region of the substrate is provided at an outer side of the moving path of the carrier head, the carrier head needs to move along the moving path, and then needs to move again to the pre-cleaning region of the substrate provided at the outer side of the moving path. In this case, the moving path of the carrier head may inevitably increase. However, in a structure where the substrate 10 is gripped by the inverting unit 140 at the loading region P2 of the substrate 10, since the carrier head 120 need not move to the pre-cleaning region P1 and may move only along the moving path, the moving path of the carrier head 120 can be minimized.

The operation assembly 144 may be provided to move toward and away from the pre-cleaning region P1 by various methods in accordance with the required conditions and the design specifications. In one embodiment, the operation assembly 144 may be provided to straightly move from the loading region P2 to the pre-cleaning region P1 (or from the pre-cleaning region to the loading region). According to circumstances, the operation assembly may be configured to move from the loading region to the pre-cleaning region while rotating on the basis of a certain point.

The operation assembly 144 may be configured to move from the loading region P2 to the pre-cleaning region P1 by a driving force of a driving assembly 142. In one embodiment, the operation assembly 144 may straightly move from the loading region P2 to the pre-cleaning region P1 by a driving force of the driving assembly 142.

A typical drive unit that can provide a driving force may be used as the driving assembly 142, and the present invention is not limited by the type and characteristics of the driving assembly 142. In one embodiment, a typical linear motor may be used as the driving assembly 142. According to circumstances, the driving assembly may be configured with a combination (e.g., combination of a gear or a belt) of a typical motor and power transmission member), or may be configured with a screw member.

The grip assembly 146 may be configured to be connected to the operation assembly 144 and selectively grip the substrate 10. The grip assembly 146 may selectively move to the loading region P2 or the pre-cleaning region P1 by the operation assembly 144. The grip assembly 146 may escape to the pre-cleaning region P1 deviating from the moving path of the carrier head 120 during the chemical mechanical polishing process (or during the loading of the substrate) of the substrate 10, and may approach the loading region P2 only when gripping the substrate 10 having undergone the chemical mechanical polishing process.

Also, the rotation assembly 148 may be rotatably connected to the operation assembly 144, and the grip assembly 146 may be connected to the rotation assembly 148 to be selectively invertible with respect to the operation assembly 144 by the rotation assembly 148.

The rotation assembly 148 may be configured with a typical shaft and drive unit, and the structure and characteristics of the rotation assembly 148 may variously modified in accordance with the required conditions and design specifications. According to circumstances, the grip assembly may also be configured to be fixed onto the operation assembly, and the operation assembly may be configured to invertibly rotate on the driving assembly.

The grip assembly 146 may be provided in various structures that can selectively grip the substrate 10, and the present invention is not limited by the structure and characteristics of the grip assembly 146. In one embodiment, the grip assembly 146 may include a first grip member 442a supporting one side of the substrate 10, and a second grip member 442b facing the first grip member 442a and supporting the other side of the substrate 10.

Also, pre-cleaning in the pre-cleaning region may be performed while the substrate 10 is being supported by the inverting unit 140. In other words, the inverting unit 140 may serve to invert the substrate 10, and simultaneously, may serve as a supporting part for supporting the substrate 10.

Thus, by performing pre-cleaning in the pre-cleaning region while the substrate 10 is being supported by the inverting unit 140, the supporting process for allowing the substrate 10 not to move during the pre-cleaning in the pre-cleaning region can be simplified.

Naturally, it may be possible to support the substrate 10 using a separate supporting unit and perform the pre-cleaning. However, since the substrate 10 is supported during the inverting process of the substrate 10 which is necessarily performed regardless of the pre-cleaning, the process of supporting the substrate 10 can be simplified, and thus the whole process can be reduced.

In one embodiment, the pre-cleaning in the pre-cleaning region may be performed when the substrate 10 is inverted by the inverting unit 140 (when the polishing surface is inverted so as to face upward).

In another embodiment, the pre-cleaning in the pre-cleaning region may be performed when the substrate 10 is disposed upright by the inverting unit 140. Thus, by performing pre-cleaning when the substrate 10 is disposed upright, a cleaning fluid such as a cleaning liquid or a chemical used in the pre-cleaning may not remain on the surface of the substrate 10, and may be more quickly and easily discharged.

According to circumstances, the pre-cleaning may also be performed while the substrate 10 is being supported by the inverting unit 140 before the substrate 10 is inverted by the inverting unit 140 (when the polishing surface of the substrate 10 is disposed to face downward).

In addition, the pre-cleaning while the substrate 10 is being supported by the inverting unit 140 may be defined as a concept including all of a method of spraying a cleaning fluid such as chemicals, pure water (DIW), steam and heterogeneity fluids onto the surface of the substrate 10, a method of allowing the cleaning brush to make rotational contact with the surface of the substrate 10, and a method of supplying vibration energy to the surface of the substrate 10.

Figure 33:
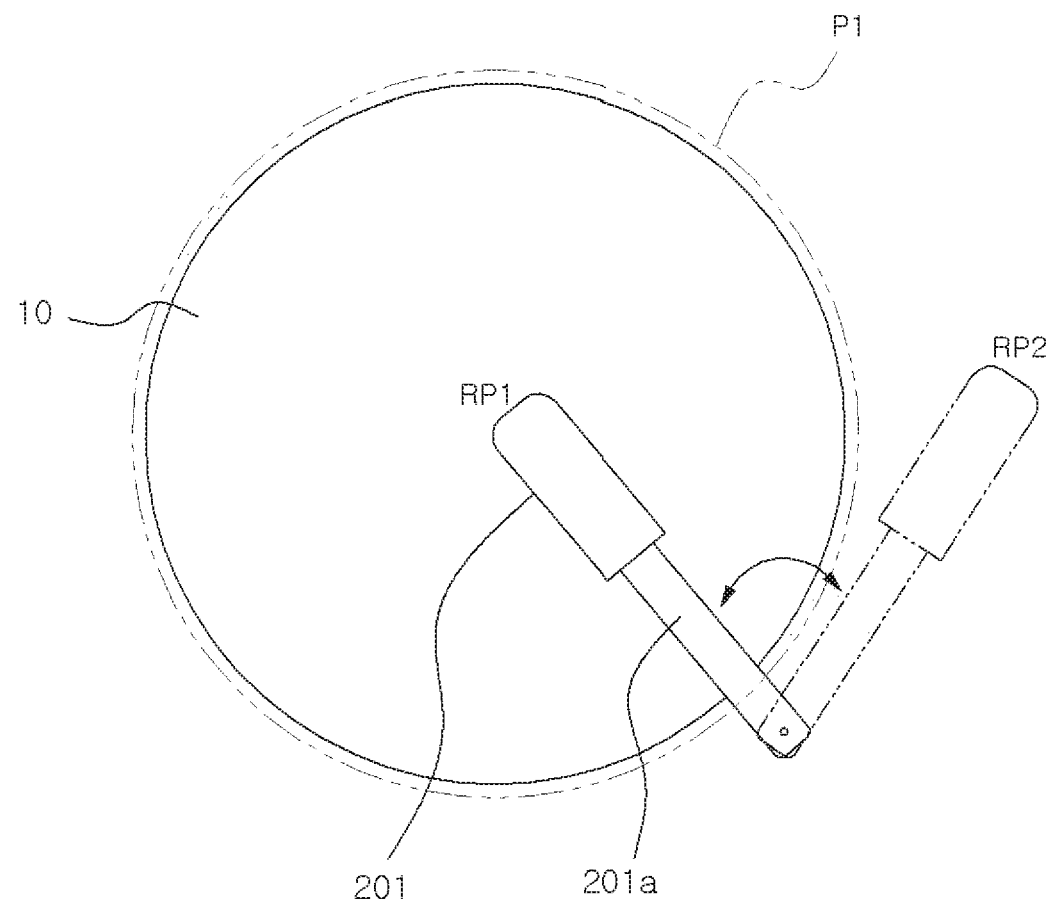
FIG. 33 is a view illustrating a rotation arm applicable to a substrate processing system according to an embodiment of the present invention.

FIG. 33 is a view illustrating a rotation arm applicable to a substrate processing system according to an embodiment of the present invention.

Referring to FIG. 33, the substrate processing system 1 according to the embodiment may include a rotation arm 201a that is disposed to be pivotable from a first position RP1 disposed in the pre-cleaning region P1 of the polishing part (see 100 of FIG. 2) to a second position RP2 disposed outside the pre-cleaning region P1 of the polishing part 100. The cleaning fluid spraying part 201 may be separably mounted to the rotation arm 201a to spray a cleaning fluid onto the surface of the substrate 10 placed on the substrate mounting part (see 220 of FIG. 3).

Here, the placing of the substrate 10 on the substrate mounting part 220 may be construed as a concept including both of a state where substrate 10 is placed on the substrate mounting part 220 and a state where the substrate 10 is supported by the inverting unit (140 of FIG. 31).

The rotation arm 201a may move from the first position RP1 to the second position RP2 while pivoting about one end thereof. When the rotation arm 201a is disposed at the first position RP1, the cleaning fluid spraying part 201 may spray a cleaning fluid onto the surface of the substrate 100.

The cleaning fluid spraying part 201 may selectively and separably mounted onto the rotation arm 201a.

Here, cleaning fluid spraying part 201 may include at least one of the chemical spraying part, the cleaning liquid spraying part, the steam spraying part, and the heterogeneity fluid spraying part which can spray a cleaning fluid such as chemicals, pure water (DIW), steam and heterogeneity fluids.

Thus, by mounting different cleaning fluid spraying parts 201 onto one rotation arm 201a, different rotation arms or supporting units onto which spraying parts are mounted to spray different cleaning fluids need not to be provided. Since only one rotation arm can be used for different spraying parts, the structure can be simplified, and the space utilization can be increased. Furthermore, by disposing the rotation arm 201a at the second position RP2 when the pre-cleaning of the substrate 10 is finished, conflicts with peripheral devices such as a carrier head, a conditioner, and an inverting unit can be prevented.

Figure 34:
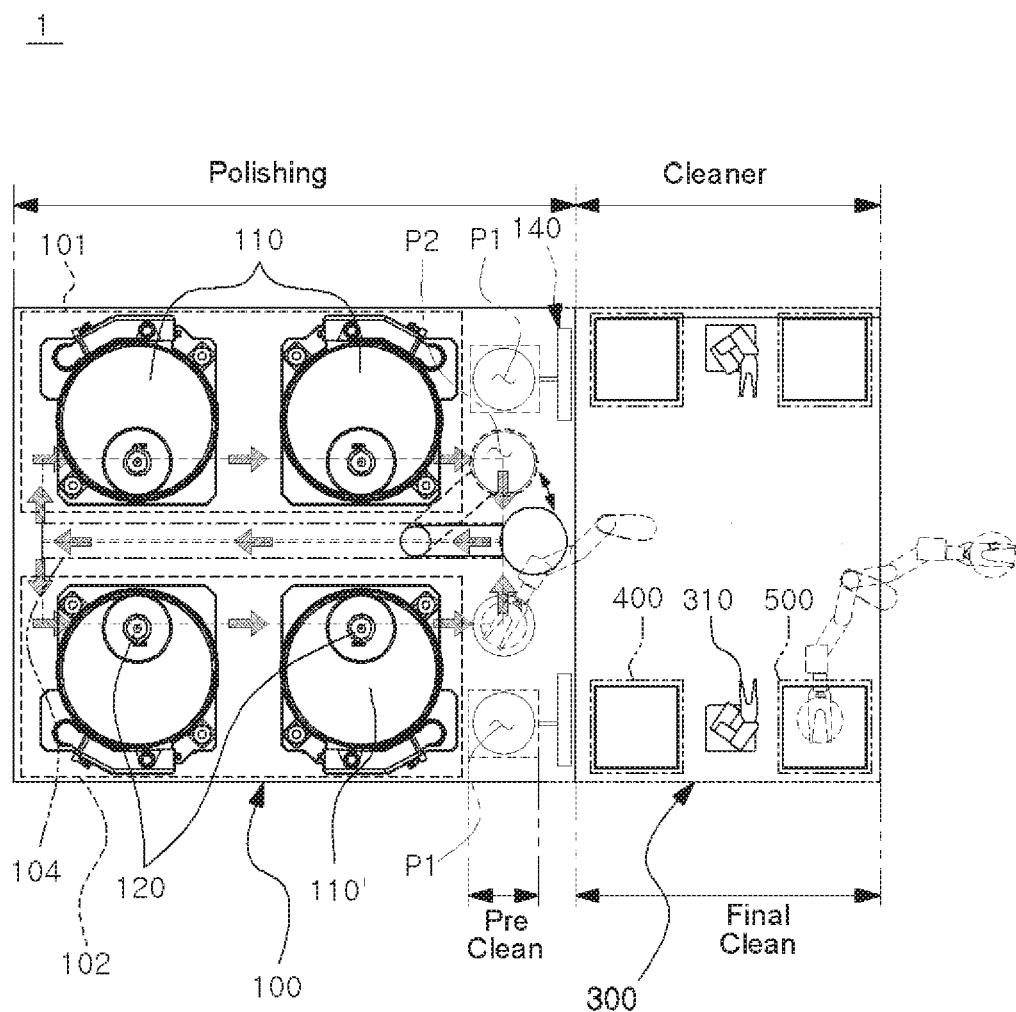
FIG. 34 is a view illustrating a substrate processing system according to still another embodiment of the present invention.
Figure 35:
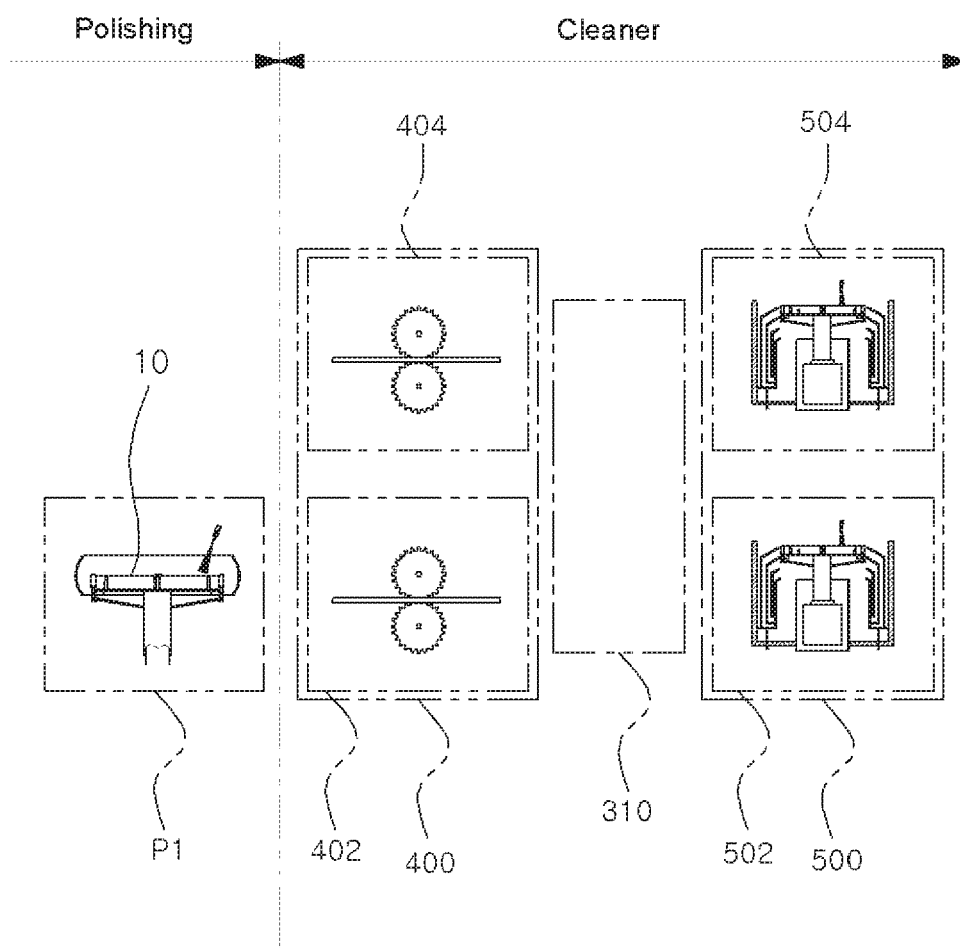
FIG. 35 is a view illustrating a cleaning part in a substrate processing system of FIG. 34.
Figure 36:
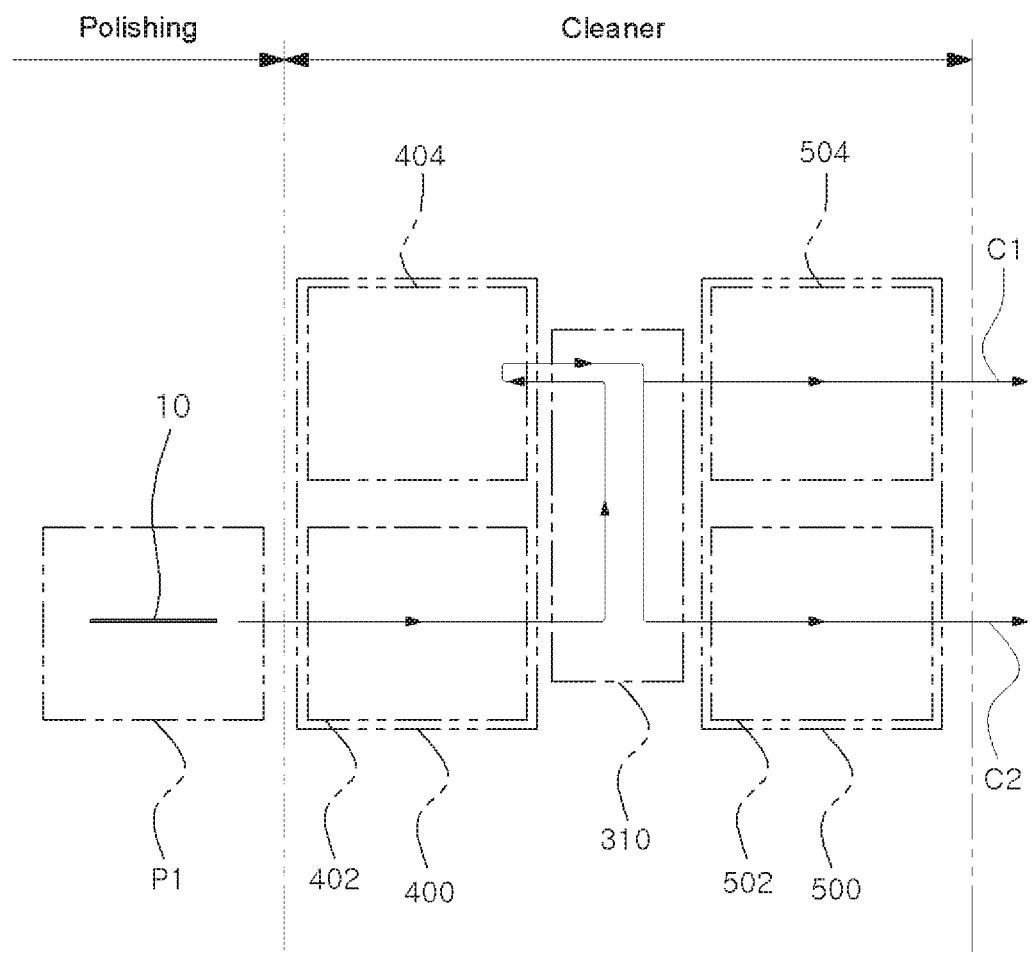
FIGS. 36 to 38 are views illustrating a cleaning process of a substrate by a cleaning part of FIG. 34.
Figure 37:
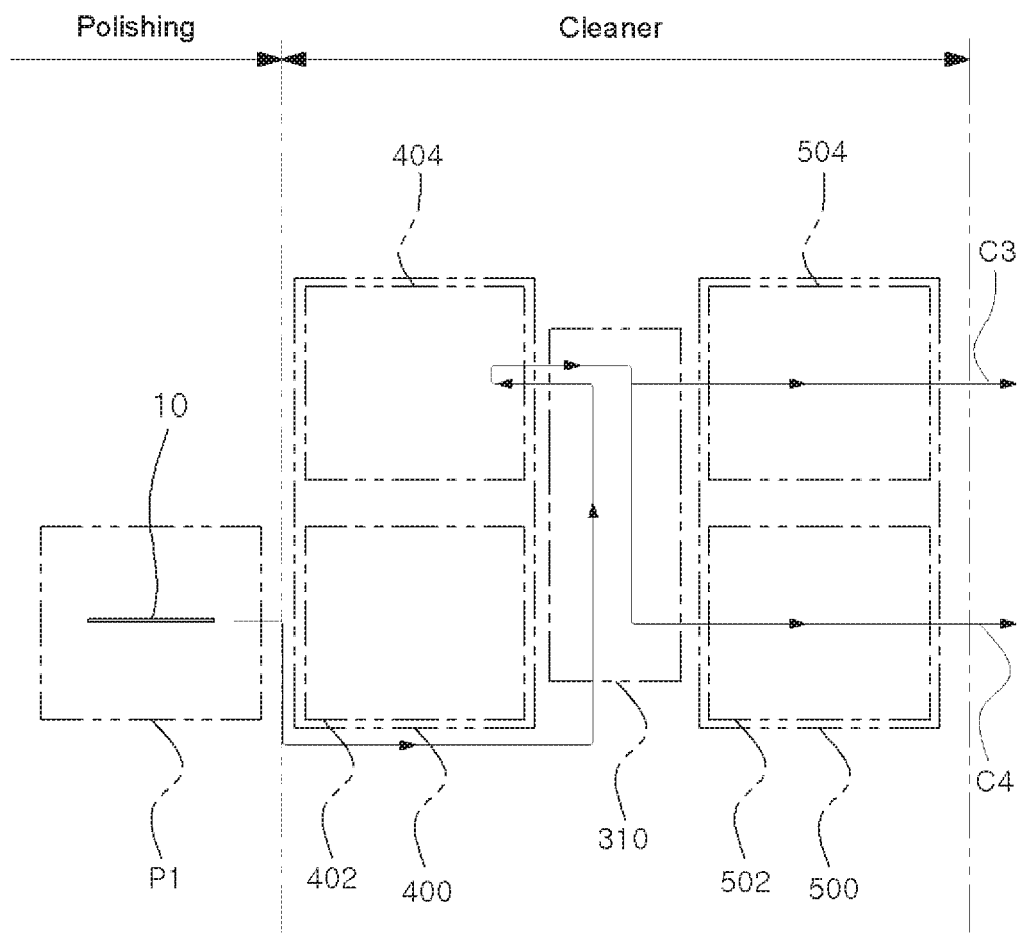
Figure 38:
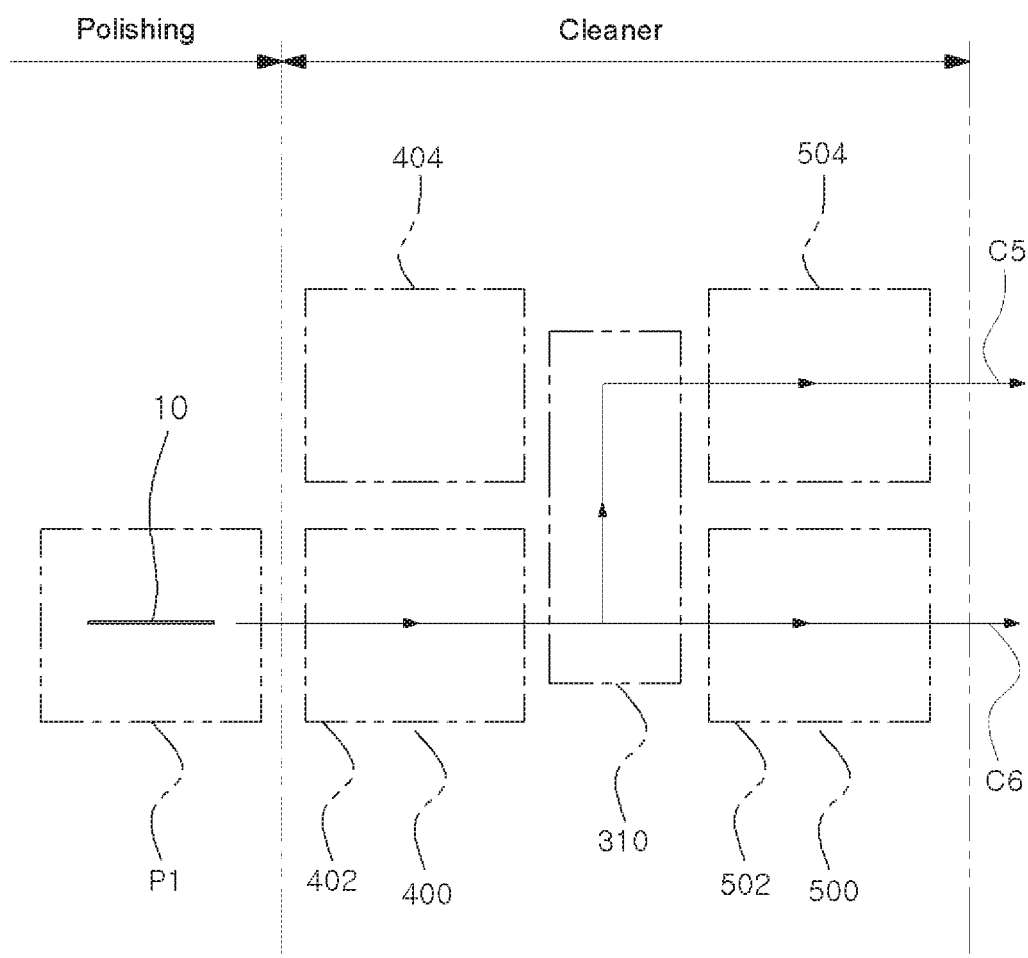
Figure 39:
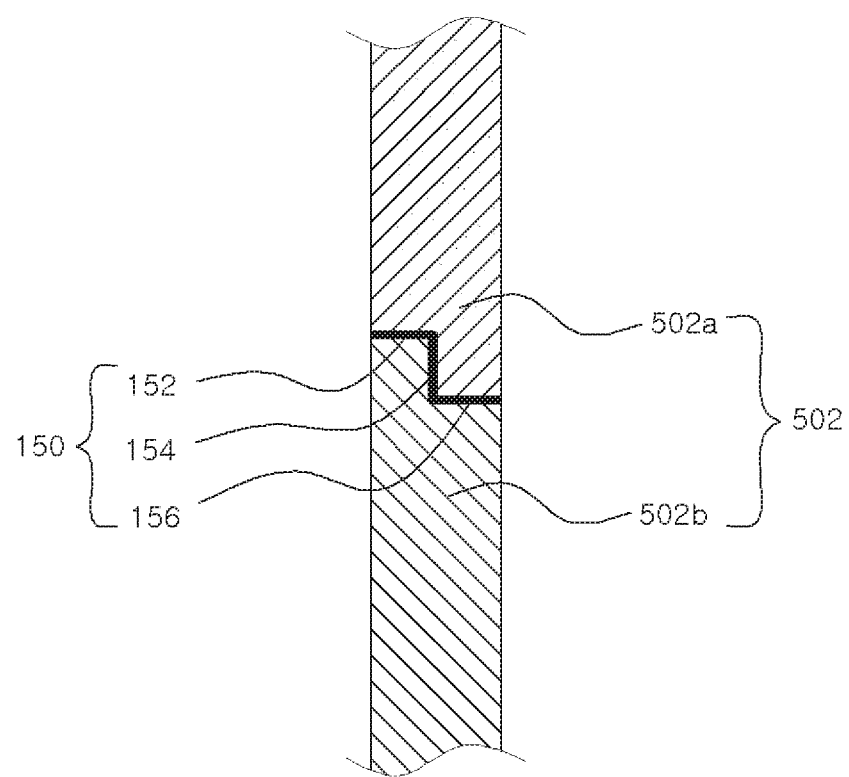
FIG. 39 is a view illustrating a packing member applied to a substrate processing system of FIG. 34.

FIG. 34 is a view illustrating a substrate processing system according to still another embodiment of the present invention. FIG. 35 is a view illustrating a cleaning part in a substrate processing system of FIG. 34. FIGS. 36 to 38 are views illustrating a cleaning process of a substrate by a cleaning part of FIG. 34. FIG. 39 is a view illustrating a packing member applied to a substrate processing system of FIG. 34. FIGS. 40 to 43 are views illustrating a preliminary cleaning process of a substrate by a cleaning part of FIG. 34. For parts equivalent to and similar to the configurations described above, the same reference numerals will be assigned, and detailed descriptions thereof will be omitted.

Referring to FIGS. 34 and 35, a substrate processing system 1 according to another embodiment may include a polishing part 100 for performing a Chemical Mechanical Polishing (CMP) process on a substrate, a pre-cleaning region P1 prepared in the polishing part 100 and performing pre-cleaning on the substrate 10 having undergone the CMP process, and a cleaning part 300 for cleaning the substrate 10 pre-cleaned in the pre-cleaning region P1. The cleaning part 300 may include a plurality of cleaning units 402, 404, 502 and 504 stacked in a vertical direction and individually performing cleaning on the substrate 10.

A plurality of polishing surface plates 110 may be provided in the polishing part 100, and a polishing pad may be attached to the top surface of each polishing surface plate 110. The substrate 10 supplied to a loading unit provided in the region of the polishing part 100 may make rotational contact with the upper surface of the polishing pad supplied with slurry while adhering closely to a carrier head 120 moving along a predetermined path, and thus the chemical mechanical polishing process may be performed.

In one embodiment, the polishing part 100 may include a first polishing region 101 comprising a plurality of first polishing surface plates 110 disposed therein, a second polishing region 102 facing the first polishing region and comprising a plurality of second polishing surface plates 110' disposed therein, and a substrate transfer line 104 disposed between the first polishing region 101 and the second polishing region 102 and transferring a substrate 10 loaded to a loading region P2 prepared in the polishing part 100. The substrate 10 loaded to the loading region P2 may be transferred along the substrate transfer line 104 to be polished in the first polishing region 101 or the second polishing region 102, and then may be unloaded to a pre-cleaning region P1.

The substrate transfer line 104 may be disposed at the center between the first polishing region 101 and the second polishing region 102, and the substrate 10 loaded to the loading region P2 may be transferred along the substrate transfer line 104. Thereafter, the substrate 10 may enter the first polishing region 101 or the second polishing region 102.

Thus, in this embodiment, the substrate 10 may be first transferred along the substrate transfer line 104, and may be polished in the first polishing region 101 or the second polishing region 102 and then immediately unloaded to the pre-cleaning region P1. Thus, a separate spraying device for maintaining the wet state of the substrate 10 having undergone the polishing may not be needed, and an occurrence of a watermark may be prevented.

In other words, the substrate may be first polished in the first polishing region or the second polishing region, and the substrate having undergone the polishing may be transferred along the substrate transfer line and then unloaded from the pre-cleaning region. However, in this structure (see FIG. 25) where the substrate is transferred after being polished, the substrate having undergone the polishing may be dried while being transferred along the substrate transfer line, and a watermark may occur or a mounted part of the substrate may be damaged. Accordingly, a separate spraying device or wetting bath needs to be inevitably provided on the substrate transfer line to maintain the wet state of the substrate. However, in this embodiment, since the substrate 10 is first transferred through the substrate transfer line 104 provided at the center between the first polishing region 101 and the second polishing region 102, and the substrate 10 is polished in the first polishing region 101 or the second polishing region 102 and then immediately unloaded to the pre-cleaning region P1, a separate device for wetting the substrate 10 may not be needed, and the substrate 10 having undergone the polishing process may be prevented from being dried. In addition, damage of substrate-mounted parts due to drying and a defect due to a watermark may be prevented.

The substrate 10 having undergone the polishing process may be cleaned by at least one of the cleaning fluid spraying part (cleaning liquid spraying part, steam spraying part, and heterogeneity fluid spraying part), the megasonic generator, and the cleaning brush when the substrate 10 is placed on the substrate mounting part (see 200 of FIG. 5) disposed in the pre-cleaning region P1. The details will be described below referring to FIGS. 4 to 12.

The cleaning part 300 including the plurality of cleaning units 402, 404, 502 and 504 provided in a stacked structure may be provided in various structures in accordance with the required conditions. Here, the stacking of the plurality of cleaning units 402, 404, 502 and 504 in a vertical direction may be defined as stacking the plurality of cleaning units 402, 404, 502 and 504 in a two or more-layered structure.

In one embodiment, the cleaning units 402, 404, 502 and 504 may include a plurality of contact-type cleaning units 402 and 404, and a plurality of non-contact-type cleaning units 502 and 504. The plurality of contact-type cleaning units 402 and 404 may be stacked in a vertical direction, may make physical contact with the surface of the substrate 10, and may individually perform cleaning on the substrate 10. The plurality of non-contact-type cleaning units 502 and 504 may be stacked in a vertical direction, may not physically contact the surface of the substrate 10, and may individually perform cleaning on the substrate 10. Hereinafter, a configuration in which two contact-type cleaning units 402 and 404 and two non-contact-type cleaning units 502 and 504 are disposed in two-layered structure, respectively, will be described. According to circumstances, only one of the contact-type cleaning unit and the non-contact-type cleaning unit may be provided in a stacked structure.

The plurality of contact-type cleaning units 402 and 404 may be provided with the cleaning brush (see 410 of FIG. 13) and the chemical supply part (see 420 of FIG. 13).

The non-contact-type cleaning units 502 and 504 may include a cradle 520 and a recovery container 530. The cradle 520 may allow the substrate 10 to be placed thereon one by one, and may rotate about the center of the shaft 521 inside the casing 402a. The recovery container 530 may surround the circumference of the cradle 520, and may collect a processing fluid scattering from the surface of the substrate 10. The substrate 10 may be cleaned by at least one of the cleaning fluid spraying part (cleaning liquid spraying part, steam spraying part, and heterogeneity fluid spraying part), the isopropyl alcohol spraying part, and the megasonic generator when the substrate 10 is placed on the cradle 520. (See FIGS. 12 and 21 to 24)

In addition, the cleaning part 300 may include a transfer unit 310 to transfer the substrate 100 from any one of the plurality of cleaning units 402, 402, 502 and 504 to another of the plurality of cleaning units 402, 402, 502 and 504. The substrate 10 may be transferred in the cleaning part 300 by the transfer unit 310.

A typical robot arm that can move in a vertical direction may be used as the transfer unit 310, and the present invention is not limited by the type and structure of the transfer unit 310.

The substrate 10 may be cleaned along various cleaning paths that are defined in the cleaning part 300. Here, the cleaning path of the substrate 10 may be construed as an order in which the substrate 10 is cleaned in the cleaning part 300 or a path along which the substrate 10 is transferred while being cleaned in the cleaning part 300.

More specifically, the substrate 10 may be configured to be cleaned along the cleaning path passing through at least one of the plurality of cleaning units 402, 404, 502 and 504 in the cleaning part 300. The cleaning path of the substrate 10 may go through at least one of the plurality of contact-type cleaning units 402 and 404 and at least one of the plurality of non-contact-type cleaning units 502 and 504 in order to improve the cleaning efficiency of the substrate 10.

In one embodiment, referring to FIG. 36, the substrate 10 entering the cleaning part 300 after pre-cleaned in the pre-cleaning region P1 may be cleaned along a cleaning path C1 that sequentially goes through the first contact-type cleaning unit 402, the second contact-type cleaning unit 404, and the second non-contact-type cleaning unit 504, and then may be discharged. In this case, the substrate 10 cleaned in the first contact-type cleaning unit 402 may be transferred to the second contact-type cleaning unit 404 by the transfer unit 310, and the substrate 10 cleaned in the second contact-type cleaning unit 404 may be transferred to the second non-contact-type cleaning unit 504 by the transfer unit 310.

In another embodiment, referring to FIG. 36, the substrate 10 entering the cleaning part 300 after pre-cleaned in the pre-cleaning region P1 may be cleaned along a cleaning path C2 that sequentially goes through the first contact-type cleaning unit 402, the second contact-type cleaning unit 404, and the first non-contact-type cleaning unit 502, and then may be discharged. In this case, the substrate 10 cleaned in the first contact-type cleaning unit 402 may be transferred to the second contact-type cleaning unit 404 by the transfer unit 310, and the substrate 10 cleaned in the second contact-type cleaning unit 404 may be transferred to the first non-contact-type cleaning unit 502 by the transfer unit 310.

In addition, at least one of the plurality of cleaning units 402, 404, 502 and 504 which is predetermined may be skipped in the cleaning path of the substrate 10.

Here, the skipping of at least one of the plurality of cleaning units 402, 404, 502 and 504 which is predetermined in the cleaning path of the substrate 10 may be construed as being cleaned in the cleaning part without going through a specific cleaning unit that is skipped.

In one embodiment, referring to FIG. 37, the substrate 10 entering the cleaning part 300 after pre-cleaned in the pre-cleaning region P1 may be cleaned along a cleaning path C3 that sequentially goes through the second contact-type cleaning unit 404 and the second non-contact-type cleaning unit 504 without going through the first contact-type cleaning unit 402, and then may be discharged. In this case, the substrate 10 entering the cleaning part 300 may be transferred to the second contact-type cleaning unit 404 by the transfer unit 310, and the substrate 10 cleaned in the second contact-type cleaning unit 404 may be transferred to the second non-contact-type cleaning unit 504 by the transfer unit 310.

In another embodiment, referring to FIG. 37, the substrate 10 entering the cleaning part 300 after pre-cleaned in the pre-cleaning region P1 may be cleaned along a cleaning path C4 that sequentially goes through the second contact-type cleaning unit 404 and the first non-contact-type cleaning unit 502 without going through the first contact-type cleaning unit 402, and then may be discharged. In this case, the substrate 10 entering the cleaning part 300 may be transferred to the second contact-type cleaning unit 404 by the transfer unit 310, and the substrate 10 cleaned in the second contact-type cleaning unit 404 may be transferred to the first non-contact-type cleaning unit 502 by the transfer unit 310.

In another embodiment, referring to FIG. 38, the substrate 10 entering the cleaning part 300 after pre-cleaned in the pre-cleaning region P1 may be cleaned along a cleaning path C5 that sequentially goes through the first contact-type cleaning unit 402 and the second non-contact-type cleaning unit 504 without going through the second contact-type cleaning unit 404, and then may be discharged. In this case, the substrate 10 cleaned in the first contact-type cleaning unit 402 may be transferred to the second non-contact-type cleaning unit 504 by the transfer unit 310.

In another embodiment, referring to FIG. 38, the substrate 10 entering the cleaning part 300 after pre-cleaned in the pre-cleaning region P1 may be cleaned along a cleaning path C6 that sequentially goes through the first contact-type cleaning unit 402 and the first non-contact-type cleaning unit 502 without going through the second contact-type cleaning unit 404, and then may be discharged. In this case, the substrate 10 cleaned in the first contact-type cleaning unit 402 may be transferred to the first non-contact-type cleaning unit 502 by the transfer unit 310.

In this embodiment, although the cleaning path of the substrate 10 is described as configured in a forward direction (contact-type cleaning unit to non-contact-type cleaning unit), according to circumstances, the cleaning path of the substrate 10 may be configured in a backward direction (non-contact-type cleaning unit to contact-type cleaning unit). For example, the substrate entering the cleaning part after pre-cleaned in the pre-cleaning region may also be cleaned in the second non-contact-type cleaning unit, and then may be cleaned in the first contact-type cleaning unit to be discharged.

Meanwhile, the plurality of cleaning units 402, 404, 502 and 504 constituting the cleaning part 300 may include a blocking unit that independently blocks each cleaning space from other spaces.

In one embodiment, the blocking unit includes casings (see 402a, 402b, 502a and 504a of FIG. 20) disposed to surround the substrate 10 and providing an independent cleaning processing space, and an opening/closing member (402b, 404b, 502b and 504b of FIG. 20) opening and closing the inlet of the casing (402a, 404a, 502a and 504a).

Thus, since each cleaning space of the plurality of cleaning units 402, 404, 502 and 504 is independently blocked by the blocking unit, a cleaning failure and a cleaning deterioration due to an inflow of fumes generated during the cleaning of the substrate 10 into a cleaning space of another cleaning unit that is adjacent can be prevented.

Also, referring to FIG. 39, since a packing member 150 is provided to seal a gap between the casing 502a and the opening/closing member 502b of the cleaning unit 502, each cleaning space of the plurality of cleaning units 402, 404, 502 and 504 can be more effectively sealed.

The packing member 150 may be formed of an elastic material such as rubber, urethane, and silicone, and the material of the packing member 150 may be variously modified in accordance with the required conditions and the design specifications.

The packing member 150 may include an upper packing part 152, a bent packing part 154 bent at one end of the upper packing part 152, and a lower packing part 156 bent at one end of the bent packing part 154 and disposed at a height different from the upper packing part 152. The upper packing part 152, the bent packing part 154, and the lower packing part 156 may adhere closely to a stepped part formed at mutually facing surfaces of the casing 502a and the packing member 502b.

In this structure, although fumes leak between the upper packing part 152 and the casing (or opening/closing member) 502a, secondary sealing may be implemented by the bent packing part 154 vertically bent from the upper packing part 152, and tertiary sealing may be implemented by the lower packing part 156 horizontally bent from the bent packing part 154. Thus, the sealing performance of each cleaning space of the plurality of cleaning units 402, 404, 502 and 504 can be improved, and thus fumes generated during the cleaning can be more effective blocked from leaking to the outside.

Meanwhile, also in the structure where the plurality of cleaning units 402, 404, 502 and 504 constituting the cleaning part 300 are vertically stacked, the substrate 10 may be transferred to and preparatorily cleaned in the cleaning part 300 by the substrate transferring part 610 before being polished in the polishing part 100. Thus, without a change or addition of the layout of existing equipment, damage (e.g., scratch) of substrate 10 due to foreign substances existing on the surface of the substrate 10 can be minimized during the polishing process.

The substrate 10 entering the cleaning part 300 having a multi-layered structure before the polishing process may be preparatorily cleaned along various preparatory cleaning paths (e.g., PC1, PC2, PC3 and PC4 of FIGS. 40 to 43) that are defined in the cleaning part 300.

More specifically, the substrate 10 may be configured to be cleaned along the cleaning path passing through at least one of the plurality of cleaning units 402, 404, 502 and 504 in the cleaning part 300. In addition, at least one of the plurality of cleaning units 402, 404, 502 and 504 which is predetermined may be skipped in the preparatory cleaning path of the substrate 10. In other words, all of the cleaning units 402, 404, 502 and 504 may be used for the preparatory cleaning of the substrate 10, but only a portion of the cleaning units 402, 404, 502 and 504 may also be used for the preparatory cleaning of the substrate 10.

Figure 40:
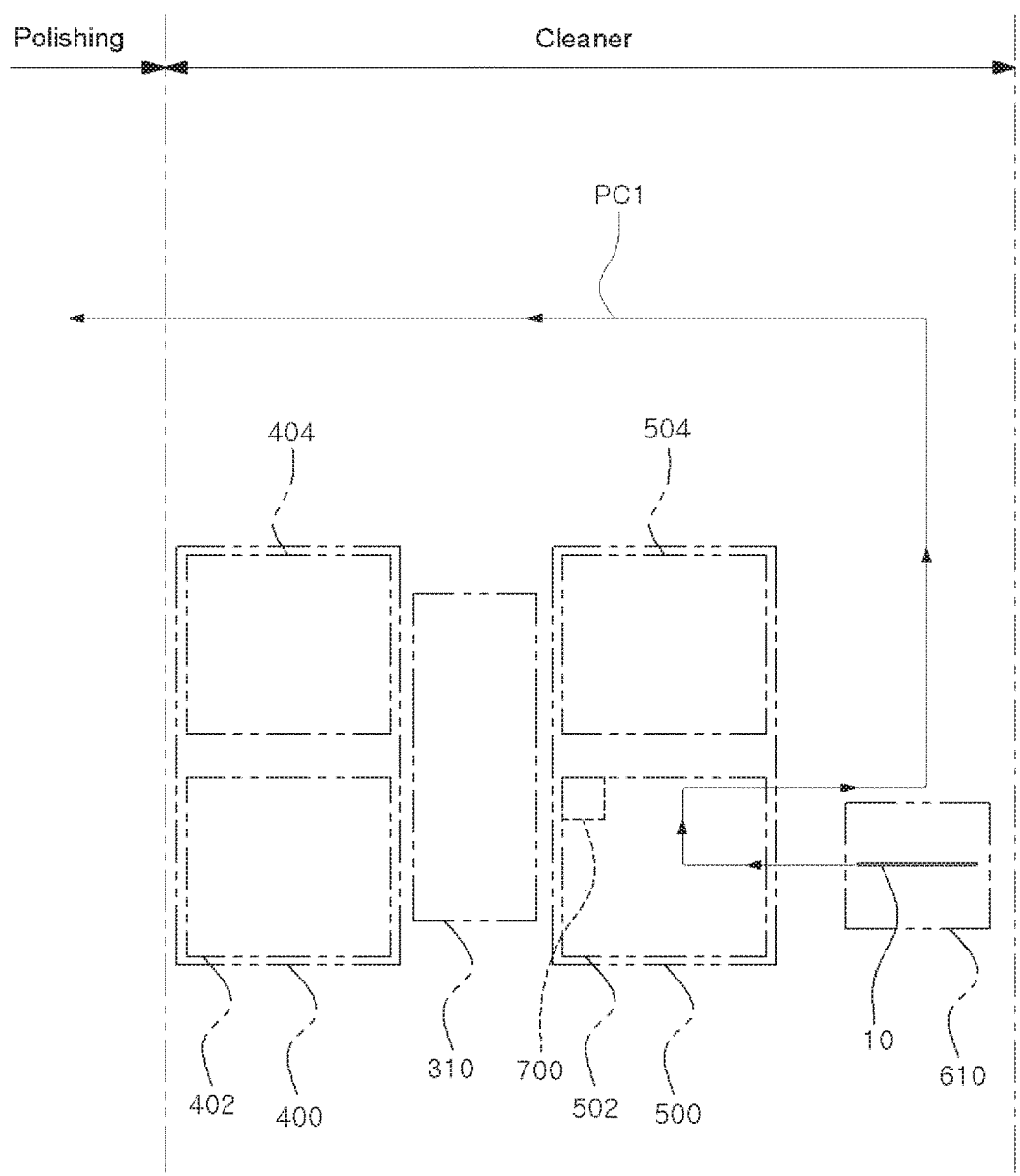
FIGS. 40 to 43 are views illustrating a preliminary cleaning process of a substrate by a cleaning part of FIG. 34.

In one embodiment, referring to FIG. 40, the substrate 10 may be transferred to and polished in the polishing part 100 after cleaned along the preparatory cleaning path PC1 passing through the first non-contact-type cleaning unit 502 most adjacent to the substrate transferring part 610.

Figure 41:
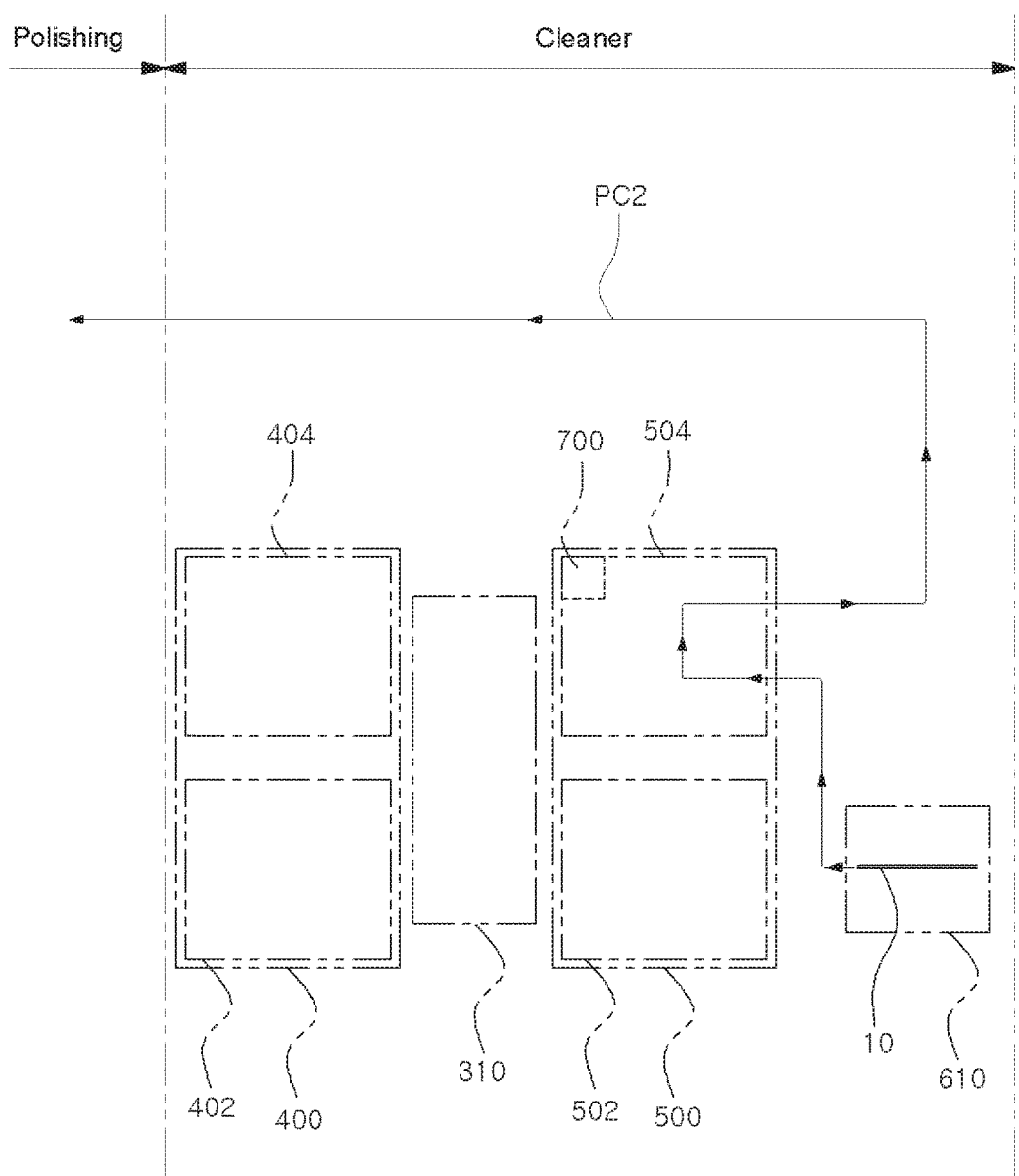

In another embodiment, referring to FIG. 41, the substrate 10 may be transferred to and polished in the polishing part 100 after cleaned along the preparatory cleaning path PC2 passing through second non-contact-type cleaning unit 504.

Also, the preparatory cleaning path of the substrate 10 may go through both at least one of the plurality of contact-type cleaning units 402 and 404 and at least one of the plurality of non-contact-type cleaning units 502 and 504 in order to improve the cleaning efficiency of the substrate 10.

Figure 42:
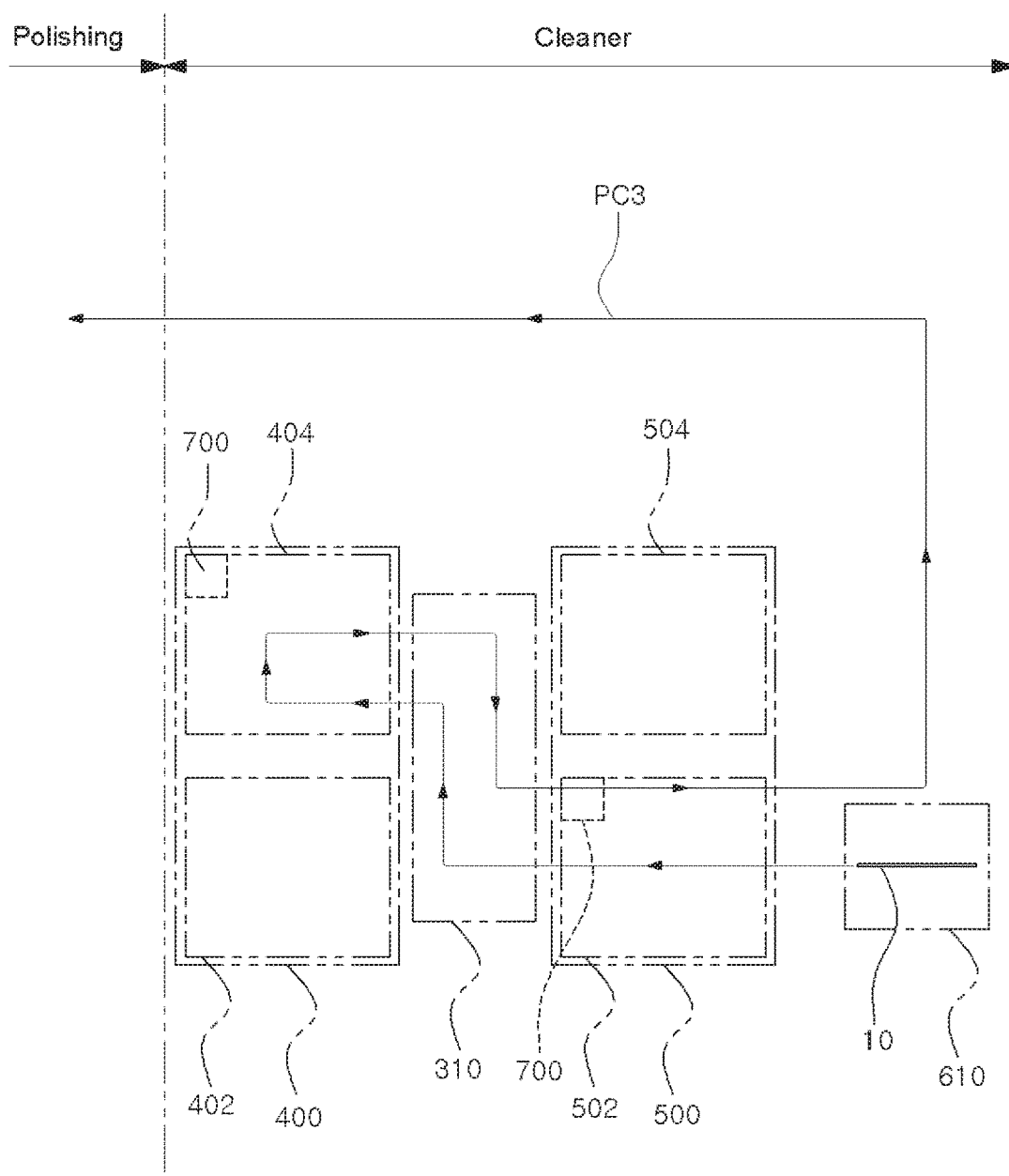

In one embodiment, referring to FIG. 42, the substrate 10 may be transferred to and polished in the polishing part 100 after cleaned along the preparatory cleaning path PC3 sequentially passing through the first non-contact-type cleaning unit 502 and the second contact-type cleaning unit 404. In this case, the substrate 10 cleaned in the first non-contact-type cleaning unit 502 may be transferred to the second contact-type cleaning unit 404 by the transfer unit 310, and the substrate 10 cleaned in the second contact-type cleaning unit 404 may be transferred to the first non-contact-type cleaning unit 502 by the transfer unit 310.

Figure 43:
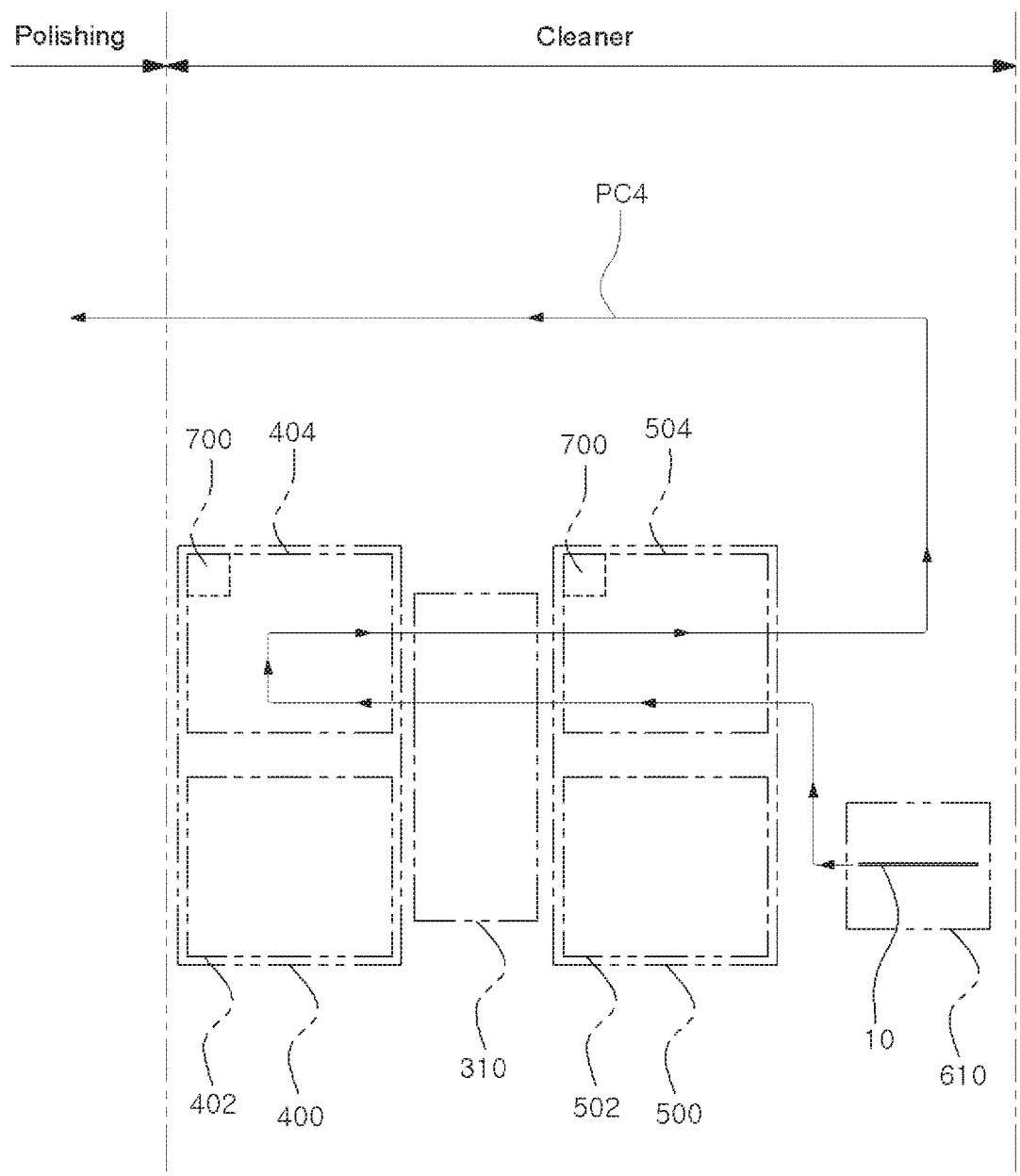

In another embodiment, referring to FIG. 43, the substrate 10 may be transferred to and polished in the polishing part 100 after cleaned along the preparatory cleaning path PC4 sequentially passing through the second non-contact-type cleaning unit 504 and the second contact-type cleaning unit 404. In this case, the substrate 10 cleaned in the second non-contact-type cleaning unit 504 may be transferred to the second contact-type cleaning unit 404 by the transfer unit 310, and the substrate 10 cleaned in the second contact-type cleaning unit 404 may be transferred to the second non-contact-type cleaning unit 504 by the transfer unit 310.

Otherwise, the substrate 10 may be first cleaned in the first contact-type cleaning unit (or second contact-type cleaning unit). Thereafter, the substrate 10 may be cleaned in the first non-contact-type cleaning unit (or second non-contact-type cleaning unit), and then may be transferred to the polishing part.

Also, each of cleaning units 402, 404, 502 and 504 of the cleaning part may include a contamination measurement part to measure the contamination of the substrate 10 preparatorily cleaned in the cleaning units 402, 404, 502 and 504.

The contamination measurement part 700 may test whether or not each of cleaning units 402, 404, 502 and 504 normally operate, by measuring the contamination degree of the substrate 10 having undergone the preparatory cleaning.

In other words, the contamination measurement part 700 may check whether or not cleaning is being normally performed on the substrate 10 by each of the cleaning units 402, 404, 502 and 504 (before final cleaning is performed on the substrate having undergone the polishing process). For example, when the contamination degree of the substrate 100 which is measured by the contamination measurement part 700 is larger than a preset reference value, it may be determined that the cleaning units 402, 404, 502 and 504 do not normally operate or the internal contamination degree of the cleaning units 402, 404, 502 and 504 is high.

The contamination measurement part 700 may measure the contamination degree of the substrate 10 by measuring particles remaining on the surface of the substrate 10, and the present invention is not limited by the type and measurement method of the contamination measurement part 700.

Figure 44:
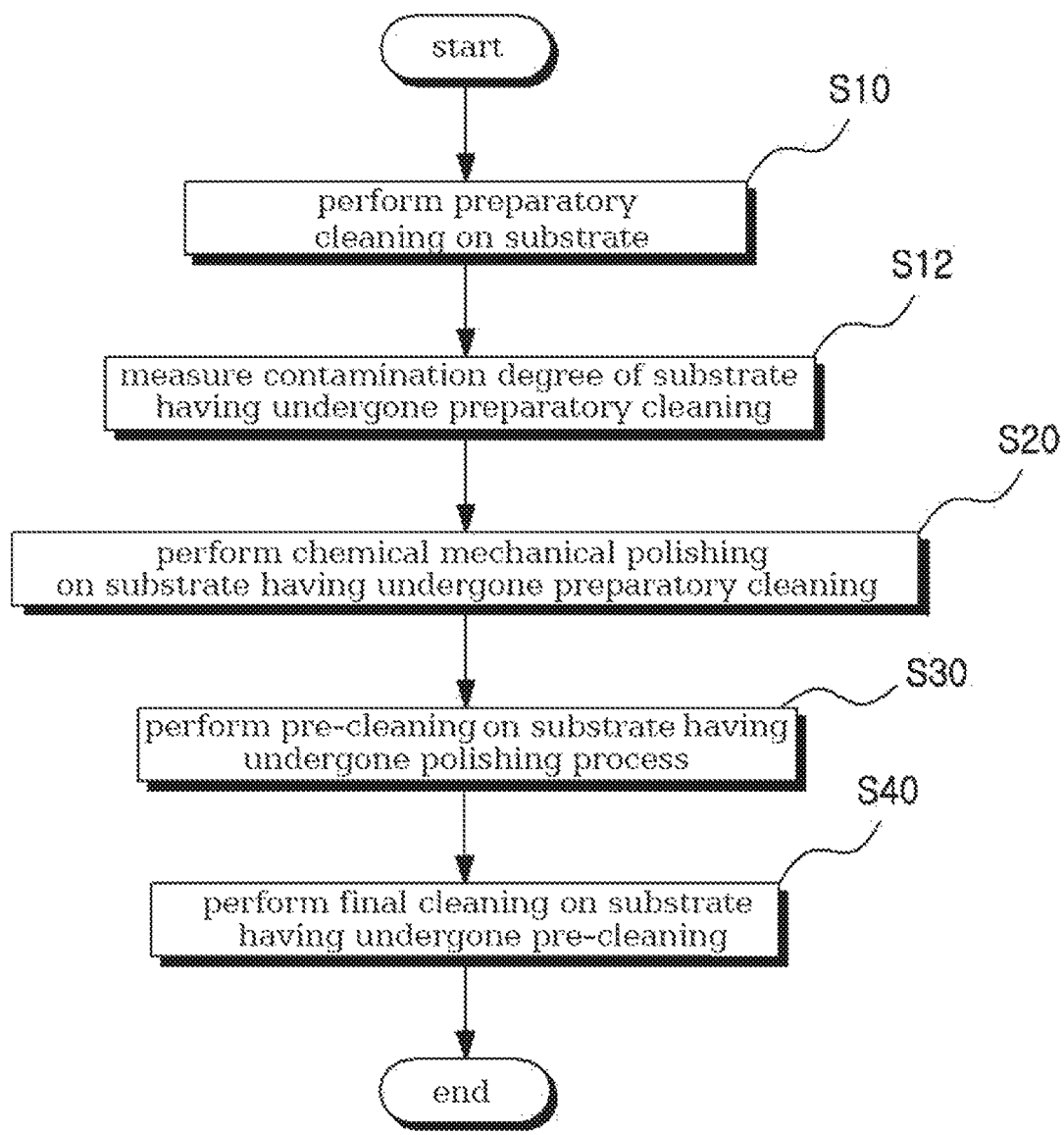
FIG. 44 is a view illustrating a substrate processing method according to an embodiment of the present invention.

FIG. 44 is a view illustrating a substrate processing method according to an embodiment of the present invention. For parts equivalent to and similar to the configurations described above, the same reference numerals will be assigned, and detailed descriptions thereof will be omitted.

Referring to FIG. 44, a substrate processing method according to an embodiment may include performing preparatory cleaning on a substrate 10 (S10), performing a Chemical Mechanical Polishing (CMP) process on the substrate 10 having undergone pre-cleaning (S20), and cleaning the substrate 10 having undergone the polishing process using a cleaning part 300 (S30).

Operation 10:

First, preparatory cleaning may be performed on a substrate. (S10)

In operation S10, preparatory cleaning may be performed on a substrate 10 to preliminarily remove foreign substances existing on the surface of the substrate 10 before polishing process is performed on the substrate 10.

This may be to prevent damage (e.g., scratch) of the substrate due to foreign substances existing on the surface of the substrate 10 during the polishing process, by performing preparatory cleaning on the substrate 10 before the polishing process of the substrate 10.

In operation S10, preparatory cleaning may be performed on the substrate 10 by various method in accordance with the required conditions and the design specifications.

Operation S10 may be the cleaning part 300 that is used in operation S30. Thus, since the preparatory cleaning of the substrate 10 is performed in the cleaning part 300 that is prepared in advance (already prepared to clean the substrate in operation S30), equipment and space for the preparatory cleaning of the substrate 10 may not be additionally prepared. Accordingly, the layout of existing equipment can be almost maintained without a change or addition.

For reference, the cleaning part 300 may include a plurality of cleaning units 402, 404, 502 and 504 which individually perform cleaning on the substrate 10. In one embodiment, the cleaning part 300 may include a contact-type cleaning unit 400 and a non-contact-type cleaning unit 500. The contact-type cleaning unit 400 may make contact with the surface of the substrate 10 so as to effectively remove organic matters and other foreign substances remaining on the surface of the substrate 10 and may perform cleaning. The non-contact-type cleaning unit may not make contact with the surface of the substrate 10 and may perform cleaning. According to circumstances, the cleaning part 300 may be configured to include only one of the contact-type cleaning unit and the non-contact-type cleaning unit.

The cleaning units 402, 404, 502 and 504 may include a plurality of contact-type cleaning units 402 and 404, and a plurality of non-contact-type cleaning units 502 and 504. The plurality of contact-type cleaning units 402 and 404 may be stacked in a vertical direction, may make physical contact with the surface of the substrate 10, and may individually perform cleaning on the substrate 10. The plurality of non-contact-type cleaning units 502 and 504 may be stacked in a vertical direction, may not physically contact the surface of the substrate 10, and may individually perform cleaning on the substrate 10. (see FIG. 35) Thus, a footprint of the cleaning part 300 can be reduced and the space efficiency can be improved, by stacking the plurality of cleaning units 402, 404, 502 and 504. Naturally, as shown in FIGS. 26 to 29, the plurality of cleaning units 402, 404, 502 and 504 constituting the cleaning part 300 may also be disposed in one-layered structure.

In operation S10, the substrate 10 entering the cleaning part 300 may be preparatorily cleaned along various preparatory cleaning paths (PC1 to PC4 of FIGS. 26 to 29 and 35 to 38) that are defined in the cleaning part 300. Here, the preparatory cleaning path of the substrate 10 may be defined as an order in which the substrate 10 is cleaned before the polishing process is performed or a path along which the substrate 10 is transferred while being cleaned.

More specifically, in operation S10, the substrate 10 may be configured to be cleaned along the cleaning path passing through at least one of the plurality of cleaning units 402, 404, 502 and 504 in the cleaning part 300. In order to minimize the moving path of the substrate 10 and shorten the preparatory cleaning time of the substrate 10, in operation S10, the preparatory cleaning of the substrate 10 may be performed using one of the plurality of cleaning units 402, 404, 502 and 504 constituting the cleaning part 300, which is most adjacent to the substrate transferring part 610.

In addition, in operation S10, at least one of the plurality of cleaning units 402, 404, 502 and 504 which is predetermined may be skipped in the preparatory cleaning path of the substrate 10. In other words, all of the cleaning units 402, 404, 502 and 504 may be used for the preparatory cleaning of the substrate 10, but only a portion of the cleaning units 402, 404, 502 and 504 may also be used for the preparatory cleaning of the substrate 10.

After the preparatory cleaning for the substrate 10 is completed in the cleaning part 300, the contamination degree of the substrate preparatorily cleaned in the cleaning part 300 may be measured. (S12)

In operation S12 for measuring the contamination degree, a test may be performed to check whether or not each of cleaning units 402, 404, 502 and 504 normally operate, by measuring the contamination degree of the substrate 10 having undergone the preparatory cleaning. In other words, the test may be performed check whether or not cleaning is being normally performed on the substrate 10 by each of the cleaning units 402, 404, 502 and 504 (test before final cleaning is performed on the substrate having finishing the polishing process). For example, when the contamination degree of the substrate 100 which is measured in operation S12 is larger than a preset reference value, it may be determined that the cleaning units 402, 404, 502 and 504 do not normally operate or the internal contamination degree of the cleaning units 402, 404, 502 and 504 is high.

Operation 20:

Next, a Chemical Mechanical Polishing (CMP) process may be performed on the substrate 10 having finishing the preparatory cleaning. (S20)

In operation S20, the substrate 10 having undergone the preparatory cleaning may make rotational contact with the upper surface of a polishing pad supplied with slurry while adhering closely to a carrier head (120 of FIG. 3), and thus the chemical mechanical polishing process may be performed.

Operation 30:

Next, after operation S20 is completed, the substrate 10 having undergone the polishing process may be pre-cleaned. (S30)

For reference, the pre-cleaning of the substrate 10 may be construed as a process for removing foreign substances existing on the surface (particularly, polishing surface of substrate) of the substrate 10 to the maximum before cleaning is performed on the substrate 10 in the cleaning part 300.

Operation S30 for pre-cleaning may be performed in a pre-cleaning region P1 prepared in the polishing part (see 100 of FIG. 34). That is, the substrate 10 having undergone the polishing process may be unloaded to the pre-cleaning region P1 prepared in the polishing part 100, and pre-cleaning may be performed on the unloaded substrate 10 in operation S30.

In this case, the substrate 10 having undergone the polishing process may be unloaded to the pre-cleaning region P1, and then may be inverted 180 degrees. Also, in operation S30, the substrate 10 may be pre-cleaned while being in an inverted state.

Thus, a process sequence in which the substrate 10 having undergone the polishing process is unloaded to the pre-cleaning region P1 and then is transferred to the cleaning part may be maintained without a change, and foreign substances remaining on the substrate 10 may be preliminarily pre-cleaned in the pre-cleaning region P1. Thus, without a change or addition of the layout of existing equipment, foreign substances remaining on the substrate 10 can be minimized without a reduction of the process efficiency before a main cleaning process (i.e., cleaning process by the cleaning part) is performed.

For reference, in operation S30, the pre-cleaning may be performed by spraying cleaning fluids such as chemicals, pure water (DIW), steams, and heterogeneity fluids onto the surface of the substrate 10, allowing the cleaning brush to make rotational contact with the surface of the substrate 10, or supplying vibration energy to the surface of the substrate 10. (See FIGS. 4 to 13)

Operation 40:

Next, the substrate 10 having undergone the polishing process in operation S20 may be cleaned using the cleaning part 300. (S40)

In operation S40, the substrate 10 pre-cleaned in operation S30 may be again cleaned using the cleaning part 300.

For reference, the cleaning of the substrate 10 described in operation S40 may be construed as a process for removing foreign substances remaining on the surface (particularly, non-polishing surface of substrate is also cleanable) of the substrate 10 after the pre-cleaning is performed.

In addition, the substrate 10 cleaned in operation S40 may be configured to go through a next predetermined process as a non-cleaning state. Here, as described above, the performing of the next process as the non-cleaning state may be construed as the state in which all cleaning processes were completed for the substrate 10 after the cleaning process in operation S40. The substrate 10 having undergone the cleaning process may go through a next process (e.g., deposition process) without an additional cleaning process.

In addition, in operation S40, the cleaning may be performed by spraying cleaning fluids such as chemicals, pure water (DIW), steams, and heterogeneity fluids onto the surface of the substrate 10, allowing the cleaning brush to make rotational contact with the surface of the substrate 10, supplying vibration energy to the surface of the substrate 10, or spraying isopropyl alcohol (IPA) onto the surface of the substrate 10. (See FIGS. 14 to 24)

According to the embodiments of the present invention as described above, the polishing efficiency and the cleaning efficiency can be improved, and the yield can also be improved.

Particularly, foreign substances remaining on the substrate prior the polishing process may be minimized without a reduction of the process efficiency, by performing preparatory cleaning on the substrate using the cleaning part already prepared, without a change or addition of the layout of existing equipment.

In other words, prior the polishing process for the substrate, the substrate may be transferred to a separate cleaning region provided with a separate cleaning unit, and the preparatory cleaning may be performed on the substrate. In this case, however, since the substrate needs to go through a complicate transfer process in which the substrate needs to be transferred to the separate cleaning region to be cleaned and then the cleaned substrate needs to be again transferred to the cleaning part, the whole processing efficiency of the substrate may be reduced. Also, in order to additionally prepare a separate cleaning region, since the layout of existing equipment needs to be changed or added, the space utilization may be reduced, and the cost may increase for the change of equipment. However, in the present invention, the process sequence of transferring the substrate to the polishing part may be maintained without a change, and foreign substances existing on the surface of the substrate may be preparatorily cleaned prior to the polishing process for the substrate using the cleaning part that is already prepared to clean the substrate having undergone the polishing process. Thus, without a change or addition of the layout of existing equipment, foreign substances existing on the substrate can be removed without a reduction of the process efficiency before the polishing process is performed.

Furthermore, since foreign substances existing on the substrate can be removed through the preparatory cleaning performed in the cleaning part prior to the polishing process, damage of the substrate such as scratches due to foreign substances can be prevented during the polishing process.

Also, in the present invention, after foreign substances are preliminarily pre-cleaned in the pre-cleaning region to which the substrate is unloaded, a main cleaning process may be performed on the substrate in the cleaning part. Thus, foreign substances remaining on the surface can be effectively removed, and the cleaning efficiency of the substrate can be improved.

Furthermore, foreign substances remaining on the substrate prior the cleaning process may be minimized without a reduction of the process efficiency, by performing preparatory cleaning on the substrate in the pre-cleaning region to which the substrate is unloaded, without a change or addition of the layout of existing equipment.

In other words, before the substrate having undergone the polishing process is transferred to undergo the main cleaning process, the substrate may be transferred to a separate cleaning region to be pre-cleaned, and then may be again transferred to the cleaning part. In this case, however, since the substrate needs to go through a complicate transfer process in which the substrate unloaded to the unloading region needs to be transferred to the separate cleaning region and then needs to be again transferred to the cleaning part, the whole processing efficiency of the substrate may be reduced. Also, in order to additionally prepare a separate cleaning region, since the layout of existing equipment needs to be changed or added, the space utilization may be reduced, and the cost may increase for the change of equipment. However, a process sequence in which the substrate having undergone the polishing process is unloaded to the pre-cleaning region and then is transferred to the cleaning part may be maintained without a change, and foreign substances remaining on the substrate may be preliminarily pre-cleaned in the pre-cleaning region. Thus, without a change or addition of the layout of existing equipment, foreign substances remaining on the substrate can be minimized without a reduction of the process efficiency before a main cleaning process is performed.

Also, since foreign substances remaining on the substrate can be maximally removed through the pre-cleaning process performed in the pre-cleaning region prior to the cleaning process, the cleaning effect by the main cleaning process can be improved, and the cleaning efficiency may also be improved.

Also, a footprint of the cleaning part can be reduced and the space efficiency can be improved, by stacking the plurality of cleaning units constituting the cleaning unit into a multi-layered structure.

Also, the cost according to the cleaning of the substrate can be saved, and the process efficiency and the yield can be improved.

Also, since various pre-cleaning methods can be selected and applied in accordance with the type and characteristics of the substrate, foreign substances stuck to the surface of the substrate can be effectively removed, and the cleaning efficiency can be improved.

In addition, since foreign substances remaining on the substrate can be minimized, the defect rate of the substrate can be minimized, and the stability and the reliability may be improved.

Also, a contamination measurement part may be provided in the cleaning part to measure the contamination degree of the substrate that is preparatorily cleaned in the cleaning part. The contamination measurement part may test whether or not each of cleaning units normally operates, through the preparatory cleaning process of the substrate. In other words, the contamination measurement part may check whether or not cleaning is being normally performed on the substrate by each of the cleaning units. Accordingly, a separate test for checking whether or not the cleaning part normally operates may not be needed.

The above-disclosed subject matter is to be considered illustrative and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

Having described the invention, the following is claimed:
1. A substrate processing system for processing a substrate, said system comprising:
   a polishing part including structures for performing a Chemical Mechanical Polishing (CMP) process on the substrate, wherein the polishing part includes a pre-cleaning region having structures for performing a pre-cleaning process on the substrate;

a cleaning part including structures for cleaning the substrate, said cleaning part separated from the polishing part; and a substrate transferring part for transferring the substrate to the cleaning part before the substrate undergoes the polishing process in the polishing part, wherein said pre-cleaning region of the polishing part receives the substrate after the substrate has undergone the polishing process, and the cleaning part receives the substrate after the substrate has undergone the pre-cleaning process in the pre-cleaning region.

2. The substrate processing system of claim 1, wherein the cleaning part comprises a plurality of cleaning units that individually perform cleaning on the substrate, and the substrate is received by the polishing part after undergoing a preparatory cleaning process in the cleaning part prior to the polishing process, the preparatory cleaning process includes moving the substrate along a preparatory cleaning path that passes through at least one of the plurality of cleaning units before the polishing process is performed.

3. The substrate processing system of claim 2, comprising a transfer unit disposed in the cleaning part for transferring the substrate from one of the plurality of cleaning units to another of the plurality of cleaning units.

4. The substrate processing system of claim 2, wherein the substrate transferring part transfers the substrate to one of the plurality of cleaning units which is most adjacent to the substrate transferring part.

5. The substrate processing system of claim 2, wherein the plurality of cleaning units are disposed to be stacked along upward and downward directions.

6. The substrate processing system of claim 5, wherein each of the cleaning units comprises at least one of:
a plurality of contact-type cleaning units disposed to be stacked along upward and downward directions, making physical contact with the surface of the substrate, and individually performing cleaning on the substrate;
a plurality of non-contact-type cleaning units disposed to be stacked along upward and downward directions, making non-physical contact with a surface of the substrate, and individually performing cleaning on the substrate.

7. The substrate processing system of claim 6, wherein each contact-type cleaning unit comprises:
a cleaning brush provided rotatably and making contact with the surface of the substrate; and
a chemical supply part for supplying a chemical to a contact portion of the cleaning brush and the substrate while the cleaning brush is contacting the surface of the substrate, said chemical comprising at least one of Standard Clean-1 (SC1, APM) and hydrofluoric acid (HF).

8. The substrate processing unit of claim 6, wherein each non-contact-type cleaning unit is disposed in the cleaning part, and comprises a cleaning fluid spraying part that sprays a cleaning fluid onto the surface of the substrate, said cleaning fluid comprising at least one of SC1 (APM), ozone hydrofluoric acid (O3HF), ammonia, hydrogen peroxide, chemical, and pure water (DIW).

9. The substrate processing system of claim 8, wherein:
the cleaning fluid spraying part comprises a heterogeneity fluid spraying part that sprays different heterogeneity fluids onto the surface of the substrate, the heterogeneity fluid spraying part comprising:
a dry ice supply unit for supplying dry ice particles; and
a fluid spraying unit for spraying a fluid onto the surface of the substrate,
wherein the dry ice particles and the fluid are sprayed onto the surface of the substrate while being mixed with each other.

10. The substrate processing system of claim 6, wherein each non-contact-type cleaning unit comprises:
a cradle disposed rotatably and allowing the substrate to be placed one by one on a top surface thereof; and
a recovery container surrounding a circumference of the cradle and collecting a processing fluid scattering from the surface of the substrate.

11. The substrate processing system of claim 10, wherein the cradle is disposed movably along upward and downward directions, and
the recovery container comprises a plurality of recover cups formed on an inner wall of the recovery container and forming a plurality of recovery ducts for collecting different processing fluids at different heights along upward and downward directions.

12. The substrate processing system of claim 2, further comprising a blocking unit for independently blocking a cleaning space of the cleaning unit from other spaces, wherein the blocking unit comprises:
a casing provided to surround the substrate and providing an independent cleaning processing space; and
an opening/closing member for opening/closing an inlet of the casing.

13. The substrate processing system of claim 12, further comprising a packing member sealing a gap between the casing and the opening/closing member, wherein the packing member comprises:
an upper packing part;
a bent packing part that is bent at one end of the upper packing part; and
a lower packing part that is bent at one end of the bent packing part and is disposed at a height different from the upper packing part,
wherein the upper packing part, the bent packing part, and the lower packing part adhere closely to a stepped part formed at mutually facing surfaces of the casing and the packing member.

14. The substrate processing system of claim 1, wherein the polishing part includes a cleaning fluid spraying part disposed in the pre-cleaning region, said cleaning fluid spraying part spraying a cleaning fluid onto a surface of the substrate.

15. The substrate processing system of claim 14, wherein the cleaning fluid spraying part comprises a cleaning liquid spraying part that sprays a cleaning liquid onto the surface of the substrate, the cleaning liquid comprising at least one of chemical, Standard Clean-1 (SC1, APM), ammonia, hydrogen peroxide, and pure water (DIW).

16. The substrate processing system of claim 14, wherein the cleaning fluid spraying part comprises a heterogeneity fluid spraying part that sprays different heterogeneity fluids onto the surface of the substrate.

17. The substrate processing system of claim 14, comprising a rotation arm disposed to be pivotable from a first position disposed in the pre-cleaning region to a second position disposed outside the pre-cleaning region in the polishing part, said cleaning fluid spraying part mounted onto the rotation arm.

18. The substrate processing system of claim 1, wherein the pre-cleaning process is performed in the pre-cleaning region on at least one of a polishing surface and a non-polishing surface of the substrate.

19. The substrate processing system of claim 1, comprising a substrate mounting part disposed in the pre-cleaning region and allowing the substrate to be placed thereon, the substrate being pre-cleaned when unloaded to the substrate mounting part.

20. The substrate processing system of claim 1, further comprising a contamination measurement part disposed in the cleaning part and measuring the contamination degree of the substrate after cleaning the substrate in the cleaning part prior to the polishing process in the polishing part.

21. The substrate processing system of claim 1, wherein the polishing part comprises:
- a first polishing region allowing a plurality of first polishing surface plates to be disposed therein;
- a second polishing region facing the first polishing region and allowing a plurality of second polishing surface plates to be disposed therein; and
- a substrate transfer line disposed between the first polishing region and the second polishing region, and transferring the substrate loaded to a loading region prepared in the polishing part,
- wherein the substrate loaded to the loading region is transferred along the substrate transfer line to be polished in the first polishing region or the second polishing region, and then is unloaded to the pre-cleaning region.

22. The substrate processing system of claim 1, comprising an inverting unit disposed in the pre-cleaning region and gripping the substrate in the pre-cleaning region to invert the substrate.

23. The substrate processing system of claim 22, comprising a carrier head for transferring the substrate having undergone the polishing process to the pre-cleaning region where the substrate is pre-cleaned while being inverted by the inverting unit.

24. The substrate processing system of claim 1, further comprising a blocking unit for blocking a pre-cleaning processing space of the pre-cleaning region from other spaces while the pre-cleaning process is being performed in the pre-cleaning region.

25. The substrate processing unit of claim 24, wherein the blocking unit comprises:
- a casing provided to surround the substrate and providing the independent pre-cleaning processing space; and
- an opening/closing member for opening/closing an inlet of the casing.

* * * * *